(12) United States Patent
Ono

(10) Patent No.: US 7,605,421 B2
(45) Date of Patent: Oct. 20, 2009

(54) NON-VOLATILE SEMICONDUCTOR MEMORY ELEMENT AND METHOD OF MANUFACTURING THE SAME, AND SEMICONDUCTOR INTEGRATED CIRCUIT DEVICE INCLUDING THE NON-VOLATILE SEMICONDUCTOR MEMORY ELEMENT

(75) Inventor: Mizuki Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 496 days.

(21) Appl. No.: 11/470,953

(22) Filed: Sep. 7, 2006

(65) Prior Publication Data

US 2007/0114594 A1 May 24, 2007

(30) Foreign Application Priority Data

Nov. 22, 2005 (JP) ............................. 2005-337228

(51) Int. Cl.
*H01L 29/76* (2006.01)
(52) U.S. Cl. .............................. 257/315; 257/E29.302; 365/185.03
(58) Field of Classification Search ................. 257/315, 257/327, 347, E29.129, E29.302; 365/185.03
See application file for complete search history.

(56) References Cited

U.S. PATENT DOCUMENTS

| 6,958,512 B1 * | 10/2005 | Wu et al. ..................... 257/315 |
| 2003/0178670 A1 * | 9/2003 | Fried et al. ................... 257/315 |
| 2004/0235300 A1 * | 11/2004 | Mathew et al. .............. 438/689 |
| 2005/0226047 A1 * | 10/2005 | Hieda et al. ............. 365/185.14 |
| 2006/0022253 A1 * | 2/2006 | Anderson et al. ........... 257/315 |
| 2006/0091450 A1 * | 5/2006 | Zhu et al. .................... 257/316 |

FOREIGN PATENT DOCUMENTS

| JP | 10-125810 | 5/1998 |
| JP | 3046376 | 3/2000 |
| JP | 2003-209247 | 7/2003 |

OTHER PUBLICATIONS

Masayuki Ichige, et al., "A Novel self-aligned shallow trench isolation cell for 90nm 4Gbit NAND Flash EEPROM s", 2003 Symposium on VLSI Technology Digest of Technical Papers, 2003, pp. 89-90.
Osama Khouri, et al., "Program and Verify Word-Line Voltage Regulator for Multilevel Flash Memories", Analog Integrated Circuits and Signal Processing, vol. 34, 2003, pp. 119-131.

* cited by examiner

*Primary Examiner*—Thomas L Dickey
(74) *Attorney, Agent, or Firm*—Oblon, Spivak, McClelland, Maier & Neustadt, L.L.P.

(57) ABSTRACT

A non-volatile semiconductor memory element includes: a semiconductor region of a first conductivity type formed in a plate-like form on a semiconductor substrate; a first insulating film formed on a first side face of the semiconductor region; a first charge accumulating layer formed on a face of the first insulating film opposite from the semiconductor region; a second insulating film formed on a second side face of the semiconductor region, and has a different equivalent oxide thickness from the first insulating film; a second charge accumulating layer formed on a face of the second insulating film opposite from the semiconductor region; a third insulating film provided so as to cover the first and second charge accumulating layers; a control gate electrode provided so as to cover the third insulating film; a channel region formed in a portion of the semiconductor region covered with the control gate electrode; and source/drain regions of a second conductivity type formed in portions of the semiconductor region on both sides of the channel region.

18 Claims, 26 Drawing Sheets

A-A' SECTION

A-A' SECTION

B-B' SECTION

NON-VOLATILE SEMICONDUCTOR MEMORY ELEMENT AND METHOD OF MANUFACTURING THE SAME, AND SEMICONDUCTOR INTEGRATED CIRCUIT DEVICE INCLUDING THE NON-VOLATILE SEMICONDUCTOR MEMORY ELEMENT

CROSS-REFERENCE TO RELATED APPLICATION

This application is based upon and claims the benefit of priority from prior Japanese Patent Application No. 2005-337228 filed on Nov. 22, 2005 in Japan, the entire contents of which are incorporated herein by reference.

BACKGROUND OF THE INVENTION

1. Field of the Invention

The present invention relates to non-volatile semiconductor memory elements, methods of manufacturing the non-volatile semiconductor elements, and semiconductor integrated circuit devices that include the non-volatile semiconductor memory elements.

2. Related Art

In a conventional non-volatile semiconductor memory device, the potentials of the control gate electrode and the source/drain regions are controlled, so that charge injection or charge emission is caused in the charge accumulating layer provided between the channel and the control gate electrode. By doing so, the amount of charges stored in the charge accumulating layer is adjusted so as to change the threshold voltage (the control gate voltage with which the region between the source and the drain of the element is switched between an ON state (a conduction state) and an OFF state (a non-conduction state)). In this manner, information is recorded in each memory element. In such a conventional non-volatile semiconductor memory device, one-bit information is recorded in each memory element by switching the threshold voltage between two values. Therefore, to increase the degree of integration, information of more than one bit needs to be recorded in each memory element. There has been known a type of non-volatile semiconductor memory device that includes memory elements each having charge accumulating layers on both sides of the channel and control gate electrodes over and below the channel, so as to store multi-value information of more than one bit. Each of such memory elements is equivalent to a structure having two conventional memory elements connected in parallel (see Japanese Patent Publication No. 3046376 and JP-A 10-125810 (KOKAI), for example).

When memory device that is equivalent to structure having two conventional memory elements connected in parallel is employed, the potentials of the two control gate electrodes of each memory element are controlled independently of each other, so that the amounts of charges in the two charge accumulating layers can be controlled independently of each other. Accordingly, information of more than one bit can be stored in each memory element. Further, there has been a method of achieving two or more different threshold voltages by fine-adjusting the amounts of charges stored in the charge accumulating layers.

In the non-volatiles semiconductor memory device that includes memory elements equivalent to structures each having two memory elements connected in parallel to each other so as to increase the degree of integration, however, two control gate electrodes are provided for each one memory element, which causes the problem that the wirings become more complicated than in a general non-volatile semiconductor memory device having one control gate electrode for each one memory element.

Also, by the method of achieving two or more different threshold voltages by fine-adjusting the amount of charges in each of the charge accumulating layers, the variation in the threshold voltage (hereinafter represented by "$\Delta V_{TH}$") needs to be sufficiently small. The reason for this is as follows. In a case where 2-bit information is to be stored in each memory element, for example, it is necessary to adjust the threshold voltage to four different values. Even if the lowest threshold voltage has a negative value and the highest threshold voltage is higher than the power supply voltage (hereinafter represented by "$V_{DD}$"), the other two threshold voltages need to fall between zero and $V_{DD}$. Accordingly, it is necessary to satisfy the relation, $V_{DD} > 2 \times \Delta V_{TH}$. More specifically, where a verify function is not to be provided, $\Delta V_{TH}$ is 2.3 V (as suggested by Masayuki Ichige et al., in "A novel self-aligned shallow trench isolation cell for 90 nm 4 Gbit NAND Flash EEPROMs" in Technical Digest of 2003 Symposium on VLSI Technology, pp. 89-90), and if a verify function is to be provided, $\Delta V_{TH}$ is 0.5 V (as suggested by Osama Khouri et al., in "Program and Verify Word-Line Voltage Regulator for Multilevel Flash Memories," in Analog Integrated Circuits and Signal Processing, vol. 34 (2003), pp. 119-131). Accordingly, even where a verify function is to be provided, $V_{DD}$ cannot be made lower than 0.5 V×2=1 V. This greatly hinders a decrease in the power supply voltage that is required for reducing power consumption.

SUMMARY OF THE INVENTION

The present invention has been made for solving the above problems, and an object thereof is to provide a high-performance non-volatile semiconductor memory element that can lower the power supply voltage and do not complicate the wirings, and a method of manufacturing such a non-volatile semiconductor memory element, and a semiconductor integrated circuit device that includes such a non-volatile semiconductor memory element.

A non-volatile semiconductor memory element according to a first aspect of the present invention includes: a semiconductor region of a first conductivity type that is formed in a plate-like form on a semiconductor substrate; a first insulating film that is formed on a first side face of the semiconductor region; a first charge accumulating layer that is formed on a face of the first insulating film opposite from the semiconductor region; a second insulating film that is formed on a second side face of the semiconductor region, and has a different equivalent oxide thickness from the first insulating film, the second side face being the opposite side from the first side face; a second charge accumulating layer that is formed on a face of the second insulating film opposite from the semiconductor region; a third insulating film that is provided so as to cover the first and second charge accumulating layers; a control gate electrode that is provided so as to cover the third insulating film; a channel region that is formed in a portion of the semiconductor region covered with the control gate electrode; and source/drain regions of a second conductivity type that are formed in portions of the semiconductor region on both sides of the channel region, the semiconductor region having a thickness smaller than twice the maximum thickness of a depletion layer determined by impurity concentration in the semiconductor region.

A non-volatile semiconductor memory element according to a second aspect of the present invention includes: a semiconductor region of a first conductivity type that is formed in a plate-like form on a semiconductor substrate; a first ferroelectric insulating film that is provided on a first side face of the semiconductor region; a second ferroelectric insulating film that is provided on a second side face of the semiconductor region, and has a different film thickness or is made of a different material from the first ferroelectric insulating film, the second side face being the opposite side from the first side face; an insulating film that covers a top face of the semiconductor region; a gate electrode that is provided so as to cover the first and second ferroelectric insulating films and the insulating film; a channel region that is formed in a portion of the semiconductor region covered with the gate electrode; and source/drain regions of a second conductivity type that are formed in portions of the semiconductor region on both sides of the channel region, the semiconductor region having a thickness smaller than twice the maximum thickness of a depletion layer determined by impurity concentration in the semiconductor region.

A method of manufacturing a non-volatile semiconductor memory element according to a third aspect of the present invention includes: introducing impurities of a first conductivity type into at least a portion of a semiconductor substrate; forming and patterning a first insulating film on the semiconductor substrate; forming a second insulating film on a side of the patterned first insulating film; removing at least a portion of the semiconductor substrate, the portion being not covered with the first and second insulating films; oxidizing at least a portion of a surface of the semiconductor substrate, the portion being exposed; exposing a portion of the surface of the semiconductor substrate by removing the first insulating film after the oxidation, the portion being locating below the first insulating film; removing at least a portion of the exposed semiconductor substrate; oxidizing a portion of the surface of the semiconductor substrate, the portion being exposed through the removal of at least a portion of the semiconductor substrate; forming a first film made of a first semiconductor or metal on an entire surface of the semiconductor substrate; forming a charge accumulating layer by patterning the first film; forming a third insulating film on the entire surface of the semiconductor substrate; forming a second film made of a second semiconductor or metal on the third insulating film; patterning the second film, the third insulating film, and the charge accumulating layer; and forming source/drain regions by introducing impurities of a second conductivity type into at least a portion of the semiconductor substrate, the second conductivity type being the opposite to the first conductivity type.

A semiconductor integrated circuit device according to a fourth aspect of the present invention includes a plurality of non-volatile semiconductor memory elements as mentioned above, wherein: the non-volatile semiconductor memory elements are arranged in a lattice-point form; the semiconductor regions of the non-volatile semiconductor memory elements contained in the same row are connected to one another; and the control gate electrodes of the non-volatile semiconductor memory elements contained in the same column are connected to one another.

A semiconductor integrated circuit device according to a fifth aspect of the present invention includes: the non-volatile semiconductor memory element as mentioned above; and elements that control current conduction and non-conduction.

A semiconductor integrated circuit device according to a sixth aspect of the present invention includes a logic circuit that contains the non-volatile semiconductor memory element as mentioned above.

DETAILED DESCRIPTION OF THE INVENTION

The following is a detailed description of embodiments of the present invention, with reference to the accompanying drawings. It should be noted that the present invention is not limited to the following embodiments, but various modifications can be made to them.

First Embodiment

Figure 1:
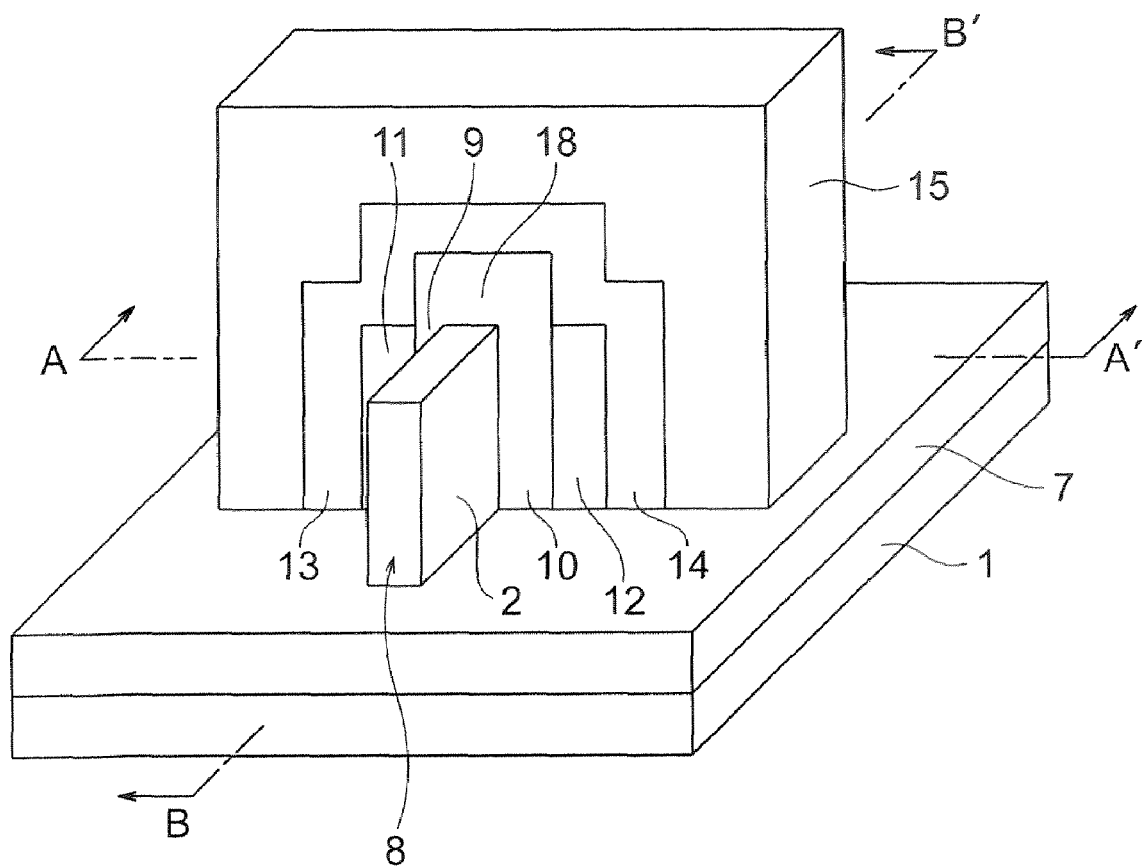
FIG. 1 is a perspective view of a non-volatile semiconductor memory element according to a first embodiment of the present invention.
Figure 2:
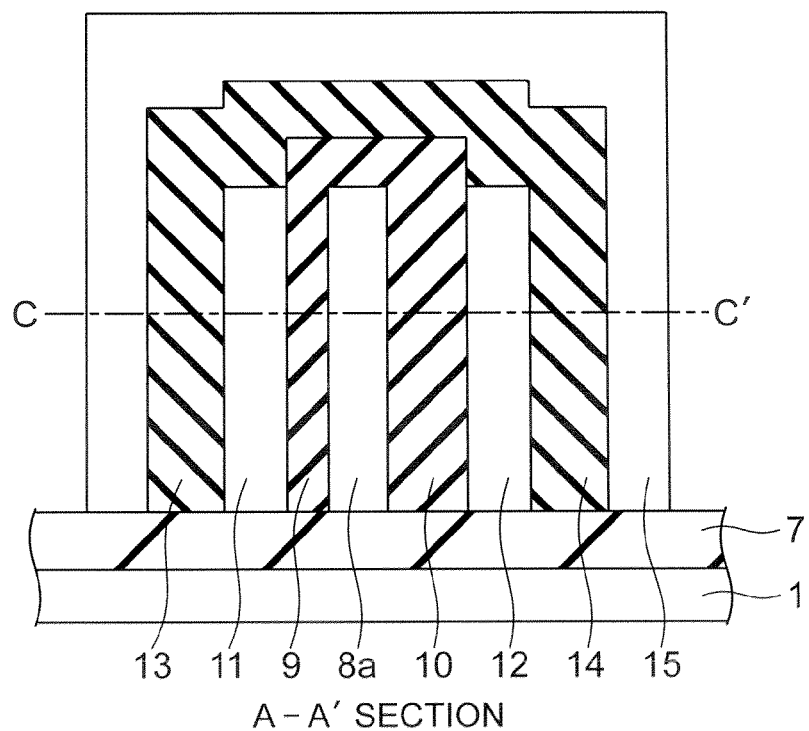
FIG. 2 is a cross-sectional view of the non-volatile semiconductor memory element, taken along the line A-A' of FIG. 1.
Figure 3:
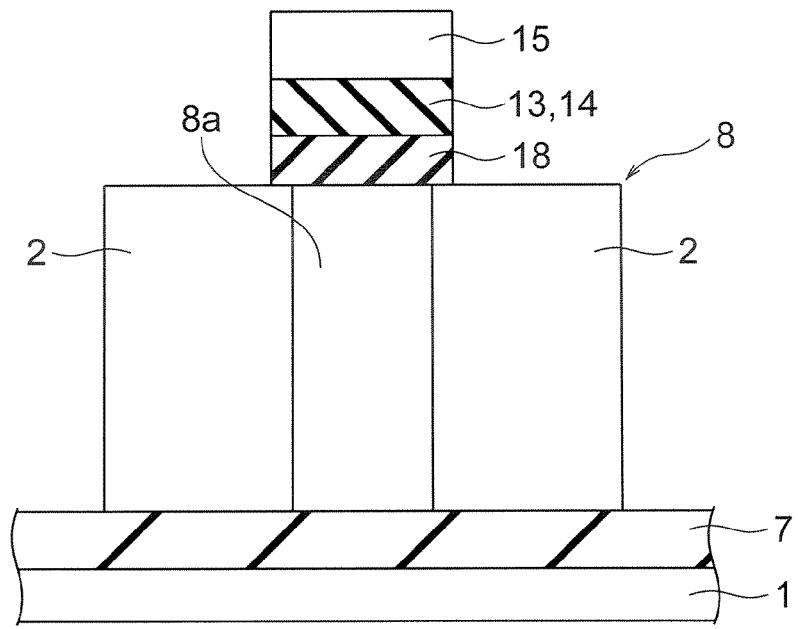
FIG. 3 is a cross-sectional view of the non-volatile semiconductor memory element, taken along the line B-B' of FIG. 1.

FIG. 1 is a perspective view of a non-volatile semiconductor memory element according to a first embodiment of the present invention. FIG. 2 is a cross-sectional view of the non-volatile semiconductor memory element, taken along the line A-A' of FIG. 1. FIG. 3 is a cross-sectional view of the non-volatile semiconductor memory element, taken along the line B-B' of FIG. 1. The non-volatile semiconductor memory element of this embodiment is formed on a SOI (Silicon On Insulator) substrate. A plate-like semiconductor region 8 having a channel region 8a is provided on an embedded insulating film 7 formed on a supporting substrate 1. A first tunnel gate insulating film 9 is provided on one of the side faces of the semiconductor region 8, so as to cover the channel region 8a. A second tunnel gate insulating film 10 is provided on the other one of the side faces of the semiconductor region 8. The upper face of the channel region 8a is covered with a sidewall 18 made of silicon oxide. A first charge accumulating layer 11 is provided on the one of the side faces of the semiconductor region 8, so as to interpose the first tunnel gate insulating film 9 between the semiconductor region 8 and the first charge accumulating layer 11. A second charge accumulating layer 12 is provided on the other one of the side faces of the semiconductor region 8, so as to interpose the second tunnel gate insulating film 10 between the semiconductor region 8 and the second charge accumulating layer 12. The plate-like semiconductor region 8 forming the channel region 8a is designed to have a thickness that is smaller than twice the maximum thickness of a depletion layer determined by the impurity concentration in the semiconductor region 8. The first tunnel gate insulating film 9 and the second tunnel gate insulating film 10 differ from each other in equivalent oxide thickness (the value obtained by dividing the product of the geometric thickness of the film and the relative permittivity of silicon oxide (3.9) by the relative permittivity of the film).

A first inter-electrode insulating film 13 is provided on the one of the side faces of the semiconductor region 8, so as to interpose the first tunnel gate insulating film 9 and the first charge accumulating layer 11 between the semiconductor region 8 and the first interelectrode insulating film 13. A second interelectrode insulating film 14 is provided on the other one of the side faces of the semiconductor region 8, so as to interpose the second tunnel gate insulating film 10 and the second charge accumulating layer 12 between the semiconductor region 8 and the second interelectrode insulating film 14. The first and second interelectrode insulating films 13 and 14 cover the upper faces of the first and second charge accumulating layers 11 and 12 and the upper face of the sidewall 18. A control gate electrode 15 is provided so as to cover the first and second interelectrode insulating films 13 and 14. Accordingly, the control gate electrode 15 is designed to cover the channel region 8a via the first and second tunnel gate insulating films 9 and 10, the first and second charge accumulating layers 11 and 12, and the first and second interelectrode insulating films 13 and 14. Source/drain regions 2 are formed in the portions of the semiconductor region 8 located on both sides of the control gate electrode 15.

The principal direction of the current flowing through the plate-like channel region 8a is the direction of B-B' shown in FIG. 1. Since the equivalent oxide thicknesses of the tunnel gate insulating film 9 and the tunnel gate insulating film 10 formed on the side faces of the plate-like channel region 8a are different from each other, the write voltage conditions and the erase voltage conditions vary between the two charge accumulating layers 11 and 12.

The operation of the non-volatile semiconductor device of this embodiment is described below, on the assumption that the device is of an n-type. In a case of a p-type device, the same operation can be performed, except that the polarities of voltage or the like are reversed.

The two interelectrode insulating films 13 and 14 have the same thicknesses, and the tunnel gate insulating film 9 is designed to have a smaller equivalent oxide thickness than the tunnel gate insulating film 10. In a case where the potential of the source/drain regions 2 is zero in this situation, the control gate voltages at which charge injection is caused in the first and second charge accumulating layers 11 and 12 are represented by $V_{W1}$ and $V_{W2}$, respectively, and the control gate voltages at which charge emission is caused are represented by $V_{E1}$ and $V_{E2}$, respectively. The control gate voltages $V_{W1}$ and $V_{W2}$ are positive, while $V_{E1}$ and $V_{E2}$ are negative. Since the tunnel gate insulating film 9 is designed to have a smaller equivalent oxide thickness than that of the tunnel gate insulating film 10, the relations $V_{W1} < V_{W2}$ and $V_{E1} > V_{E2}$ are established. Accordingly, when the potential $V_{CG}$ of the control gate electrode 15 is made higher than $V_{W1}$, charge injection occurs in the first charge accumulating layer 11. When the potential $V_{CG}$ of the control gate electrode 15 is made higher than $V_{W2}$, charge injection occurs in both the first and second charge accumulating layers 11 and 12. On the other hand, when the potential $V_{CG}$ of the control gate electrode 15 is made lower than $V_{E1}$, charges are emitted from the first charge accumulating layer 11. When the potential $V_{CG}$ of the control gate electrode 15 is made lower than $V_{E2}$, charges are emitted from both the first and second charge accumulating layers 11 and 12. The threshold voltage in a case where charges are not stored in either of the charge accumulating layers 11 and 12 is represented by $V_{TH0}$, the threshold voltage in a case where a certain amount of charges are stored only in the first charge accumulating layer 11 is represented by $V_{TH1}$, the threshold voltage in a case where a certain amount of charges are stored only in the second charge accumulating layer 12 is represented by $V_{TH2}$, and the threshold voltage in a case where a certain amount of charges are stored in both of the charge accumulating layers 11 and 12 is represented by $V_{TH12}$.

Figure 4:
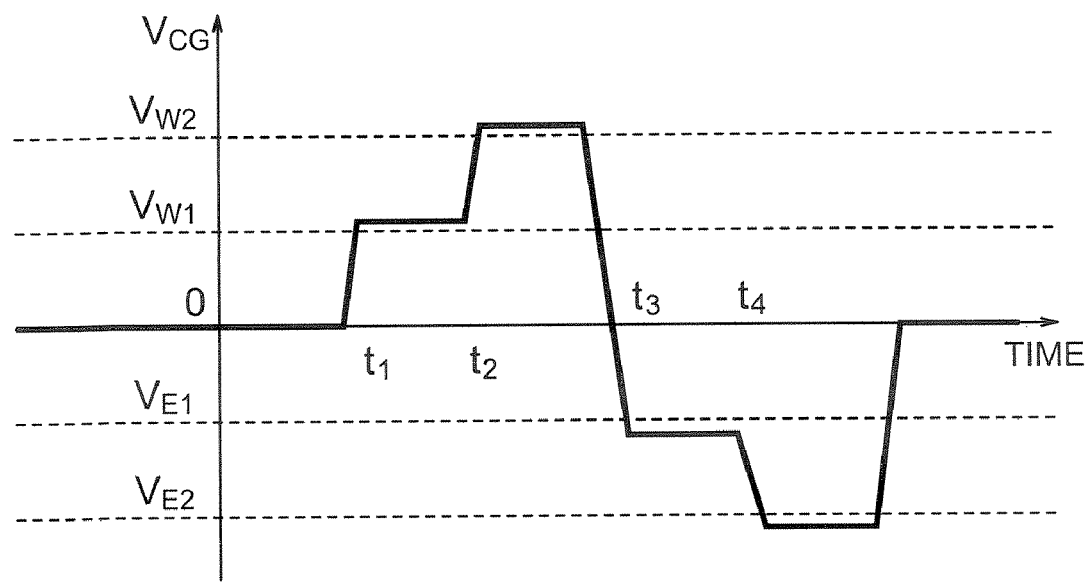
FIG. 4 is a diagram for explaining an operation of the non-volatile semiconductor memory element according to the first embodiment.
Figure 5:
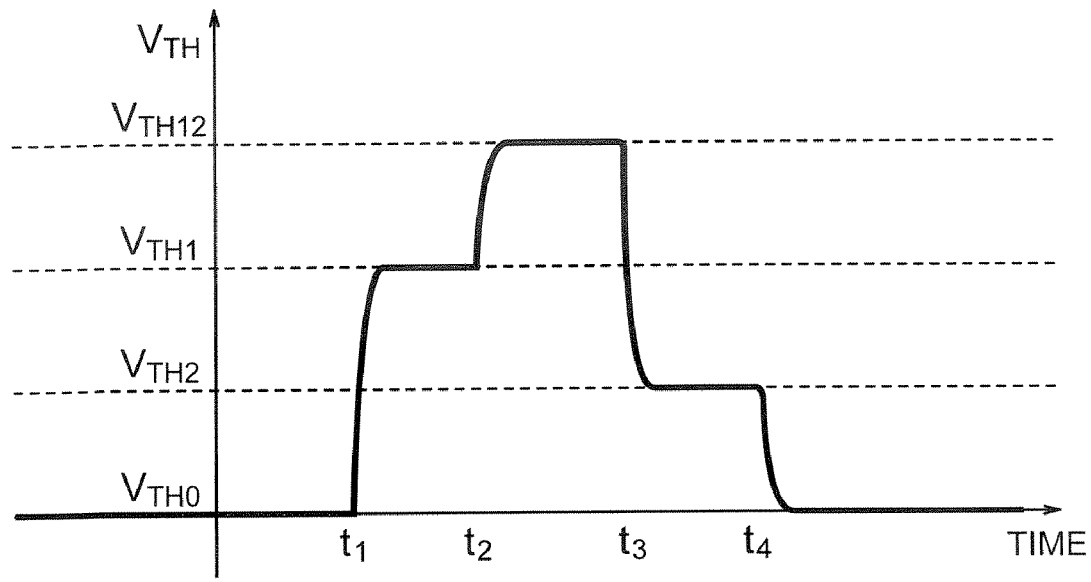
FIG. 5 is a diagram for explaining an operation of the non-volatile semiconductor memory element according to the first embodiment.

FIG. 4 schematically shows $V_{CG}$ in relation to time in the case where charges are not initially stored in either of the charge accumulating layers 11 and 12. In this case, the threshold voltage varies as schematically shown in FIG. 5. Since charges do not exist in either of the charge accumulating layers 11 and 12 until time $t_1$, the threshold voltage is $V_{TH0}$. When the voltage $V_{CG}$ becomes a voltage between $V_{W1}$ and $V_{W2}$ at time $t_1$, charge injection occurs in the first charge accumulating layer 11, but charge injection does not occur in the second charge accumulating layer 12. Accordingly, the threshold voltage becomes $V_{TH1}$. When the voltage $V_{CG}$ becomes higher than $V_{W2}$ at time $t_2$, charge injection occurs in both of the charge accumulating layers 11 and 12, and the threshold voltage becomes $V_{TH12}$. When the voltage $V_{CG}$ becomes a voltage between $V_{E1}$ and $V_{E2}$ at time $t_3$, charge emission occurs in the first charge accumulating layer 11, but not in the second charge accumulating layer 12. Accordingly, the threshold voltage becomes $V_{TH2}$. When the voltage $V_{CG}$ becomes lower than $V_{E2}$ at time $t_4$, charge emission occurs also in the second charge accumulating layer 12, and the threshold voltage becomes $V_{TH0}$. In this manner, changes are made to charges stored in both of the charge accumulating layers simply by changing the voltage of the control gate electrode 15, so that the threshold voltage of the device can be controlled. Although the relation, $V_{TH1} > V_{TH2}$, is set in this description, the relation can be reversed. Also, the relation between the thicknesses of the tunnel gate insulating films 9 and 10 may be reversed. Furthermore, the interelectrode insulating films 13 and 14 may have different thicknesses. What really matters is that the voltages $V_{E1}$ and $V_{E2}$ differ from each other, the voltages $V_{W1}$ and $V_{W2}$ differ from each other, and the threshold voltages $V_{TH0}$, $V_{TH1}$, $V_{TH2}$, and $V_{TH12}$ differ from one another. If only either one of the condition that $V_{E1}$ and $V_{E2}$ differ from each other and the condition that $V_{W1}$ and $V_{W2}$ differ from each other is satisfied, both the state in which charges are stored only in the first charge accumulating layer 11 and the state in which charges are stored only in the second charge accumulating layer 12 cannot be satisfied. However, the state in which charges are not stored in either of the charge accumulating layers 11 and 12, the state in which charges are stored in only one of the charge accumulating layers, and the state in which charges are stored in both of the charge accumulating layers can be realized. In this case, three different threshold voltages are obtained. Accordingly, information that is less than 2 bits but exceeds 1 bit can be stored in each one element.

In the case where the voltages $V_{E1}$ and $V_{E2}$ differ from each other, the voltages $V_{W1}$ and $V_{W2}$ differ from each other, and the threshold voltages $V_{TH1}$ and $V_{TH2}$ differ from each other, 2-bit information can be stored in each one element. Thus, higher information storage density can be advantageously achieved.

Information reading is performed by sensing a current flowing through the channel of the element while a certain potential is being applied to the control gate electrode 15 and the source/drain regions 2. If the threshold voltages differ from each other, the value of current flowing varies. Accordingly, the stored information can be read out by sensing the current.

As described above, the voltage conditions for causing charge injection and charge emission in the charge accumulating layers 11 and 12 that are designed to sandwich the channel region 8a are different from each other according to this embodiment. Accordingly, charges can be injected to only either one of the charge accumulating layers or can be emitted from only either one of the charge accumulating layers simply by adjusting the potential of the single control gate electrode. As a result, information of more than 1 bit can be stored in each one memory element with the same wirings as those in any conventional non-volatile semiconductor memory element.

Furthermore, in the non-volatile semiconductor memory element of this embodiment, the controllability over the threshold voltage is higher than in any conventional non-volatile semiconductor memory element. More particularly, charge injection to a charge accumulating layer and charge emission from a charge accumulating layer are performed with the use of a tunnel current flowing through the tunnel gate insulating films 9 and 10 located between the plate-like semiconductor region 8 forming the channel region and the charge accumulating layers 11 and 12. Accordingly, a discontinuous change is not caused, as in a case where a current flows when certain voltage conditions are set for the control gate electrode and the source/drain regions or where a current does not flow when other certain voltage conditions are set. In the cases where charges are injected to a charge accumulating layer or are emitted from a charge accumulating layer, the voltage conditions under which the current becomes equal to a predetermined value, and the voltage conditions under which the electric field in the tunnel gate insulating film becomes equal to a predetermined value, are referred to as the "write voltage conditions" and the "erase voltage conditions", respectively. In this specification, these terms specified as above are used.

Figure 7:
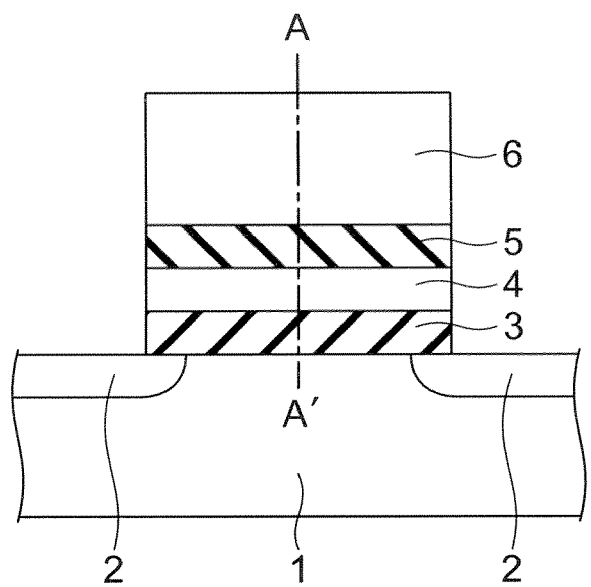
FIG. 7 is a cross-sectional view of a memory element as a comparative example of the first embodiment.
Figure 8:
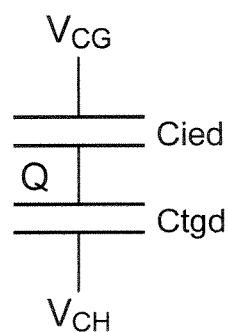
FIG. 8 is an equivalent circuit diagram of the memory element as the comparative example.

As a comparative example, a conventional non-volatile semiconductor memory element having one charge accumulating layer and one control gate electrode is now described. FIG. 7 is a schematic cross-sectional view of the conventional non-volatile semiconductor memory element, taken in the direction parallel to the current flowing through the channel. As shown in FIG. 7, source/drain regions 2 are formed on a semiconductor substrate 1, a charge accumulating layer 4 is formed between the source/drain regions 2 via a tunnel gate insulating film 3. A control gate electrode 6 is then formed over the charge accumulating layer 4 via an interelectrode insulating film 5. When the stacked structure formed with the semiconductor substrate 1 serving as the channel region, the tunnel gate insulating film 3, the charge accumulating layer 4, the interelectrode insulating film 5, and the control gate electrode 6 is one-dimensionally seen in the section taken along the line A-A' shown in FIG. 7 for ease of explanation, the equivalent circuit of this comparative example is equivalent to the series connection between the capacitance $C_{ied}$ of the interelectrode insulating film and the capacitance $C_{tgd}$ of the tunnel gate insulating film, as shown in FIG. 8. Here, the potential of the control gate electrode 6 is represented by $V_{CG}$, the potential of the channel region is represented by $V_{CH}$, and the charges stored in the charge accumulating layer 4 are represented by Q. For ease of explanation, the tunnel current flowing through the tunnel gate insulating film 3 is considered to flow only when the electric field in the tunnel gate insulating film 3 exceeds a predetermined value. In other words, the voltage condition under which the electric field in the tunnel gate insulating film 3 becomes equal to the predetermined value is the above described write and erase voltage conditions. In the case of writing, when $V_{CG}$ is set higher than the write voltage condition by $\Delta V$, charges are injected to the charge accumulating layer 4. Here, the sign of the injected charges is negative. Accordingly, the electric field in the tunnel gate insulating film 3 becomes weaker as more and more charges are injected. When the charge injection comes to an end, the charges Q stored in the charge accumulating layer 4 is expressed as: $Q=-C_{ied} \times \Delta V$. Accordingly, using the threshold voltage $V_{TH0}$ obtained in the case where charges do not exist in the charge accumulating layer 4, the threshold voltage $V_{TH}$ of the element can be expressed as: $V_{TH}=V_{TH0}-Q/C_{ied}=V_{TH0}+\Delta V$. Accordingly, the relation, $\partial V_{TH}/\partial V_{CG}=1$, is established. As the same applies to erasing, the relation, $\partial V_{TH}/\partial V_{CG}=1$, is also established. To control the threshold voltage with certain precision, it is necessary to control the potential of the control gate electrode with the same precision as the certain precision at the time of writing and erasing.

On the other hand, a section of the non-volatile semiconductor memory element of this embodiment taken in the direction perpendicular to the current flowing through the channel region 8a is as shown in FIG. 2.

Figure 6:
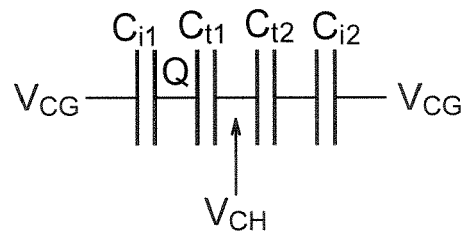
FIG. 6 is an equivalent circuit diagram of the memory element of the first embodiment.

When the stacked structure formed with the semiconductor region 8 containing the channel region 8a, the first and second tunnel gate insulating films 9 and 10, the first and second charge accumulating layers 11 and 12, the first and second interelectrode insulating films 13 and 14, and the control gate electrode 15 is one-dimensionally seen in the section taken along the line C-C' shown in FIG. 2 for ease of explanation, the equivalent circuit of this embodiment is equivalent to the series connection between the capacitances $C_{i1}$ and $C_{i2}$ of the first and second interelectrode insulating films 13 and 14 and the capacitances $C_{t1}$ and $C_{t2}$ of the first and second tunnel gate insulating films 9 and 10, as shown in FIG. 6. In the equivalent circuit shown in FIG. 6, the potential of the control gate electrode 15 existing on both sides is represented by $V_{CG}$, the potential of the channel region 8a is represented by $V_{CH}$, and the charges stored in the first charge accumulating layer 11 are represented by Q. In the case of writing, the first and second tunnel gate insulating films 9 and 10 are designed to have different thicknesses, so that $V_{CG}$ at which writing or erasing is caused in the first charge accumulating layer 11 differs from $V_{CG}$ at which writing or erasing is caused in the second charge accumulating layer 12. Here, writing in the first charge accumulating layer 11 is caused at the lower $V_{CG}$. When $V_{CG}$ is set higher than the write voltage condition for the first charge accumulating layer 11 by $\Delta V$, charges are injected to the first charge accumulating layer 11. Here, the sign of the injected charges is negative. Accordingly, as more and more charges are injected, the electric field in the tunnel gate insulating film becomes weaker and by and by the charge injection comes to a stop. In this condition, charges Q stored in the first charge accumulating layer 11 is expressed as: $Q=-C_{i1} \times \Delta V$.

In the non-volatile semiconductor memory element of this embodiment, the thickness of the plate-like semiconductor region 8 forming the channel region 8a is smaller than twice the maximum thickness of the depletion layer determined by the impurity concentration in the region. Therefore, the channel formed in the plate-like semiconductor region 8 is affected by the quantity of charges stored in each of the charge accumulating layers 11 and 12. It should be noted that, in this specification, "the maximum thickness of the depletion layer determined by the impurity concentration in the region" refers to the thickness of the depletion layer that is formed in a case where a voltage equal to the value obtained by dividing the forbidden gap width (1.1 eV in the case of silicon) of a semiconductor forming the substrate by the elementary charge is applied to the surface of the substrate in relation to a sufficient depth of the semiconductor substrate that contains the same impurity concentration as above and has a sufficient thickness. As for the voltage polarity, if the majority carriers in the substrate are electrons, the polarity of the voltage on the substrate surface in relation to a sufficient depth of the substrate is negative. If the majority carriers in the substrate are holes, the polarity of the voltage is positive.

Using the threshold voltage $V_{TH0}$ obtained in the case where charges do not exist in the charge accumulating layers, the threshold voltage $V_{TH}$ of the element in this situation can be expressed as:

$$V_{TH}=V_{TH0}+\Delta V \times (1/(2 \times C_{ch})+1/C_{i2}+1/C_{i2})/(1/C_{ch}+1/C_{i2}+1/C_{t1}+1/C_{i1}+1/C_{i2})$$

Here, $C_{ch}$ is the value obtained by dividing the permittivity of the semiconductor region 8 forming the channel region 8a by the thickness of the semiconductor region 8. This is a fact newly found by the inventor. Accordingly, the relation, $\partial V_{TH}/\partial V_{CG}<1$, is established. As the same applies to erasing, the relation, $\partial V_{TH}/\partial V_{CG}<1$, is also established.

If charge injection and charge emission can be caused only in the second charge accumulating layer 12, the following relation is established at the time of writing or erasing:

$$\partial V_{TH}/\partial V_{CG} = (1/(2 \times C_{ch}) + 1/C_{t1} + 1/C_{i1})/(1/C_{ch} + 1/C_{t2} + 1/C_{t1} + 1/C_{i1} + 1/C_{i2})$$

Therefore, the relation, $\partial V_{TH}/\partial V_{CG} < 1$, is also established in this case. This is also a fact newly found by the inventor. Accordingly, to control the threshold voltage with certain precision, the precision required for controlling the potential of the control gate electrode at the time of writing or erasing may be lower than the precision required for controlling the threshold voltage. In view of this, the controllability over the threshold voltage in the non-volatile semiconductor memory element of this embodiment is higher than in a non-volatile semiconductor memory element of a conventional structure. This is also a fact newly found by the inventor.

For the above described reasons, information of more than one bit can be stored in each non-volatile semiconductor memory element of this embodiment with the same wirings as those in a conventional non-volatile semiconductor memory element. Also, the threshold voltage controllability for the information storage is high.

As described above, a high-performance non-volatile semiconductor memory element that can lower the power supply voltage and does not complicate the wirings can be obtained according to this embodiment.

Referring now to FIGS. 9 to 14, a method of manufacturing the non-volatile semiconductor memory element of this embodiment is described. Here, the method of manufacturing two elements at the same time is described. FIGS. 9 to 13 are cross-sectional views of the element, taken along the line A-A' of FIG. 1.

Figure 9:
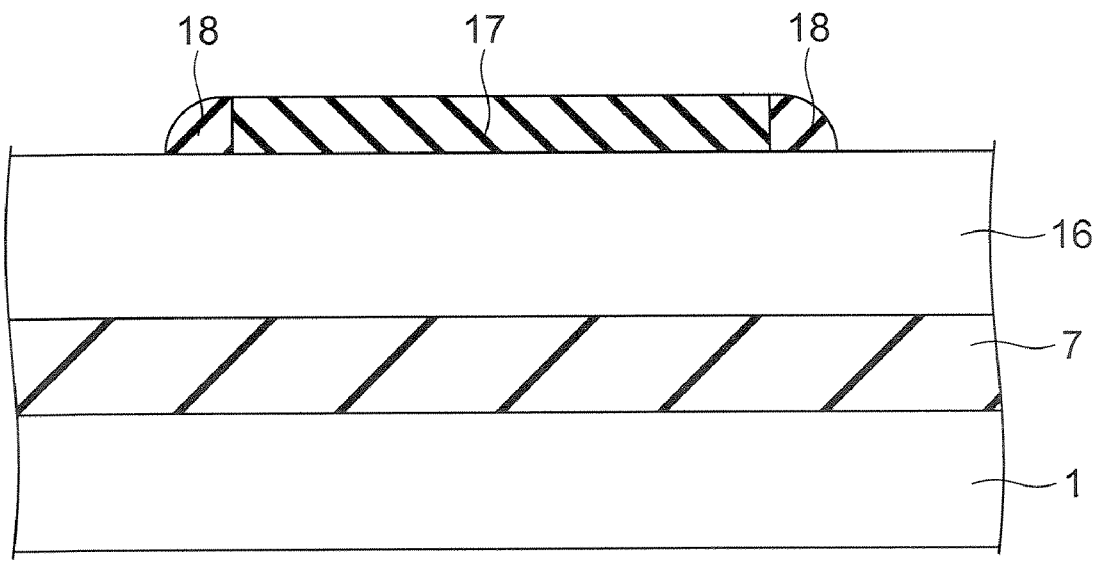
FIG. 9 is a cross-sectional view for showing a step for manufacturing the memory element according to the first embodiment.

As shown in FIG. 9, a SOI substrate in which the embedded insulating film 7 is formed on the supporting substrate 1 and a semiconductor layer 16 is formed on the embedded insulating film 7 is first prepared. After B ions are implanted to the semiconductor layer 16 of the SOI substrate with a dose amount of $1 \times 10^{12}$ cm$^{-2}$ at an accelerating voltage of 30 keV, for example, a 30-second heat treatment is carried out at 1050° C. Silicon nitride is deposited with a thickness of 30 nm on the semiconductor layer 16 by the chemical vapor deposition method (hereinafter referred to as the CVD method), for example. The deposited silicon nitride is then patterned to form a silicon nitride film 17. A 30-nm thick silicon oxide film is deposited on the entire surface of the semiconductor substrate, including the silicon nitride film 17, by the CVD method or the like. Reactive ion etching (hereinafter referred to as RIE) is then performed to form the sidewall 18 made of silicon oxide (see FIG. 9).

Figure 10:
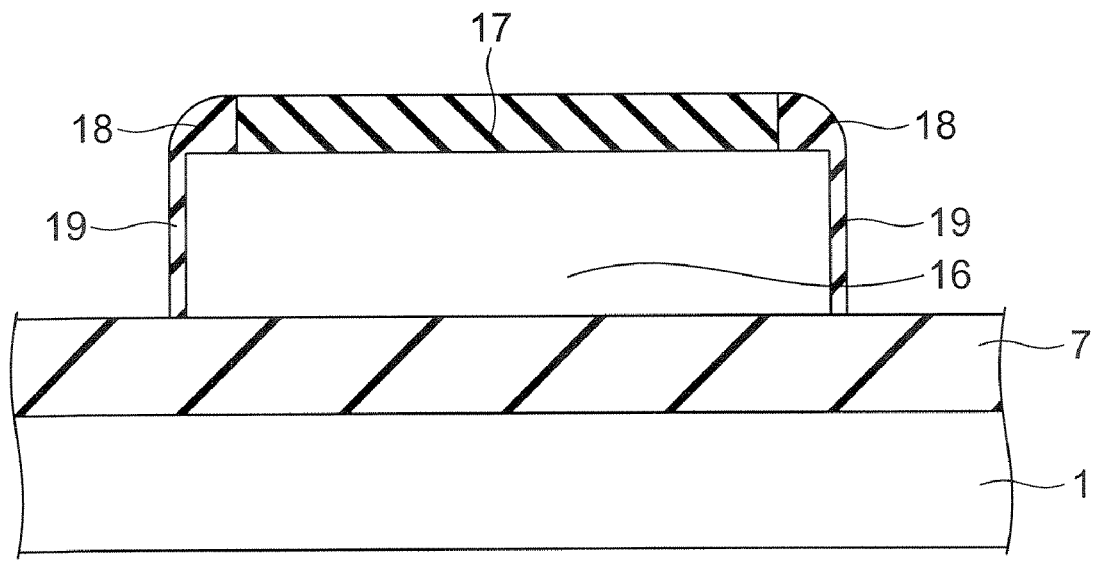
FIG. 10 is a cross-sectional view showing a step for manufacturing the memory element according to the first embodiment.

The semiconductor layer 16 is patterned by RIE or the like, as shown in FIG. 10. The semiconductor layer 16 is then oxidized through thermal oxidation or the like, so that a silicon oxide film 19 is formed on either side face of the semiconductor layer 16.

Figure 11:
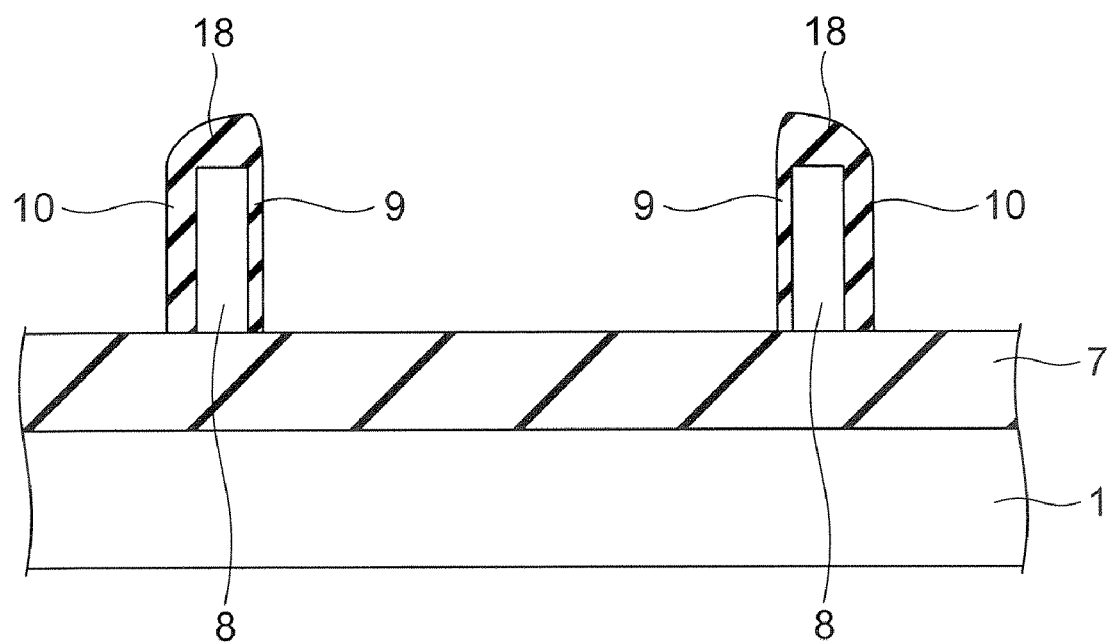
FIG. 11 is a cross-sectional view showing a step for manufacturing the memory element according to the first embodiment.

As shown in FIG. 11, the silicon nitride film 17 is removed through a thermal phosphoric acid treatment or the like. The semiconductor layer 16 is then patterned by RIE or the like, so as to form the plate-like semiconductor region 8 to serve as the channel region. The plate-like semiconductor region 8 is then oxidized through thermal oxidization or the like. In this process, the side faces of the plate-like semiconductor region 8, on which the silicon oxide film 19 is formed in the procedure shown in FIG. 10, are further oxidized, so that a silicon oxide film 10 thicker than the silicon oxide film 9 on the opposite side of each side face is formed. In this manner, silicon oxide films having different thicknesses are formed on either side face of the plate-like semiconductor region 8, and become the first and second tunnel gate insulating films 9 and 10.

Figure 12:
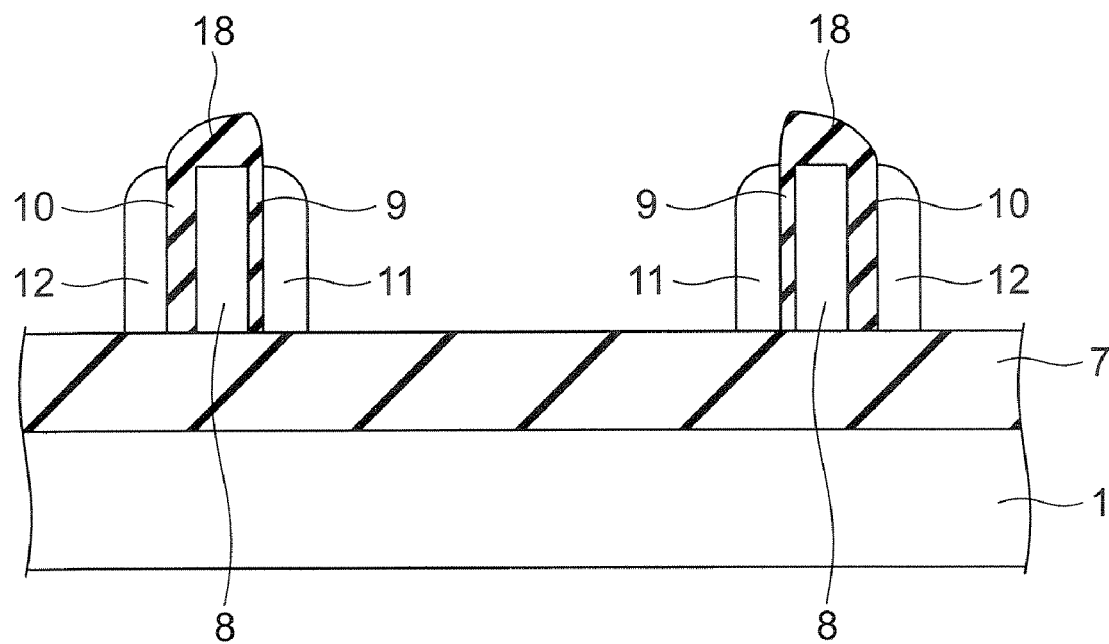
FIG. 12 is a cross-sectional view showing a step for manufacturing the memory element according to the first embodiment.

As shown in FIG. 12, a 30-nm thick polycrystalline silicon film is formed on the entire surface of the semiconductor substrate, including the plate-like semiconductor layer 8 and the first and second tunnel gate insulating films 9 and 10, by the CVD method or the like. Anisotropic etching such as RIE is then performed on the polycrystalline silicon film, so as to form the first and second charge accumulating layers 11 and 12.

Figure 13:
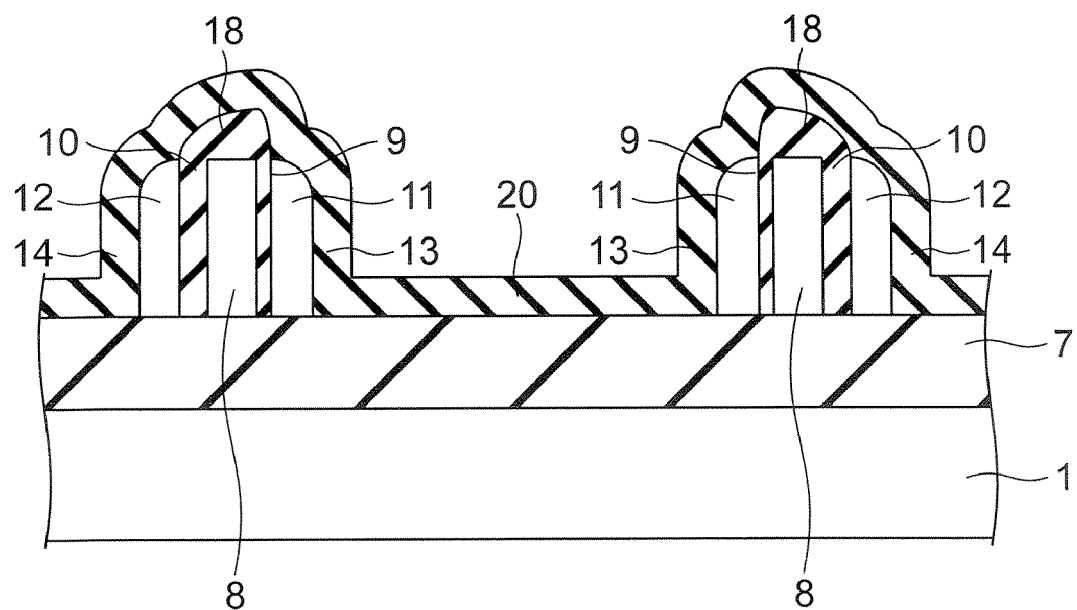
FIG. 13 is a cross-sectional view showing a step for manufacturing the memory element according to the first embodiment.

As shown in FIG. 13, a 30-nm thick hafnium oxide film 20 is formed on the entire surface of the semiconductor substrate, including the plate-like semiconductor layer 8, the first and second tunnel gate insulating films 9 and 10, and the first and second charge accumulating layers 11 and 12, by the CVD method or the like, so as to form the first and second interelectrode insulating films 13 and 14.

Figure 14:
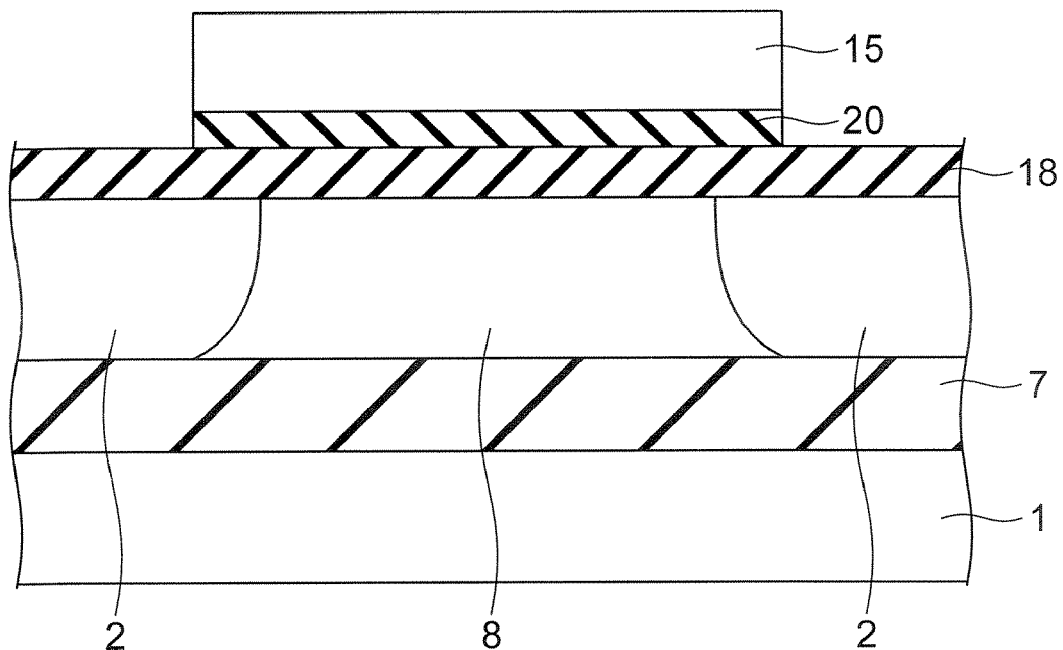
FIG. 14 is a cross-sectional view showing a step for manufacturing the memory element according to the first embodiment.

The procedure illustrated in FIG. 14 is then carried out. FIG. 14 is a cross-sectional view of the element, taken along the line B-B' of FIG. 1. A 100-nm thick tungsten film, for example, is formed on the entire surface of the semiconductor substrate, including the plate-like semiconductor layer 8, the first and second tunnel gate insulating films 9 and 10, the first and second charge accumulating layers 11 and 12, the first and second interelectrode insulating films 13 and 14, and the hafnium oxide film 20, by the CVD method or the like. The surface of the tungsten film may be flattened by the chemical mechanical polishing method (hereinafter referred to as the CMP method) or the like. The flattening of the surface has the advantage that the depth of focus required in the lithography procedure can be small. Anisotropic etching such as RIE is then performed on the tungsten film, so as to form the control gate electrode 15. The portions of the first and second interelectrode insulating films 13 and 14 and the first and second charge accumulating layers 11 and 12 that are not covered with the control gate electrode 15 are then removed by anisotropic etching such as RIE. At this point, the silicon oxide sidewall 18 and the first and second tunnel gate insulating films 9 and 10 existing in the upper portion of the plate-like semiconductor region 8 may also be removed. Further, As ions or the likes are implanted with a dose amount of $1 \times 10^{15}$ cm$^{-2}$ at an accelerating voltage of 5 keV, for example, and a heat treatment is carried out so as to form the source/drain regions 2.

As in a conventional case, the interlayer insulating film forming procedure and the wiring procedure are then carried out thereafter, so as to complete the non-volatile semiconductor memory element of this embodiment.

Although an n-type structure has been described above, this embodiment may be applied to a p-type structure by reversing the conductivity types of the impurities, and to a complementary-type structure by introducing impurities to a certain region in the substrate by a lithography technique or the like. Furthermore, this embodiment may be applied to a semiconductor device that includes such a structure.

Although only the steps for forming a non-volatile semiconductor memory element have been described above, the above described method according to this embodiment can also be utilized to form a non-volatile semiconductor memory element as a part of a semiconductor device including an active device such as a field effect transistor, a bipolar transistor, or a single-electron transistor, a passive device such as a resistor, a diode, an inductor, or a capacitor, or a device using a ferroelectric material or a device using a magnetic material. The method may also be utilized to form a memory device having a non-volatile semiconductor memory element as a part of an OEIC (Opto-Electrical Integrated Circuit) or a MEMS (Micro Electro Mechanical System). Here, a peripheral circuit of such a memory device including a non-volatile semiconductor memory element may be of course involved.

Although the above described non-volatile semiconductor memory element is formed on a SOI substrate, this embodiment may be applied to a case where a non-volatile semiconductor memory element is formed on a conventional bulk semiconductor substrate, and the same effects as above can be achieved.

In this embodiment, arsenic (As) ions are used as impurities to form an n-type semiconductor layer, and boron (B) ions are used as impurities to form a p-type semiconductor layer. However, other V-group impurities may be used as the impurities to form an n-type semiconductor layer, and other III-group impurities may be used as the impurities to form a p-type semiconductor layer. The introduction of III-group or V-group impurities may be carried out with the use of a compound containing those impurities.

Although the introduction of impurities is carried out through ion implantation, some other method such as solid-phase diffusion or vapor-phase diffusion may be employed. Alternatively, a semiconductor containing impurities may be deposited or grown.

In this embodiment, impurity introduction to adjust the threshold voltage of the element is not performed. However, impurity introduction to adjust the threshold voltage may be performed as well as the impurity introduction for well formation. By doing so, the threshold voltage can be readily set at a desired value. Meanwhile, this embodiment has the advantage that the manufacturing process can be simplified.

Although a single-drain structure is employed in this embodiment, a device having some other structure such as an extension structure, a LDD (Lightly Doped Source/Drain) structure, or a GDD (Graded Diffused Source/Drain) structure may be produced. Alternatively, a device having such a structure as a halo structure or a pocket structure may be employed. With any of the above structures, the resistance to a short channel effect of the element can be advantageously increased.

In this embodiment, the source/drain regions are formed after the processing of the gate electrode and the gate insulating films. However, this manufacturing order is not an essential aspect of this embodiment, and may be reversed. Depending on the materials of the gate electrode and the gate insulating films, a heating process might not be preferable. In such a case, the introduction of impurities to the source/drain regions and the heating process for activation should preferably be performed before the processing of the gate electrode and the gate insulating films.

Although the charge accumulating layers are made of polycrystalline silicon in this embodiment, it is possible to employ a metal such as tungsten. The charge accumulating layers may also be formed with a semiconductor of single-crystalline silicon or non-crystalline silicon, a metal other than tungsten, a compound containing a metal, or a stacked layer of those materials. The same applied to the control gate electrode. If the control gate electrode is made of a metal or a compound containing a metal, the resistance of the control gate electrode is lowered, and high-speed operations by the element can be performed. If the control gate electrode and the charge accumulating layers are made of metal, oxidation reaction can be suppressed. Accordingly, the controllability at the interface between the tunnel gate insulating films and the interelectrode insulating films and at the interface between the control gate electrode and the charge accumulating layers can be advantageously increased. When a semiconductor made of such a material as polycrystalline silicon is used for at least a part of the control gate electrode and the charge accumulating layers, the work function can be readily controlled, and the threshold voltage of the element can be readily adjusted. The charge accumulating layers may be formed with dot-like metal or a semiconductor, or a compound containing either of them. Instead of a metal or a semiconductor or a compound containing them, the levels existing at the interface between the insulating films and the stacked insulating films may be employed as the charge accumulating layers, for example.

Also, in this embodiment, the control gate electrode and the charge accumulating layers are formed by performing anisotropic etching after the materials for those components are deposited. However, the control gate electrode and the charge accumulating layers may be formed by an embedding technique such as a damascene process. If the source/drain regions are formed before the formation of the control gate electrode and the charge accumulating layers, a damascene process is preferable, because the source/drain regions, the control gate electrode, and the charge accumulating layers can be formed in a self-aligning fashion.

Although the lengths of the upper portion and the lower portion of the control gate electrode in the principal direction of the current flowing through the element are the same in this embodiment, this is not an essential aspect of this embodiment. For example, the control gate electrode may have a T-like shape, with the upper portion being longer than the lower portion. In this case, the gate resistance can also be advantageously lowered.

Figure 15:
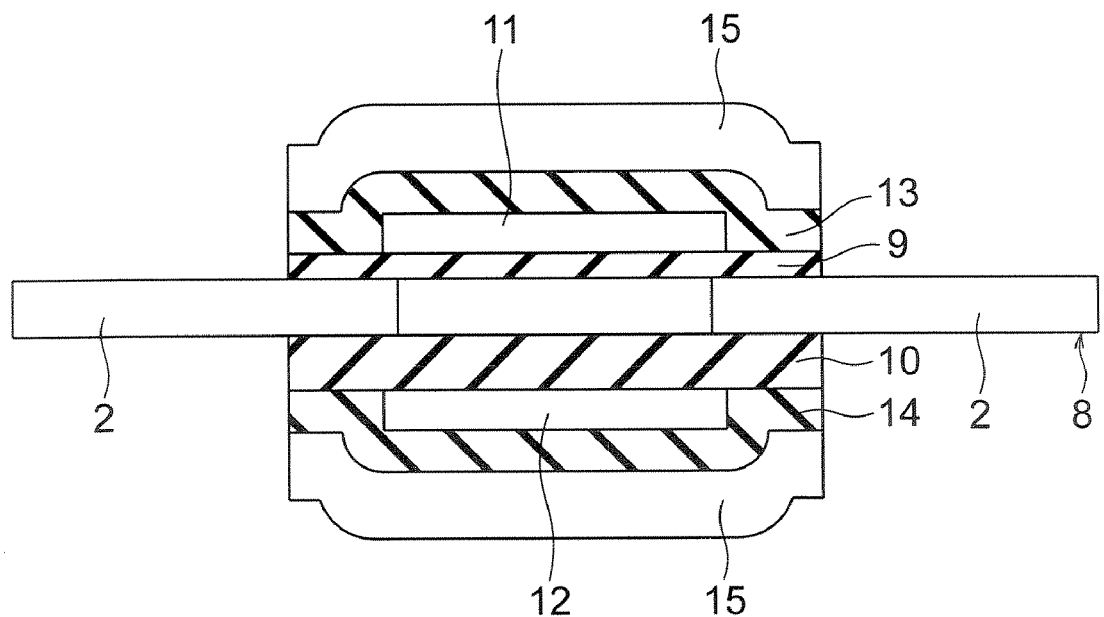
FIG. 15 is a cross-sectional view of a memory element according to a first modification of the first embodiment.

In this embodiment, the length of the control gate electrode measured in the principal direction of the current flowing through the element is made equal to the length of each of the charge accumulating layers. However, this is not an essential aspect of this embodiment, and those two lengths may differ from each other. Especially, if the control gate electrode 15 is longer so as to cover the charge accumulating layers 11, as schematically shown in a cross-sectional view of FIG. 15 taken in parallel with the surface of the semiconductor substrate, the coupling ratio of the capacitance formed between the control gate electrode and the charge accumulating layers to the capacitance formed between the channel region and the charge accumulating layers 11 and 12 can be made higher, and the controllability over the electric field in the tunnel gate insulating films 9 and 10 by varying the potential of the control gate electrode 15 can be advantageously increased. In this embodiment, the length of the control gate electrode and the length of each of the charge accumulating layers are the same by the manufacturing method according to this embodiment. This arrangement has the advantage that the control gate electrode and the charge accumulating layers can be formed through the same masking procedure, thereby simplifying the manufacturing process. In the structure illustrated in FIG. 15, the first and second tunnel gate insulating films 9 and 10, the first and second interelectrode insulating films 13 and 14, and the control gate electrode 15 have the same lengths. However, this is not an essential aspect of the present invention, and those lengths may vary to achieve the same effects as above.

Figure 16:
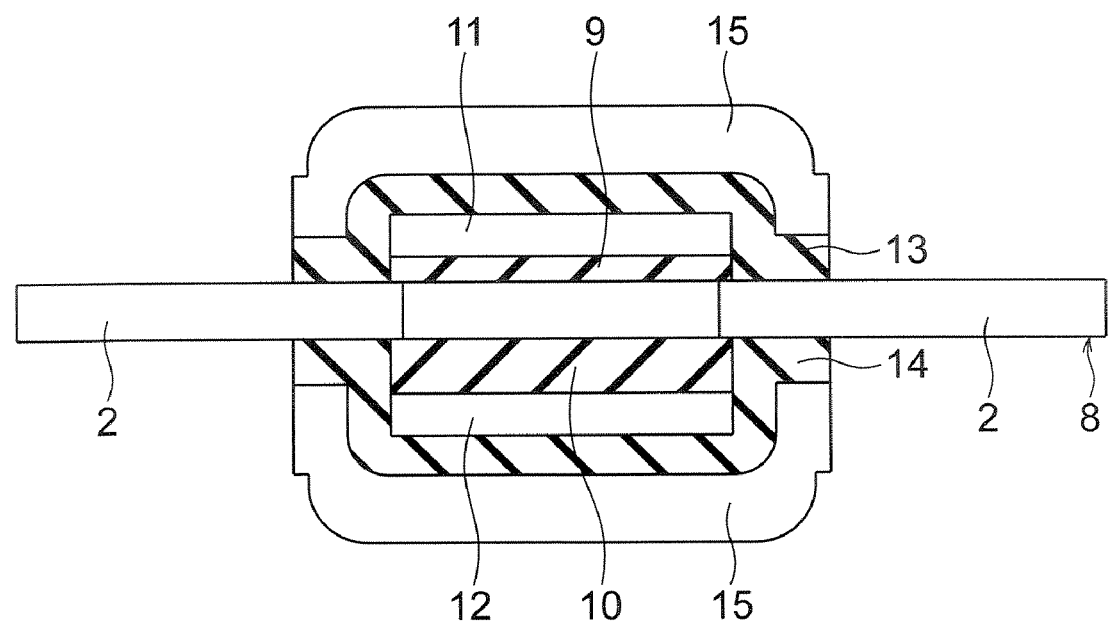
FIG. 16 is a cross-sectional view of a memory element according to a second modification of the first embodiment.

Also, as shown in FIG. 16, the first and second tunnel gate insulating films 9 and 10 may be made shorter than the control gate electrode 15.

Although not clearly mentioned in this embodiment, the formation of a metal layer for wirings may be carried out by a method such as a sputtering method or a deposition method. Alternatively, such a metal layer may be formed by a selective metal growth method or a damascene method. The material for the wiring metal may be an Al (aluminum) material containing silicon, or a metal such as Cu (copper). Cu is particularly preferable, having a low resistivity.

Although a silicidation procedure is not mentioned in this embodiment, a silicide layer may be formed on the source/drain regions. Alternatively, a layer containing metal may be deposited or grown on the source/drain regions. This arrangement is preferred, as the resistance of the source/drain regions can be lowered. In a case where the control gate electrode is made of polycrystalline silicon or the like, silicidation may be performed for the control gate electrode. The silicidation is preferred, as the gate resistance can be lowered. Alternatively, an elevated structure may be employed. With an elevated structure, the resistance of the source/drain regions can be lowered.

In this embodiment, the electrode is exposed through the upper portion of the control gate electrode. However, an insulator made of silicon oxide, silicon nitride, or silicon oxynitride may be formed on the upper portion of the control gate electrode. Especially, where the control gate electrode is formed with a material containing a metal, or where the control gate electrode needs to be protected during the manufacturing process, it is essential that a protection material such as silicon oxide, silicon nitride, or silicon oxynitride is provided on the upper portion of the control gate electrode.

In this embodiment, silicon oxide films formed through thermal oxidation are used as the tunnel gate insulating films. However, insulating films made of silicon oxynitride or stacked films of such insulating films may be employed as the tunnel gate insulating films. The existence of nitrogen is preferred, because diffusion of impurities in the substrate can be prevented in a case where polycrystalline silicon containing the impurities is employed for the control gate electrode and the charge accumulating layers. The method of forming the insulating films is not limited to thermal oxidation, but a deposition method such as the CVD method, a vapor deposition method, a sputtering method, an epitaxial growth method, or the like may be utilized. In a case where an oxide of a material is employed for the insulating films, films made of the material are first formed, and the films may be oxidized. Alternatively, the films may be exposed to an oxygen gas in an excited state that does not necessarily involve a temperature rise. The exposure to an oxygen gas in an excited state that does not involve a temperature rise is preferred, because a change in the concentration distribution of the impurities in the channel region due to the impurities diffusion can be prevented. Further, in a case where a silicon oxynitride film is employed, silicon oxide films are first formed, and nitrogen is introduced into the insulating films by exposing the silicon oxide films to a gas containing nitrogen that is in a temperature rising state or an excited state. If the silicon oxynitride films are formed by exposing the insulating films to a nitrogen gas in an excited state that does not involve a temperature rise, the concentration distribution of the impurities in the channel region can be advantageously prevented from changing due to diffusion. Also in the case where silicon oxynitride films are employed, silicon nitride films may be formed first, and oxygen is then introduced into the insulating films by exposing the silicon nitride films to a gas containing oxygen in a temperature rising state or an excited state. If the silicon oxynitride films are formed by exposing the silicon nitride films to an oxygen gas in an excited state that does not involve a temperature rise, the concentration distribution of the impurities in the channel region can be advantageously prevented from changing due to diffusion.

Also, hafnium oxide films formed through deposition are employed as the interelectrode insulating films in this embodiment. However, it is also possible to employ, as the interelectrode insulating films, metal oxide films containing Zr (zirconium), Ti (titanium), Sc (scandium), Y (yttrium), Ta (tantalum), Al (aluminum), La (lanthanum), Ce (cerium), Pr (praseodymium), or lanthanoid series elements, silicate materials containing silicon as well as various elements including the above elements, insulating films containing nitrogen in addition to those elements, high permittivity films, or stacked structures of those films. Also, the existence of nitrogen is preferred, because crystallization and deposition of only particular elements can be prevented. The existence of nitrogen in the insulating films also has the advantage that diffusion of impurities in the substrate can be prevented in a case where polycrystalline silicon containing the impurities is employed for the gate electrode. The method of forming the insulating films is not limited to the deposition method such as the CVD method, and some other method such as a deposition method, a sputtering method, or an epitaxial growth method may be employed. In a case where an oxide containing a certain substance is employed as the insulating film, a film of the certain substance is first formed, and the film is then oxidized.

The thicknesses of the insulating films forming the tunnel gate insulating films and the interelectrode insulating films are not limited to the values specified in this embodiment. However, the intensity of capacitive coupling is determined by equivalent oxide thicknesses, instead of geometric film thicknesses. Accordingly, where the equivalent oxide thickness of each tunnel gate insulating film is made larger than the equivalent oxide thickness of each interelectrode insulating film, the coupling ratio between capacitances can be made advantageously higher. Especially, if the interelectrode insulating films are made of a material with a higher permittivity than the tunnel gate insulating films, the equivalent oxide thickness of each of the interelectrode insulating films can be made smaller, while the large geometric thickness of each of the interelectrode insulating films is maintained. This arrangement has the advantage that the current flowing through the interelectrode insulating films can be suppressed.

Although gate sidewalls are not mentioned in this embodiment, sidewalls may be provided on the control gate electrode and the charge accumulating layers. Especially, in the case where the interelectrode insulating films and the tunnel gate insulating films are made of high permittivity materials, gate sidewalls made of high permittivity materials reduce the electric field in the portions of the interelectrode insulating films and the tunnel gate insulating films located in the vicinities of the lower end corners of the control gate electrode and the charge accumulating layers, as disclosed in JP-A 2003-209247 (KOKAI). Thus, the reliability of the interelectrode insulating films and the tunnel gate insulating films can be advantageously increased, and excessive erasing can be prevented.

Although post-oxidation performed after the formation of the control gate electrode and the charge accumulating layers has not been mentioned in the description of this embodiment, a post-oxidizing procedure may be carried out if possible, with the materials of the control gate electrode, the charge accumulating layers, and the gate insulating films being taken into consideration. Instead of post-oxidation, an operation of rounding the lower end corners of the control gate electrode and the charge accumulating layers may be performed by carrying out a chemical process or exposing it to a reactive gas These procedures are preferred, because the electric field at the lower end corners of the control gate electrode and the charge accumulating layers can be weakened through the procedures. Thus, the reliability of the interelectrode insulating films and the tunnel gate insulating films can be advantageously increased.

Interlayer insulating films have not been mentioned in the description of this embodiment either. However, it is possible to employ silicon oxide films as interlayer insulating films or to use a material such as a low permittivity material other than silicon oxide for the interlayer insulating films. With the permittivity of the interlayer insulating films being low, the parasitic capacitance of the element becomes also low. Thus, high-speed operation of the element can be realized.

Contact holes have not been mentioned in the description of this embodiment, either. However, self-aligning contacts may be formed. With the self-aligning contacts, the device area can be reduced, and a higher degree of integration can be advantageously achieved.

In the above description of this embodiment, two non-volatile semiconductor memory elements are produced by the manufacturing method of this embodiment. However, the number of non-volatile semiconductor memory elements to be produced according to this embodiment is not limited to two, and the same effects can of course be achieved in any other case.

Second Embodiment

Figure 17:
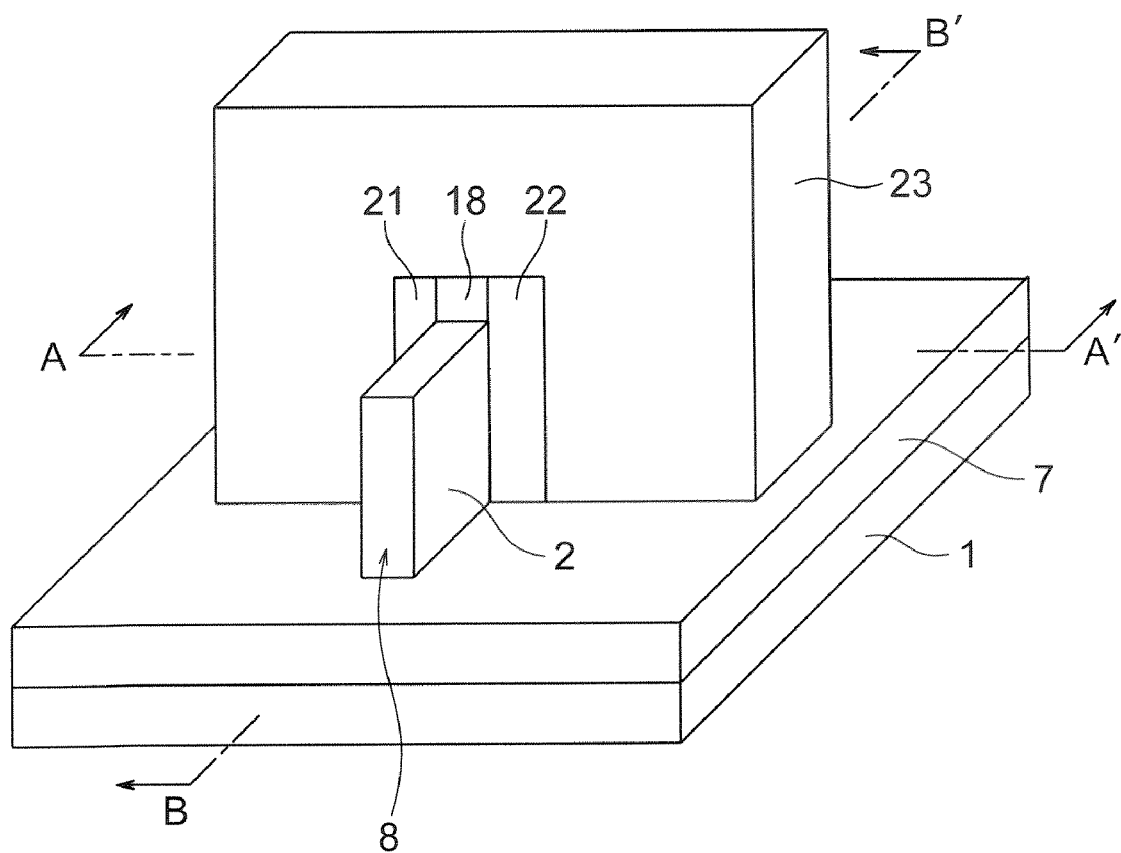
FIG. 17 is a perspective view of a non-volatile semiconductor memory element according to a second embodiment of the present invention.

FIG. 17 is a perspective view of a non-volatile semiconductor memory element according to a second embodiment of the present invention. The non-volatile semiconductor memory element of this embodiment is formed on a SOI substrate. A plate-like semiconductor region 8 having a channel region is provided on an embedded insulating film 7 formed on a supporting semiconductor substrate 1. An insulating film 18 made of silicon oxide is provided on the top face of the semiconductor region 8. A first ferroelectric insulating film 21 is provided on one of the side faces of the semiconductor region 8 and the insulating film 18, so as to cover the channel region. A second ferroelectric insulating film 22 is provided on the other one of the side faces of the semiconductor region 8 and the insulating film 18, so as to cover the channel region. A gate electrode 23 is provided so as to cover the semiconductor region 8, the insulating film 18, and the first and second ferroelectric insulating films 21 and 22. In other words, the gate electrode 23 is designed to cover the channel region via the insulating film 18 and the first and second ferroelectric insulating films 21 and 22. Further, source/drain regions 2 are formed in the portions of the semiconductor region 8 located on both sides of the gate electrode 23. In other words, the channel region of the semiconductor region 8 is located between the source region 2 and the drain region 2 of the semiconductor region 8. As in the first embodiment, the plate-like semiconductor region 8 forming the channel region is designed to have a smaller thickness than twice the maximum thickness of the depletion layer determined by the impurity concentration in the region.

The principal direction of the current flowing through the channel region is the direction of B-B' shown in FIG. 17. The first ferroelectric insulating film 21 and the second ferroelectric insulating film 22 formed on the side faces of the plate-like semiconductor region 8 forming the channel region have different thicknesses from each other. Accordingly, the voltage conditions for causing polarization reversal are also different between the two ferroelectric insulating films 21 and 22. Here, the electric field in each insulating film does not discontinuously vary, with a particular value being a boundary. When the voltage conditions for the gate electrode 23 and the source/drain regions 2 are defined by that the polarization of each ferroelectric insulating film exhibits a particular value, or the value of the electric field in the insulating film exhibits a particular value, the "voltage conditions for causing polarization reversal" are clearly defined.

Next, the operation of the non-volatile semiconductor memory element of this embodiment is described, on the assumption that this element is of an n-type. In the case of a p-type element, exactly the same operation can be performed, except that the voltage polarities or the likes are reversed.

In the example described below, the ferroelectric insulating film 21 is thinner than the ferroelectric insulating film 22. In a case where the potential of the source/drain regions 2 is set at zero, the gate voltages at which the polarizations of the first ferroelectric insulating film 21 and the second ferroelectric insulating film 22 are reversed from the direction extending from the gate electrode 23 to the plate-like semiconductor region 8 are represented by $V_{W1}$ and $V_{W2}$, and the gate voltages at which the polarizations of the first ferroelectric insulating film 21 and the second ferroelectric insulating film 22 are reversed from the direction extending from the plate-like semiconductor region 8 to the gate electrode 23 are represented by $V_{E1}$ and $V_{E2}$. The gate voltages $V_{W1}$ and $V_{W2}$ are negative, while the gate voltages $V_{E1}$ and $V_{E2}$ are positive. Since the first ferroelectric insulating film 21 is thinner than the second ferroelectric insulating film 22, the relations, $V_{W1} > V_{W2}$ and $V_{E1} < V_{E2}$, are established. Accordingly, when the potential $V_{CG}$ of the control gate electrode 23 is made lower than $V_{W1}$, the polarization of the first ferroelectric insulating film 21 is reversed. When the potential $V_{CG}$ of the control gate electrode 23 is made lower than $V_{W2}$, the polarization of the second ferroelectric insulating film 22 is also reversed. When the potential $V_{CG}$ of the control gate electrode 23 is made higher than $V_{E1}$, the polarization of the first ferroelectric insulating film 21 is reversed. When the potential $V_{CG}$ of the control gate electrode 23 is made higher than $V_{E2}$, the polarization of the second ferroelectric insulating film 22 is also reversed. The threshold voltage in the case where the polarization of either ferroelectric insulating film is directed from the gate electrode 23 to the plate-like semiconductor region 8 is represented by $V_{TH0}$. The threshold voltage in the case where only the polarization of the first ferroelectric insulating film 21 is directed from the plate-like semiconductor region 8 to the gate electrode 23 is represented by $V_{TH1}$. The threshold voltage in the case where only the polarization of the second ferroelectric insulating film 22 is directed from the plate-like semiconductor region 8 to the gate electrode 23 is represented by $V_{TH2}$. The threshold voltage in the case where the polarization of either ferroelectric insulating film is directed from the plate-like semiconductor region 8 to the gate electrode 23 is represented by $V_{TH12}$.

Figure 18:
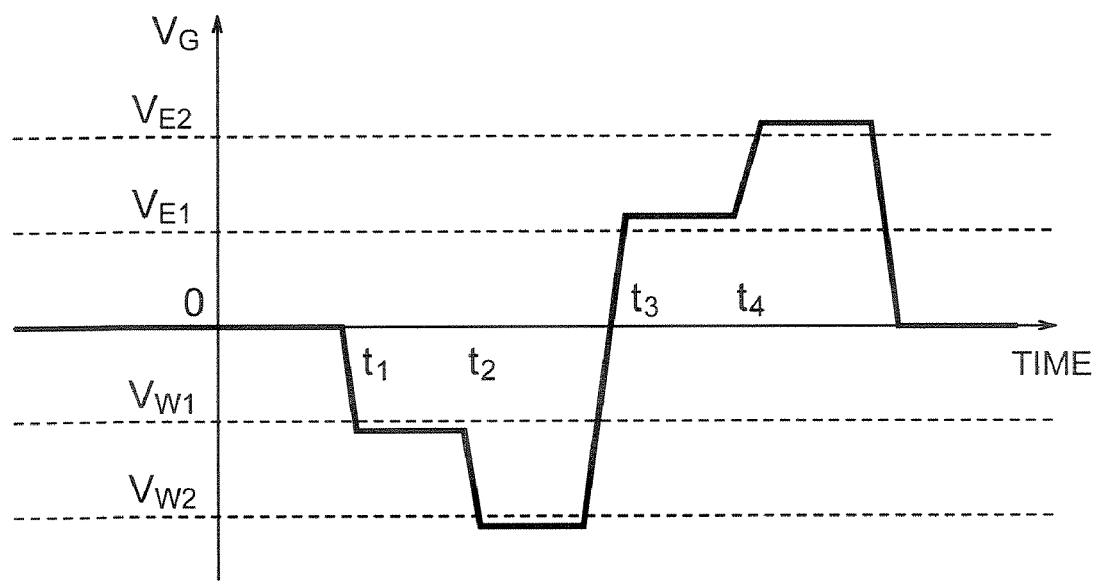
FIG. 18 is a diagram for explaining an operation of the non-volatile semiconductor memory element according to the second embodiment.
Figure 19:
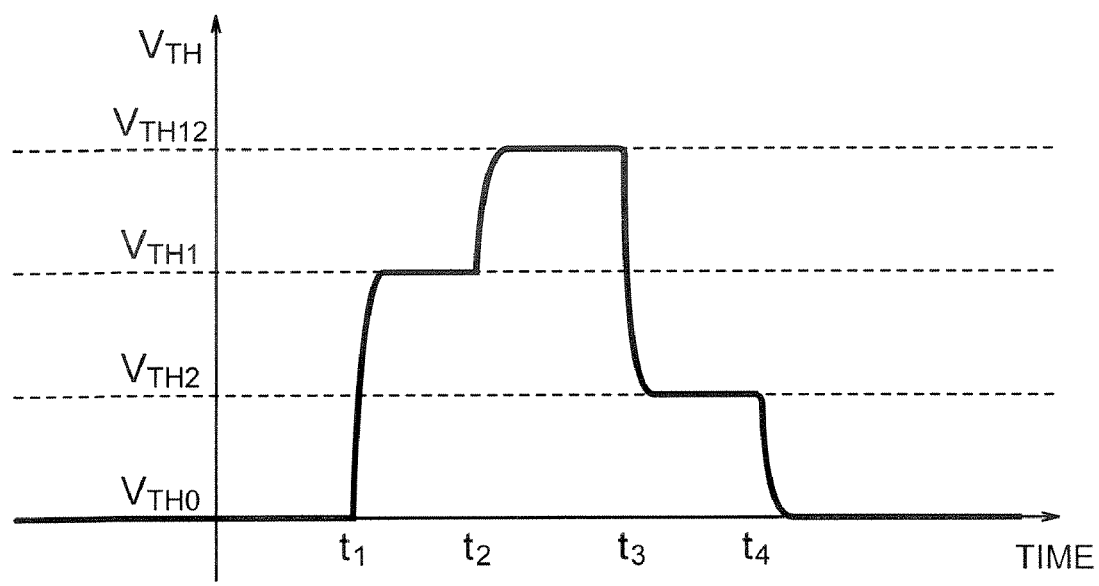
FIG. 19 is a diagram for explaining an operation of the non-volatile semiconductor memory element according to the second embodiment.

FIG. 18 schematically shows $V_G$ varying with time in the case where the polarizations of both of the ferroelectric insulating films 21 and 22 are initially directed from the gate electrode 23 to the plate-like semiconductor region 8. Here, $V_G$ represents the gate voltage. The threshold voltage varies as schematically shown in FIG. 19. Since the polarization of either of the ferroelectric insulating films 21 and 22 is directed from the gate electrode 23 to the plate-like semiconductor region 8 until time $t_1$, the threshold voltage is $V_{TH0}$. When the voltage $V_G$ becomes a voltage between $V_{W1}$ and $V_{W2}$ at time $t_1$, the polarization of the first ferroelectric insulating film 21 is reversed, but the polarization of the second ferroelectric insulating film 22 is not reversed. Accordingly, the threshold voltage becomes $V_{TH1}$.

When the voltage $V_G$ becomes lower than $V_{W2}$ at time $t_2$, the polarization of the second ferroelectric insulating film 22 is also reversed, and the threshold voltage becomes $V_{TH12}$. When the voltage $V_G$ becomes a voltage between $V_{E1}$ and $V_{E2}$ at time $t_3$, the polarization of the first ferroelectric insulating film 21 is reversed, but the polarization of the second ferroelectric insulating film 22 is not reversed. Accordingly, the threshold voltage becomes $V_{TH2}$. When the voltage $V_G$ becomes higher than $V_{E2}$ at time $t_4$, the polarization of the second ferroelectric insulating film 22 is also reversed, and the threshold voltage becomes $V_{TH0}$.

As described above, the voltage conditions for reversing the polarizations of the ferroelectric insulating films 21 and 22 sandwiching the channel region are different from each other. Accordingly, the polarization of only one of the ferroelectric insulating films can be reversed by varying the voltage of the gate electrode 23, and the threshold voltage of the element can be controlled. Although the relation, $V_{TH1} > V_{TH2}$, is set in this description, the relation can be reversed. Also, the relation between the thicknesses of the ferroelectric insulating films 21 and 22 may be reversed. What really matters is that the voltages $V_{E1}$ and $V_{E2}$ differ from each other, the voltages $V_{W1}$ and $V_{W2}$ differ from each other, and the threshold voltages $V_{TH0}$, $V_{TH1}$, $V_{TH2}$, and $V_{TH12}$ differ from one another. If only either one of the condition that $V_{E1}$ and $V_{E2}$ differ from each other and the condition that $V_{W1}$ and $V_{W2}$ differ from each other is satisfied, both the state in which only the polarization of the first ferroelectric insulating film 21 is directed from the plate-like semiconductor region 8 to the gate electrode 23 and the state in which only the polarization of the second ferroelectric insulating film 22 is directed from the plate-like semiconductor region 8 to the gate electrode 23 cannot be realized at the same time. However, the state in which the polarization of either of the first and second ferroelectric insulating films 21 and 22 is directed from the gate electrode 23 to the plate-like semiconductor region 8, the state in which only the polarization of one of the ferroelectric insulating films is directed from the plate-like semiconductor region 8 to the gate electrode 23, and the state in which the polarization of either of the first and second ferroelectric insulating films 21 and 22 is directed from the plate-like semiconductor region 8 to the gate electrode 23 can be realized. In this case, three different threshold voltages are obtained. Accordingly, information that is less than 2 bits but exceeds 1 bit can be stored in each one element. In the case where the voltages $V_{E1}$ and $V_{E2}$ differ from each other, the voltages $V_{W1}$ and $V_{W2}$ differ from each other, and the threshold voltages $V_{TH1}$ and $V_{TH2}$ differ from each other, 2-bit information can be stored in each one element. Thus, higher information storage density can be advantageously achieved.

Information reading is performed by sensing a current flowing through the channel of the element while a certain potential is being applied to the gate electrode 23 and the source/drain regions 2. If the threshold voltages differ from each other, the value of current flowing varies. Accordingly, the stored information can be read out by sensing the current.

In this manner, the same operation as in the first embodiment can be performed with the same circuit structure as the structure of the first embodiment.

As described above, a high-performance non-volatile semiconductor memory element that can lower the power supply voltage and does not complicate the wirings can be obtained according to this embodiment.

Referring now to FIGS. 20 to 24, a method of manufacturing the non-volatile semiconductor memory element of this embodiment is described. Here, the method of manufacturing two elements at the same time is described. FIGS. 20 to 23 are cross-sectional views of the element, taken along the line A-A' of FIG. 17.

Figure 20:
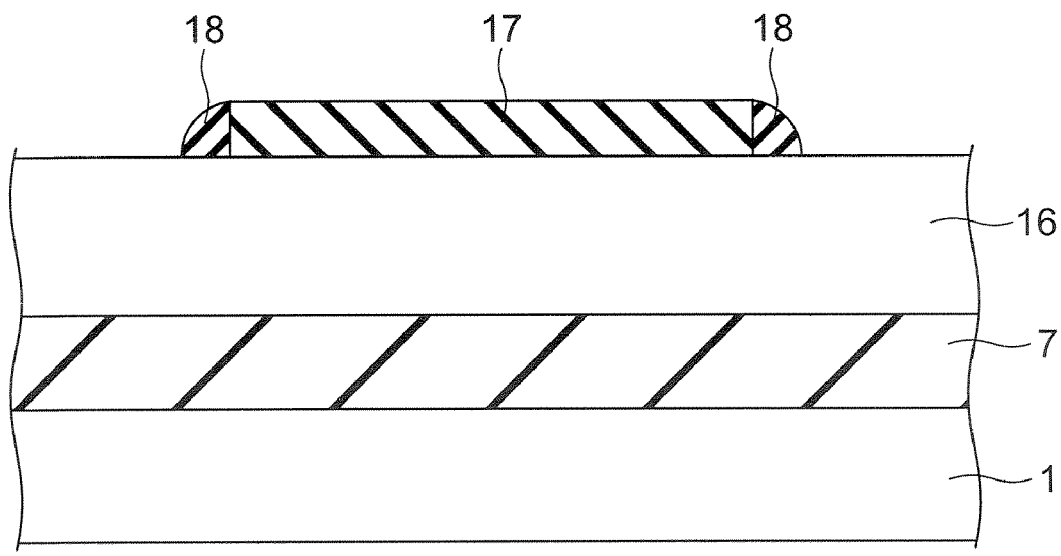
FIG. 20 is a cross-sectional view showing a step for manufacturing the memory element according to the second embodiment.

As shown in FIG. 20, after boron (B) ions are implanted to the semiconductor layer 16 of the SOI substrate with a dose amount of $1 \times 10^{12}$ cm$^{-2}$ at an accelerating voltage of 30 keV, for example, a 30-second heat treatment is carried out at 1050° C. Silicon nitride is then deposited with a thickness of 30 nm on the semiconductor layer 16 by the CVD method, for example. The deposited silicon nitride is then patterned to form a silicon nitride film 17. A 30-nm thick silicon oxide film is deposited on the entire surface of the semiconductor substrate, including the silicon nitride film 17, by the CVD method or the like. Anisotropic etching such as as RIE is then performed to form the sidewall 18 made of silicon oxide (see FIG. 20).

Figure 21:
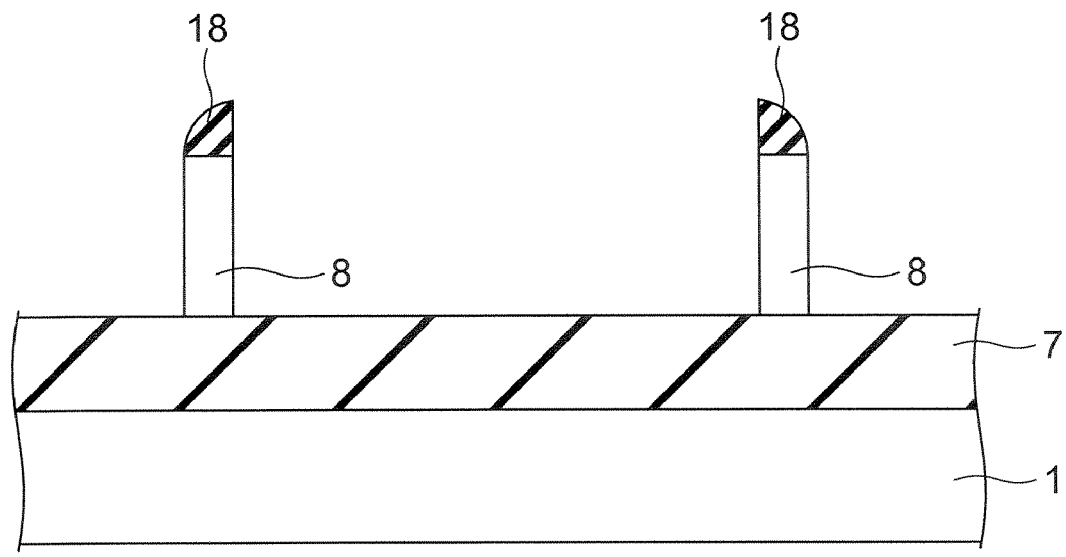
FIG. 21 is a cross-sectional view showing a step for manufacturing the memory element according to the second embodiment.

As shown in FIG. 21, the silicon nitride film 17 is removed through a thermal phosphoric acid treatment or the like. The semiconductor layer 16 is then patterned by RIE or the like, so as to form the plate-like semiconductor region 8 having the channel region (see FIG. 21).

Figure 22:
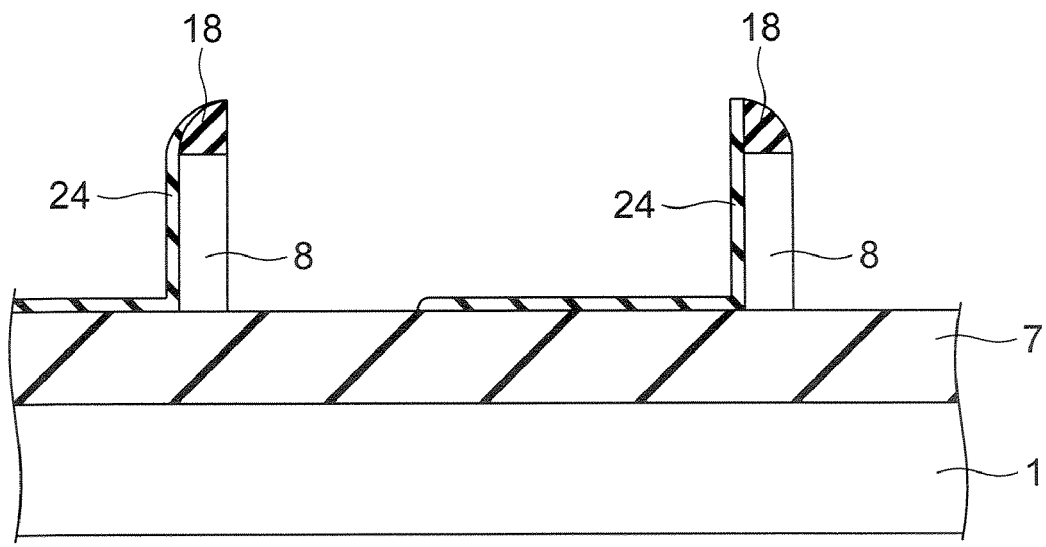
FIG. 22 is a cross-sectional view showing a step for manufacturing the memory element according to the second embodiment.

As shown in FIG. 22, a 20-nm thick PZT film 24 that is made of $PbZr_xTi_{1-x}O_3$, for example, is formed by such a technique as a sputtering technique. Here, the sputtering is performed from diagonally above left in FIG. 22, so that PZT film 24 is formed on the left side face of the plate-like semiconductor region 8, but not on the right side face which is hidden behind when seen from diagonally above left.

Figure 23:
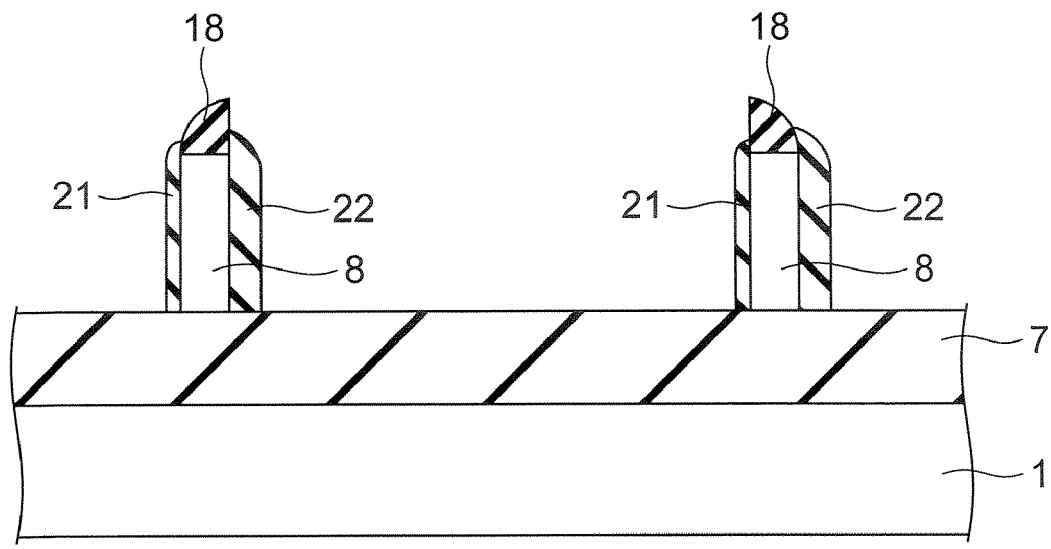
FIG. 23 is a cross-sectional view showing a step for manufacturing the memory element according to the second embodiment.

As shown in FIG. 23, a 30-nm thick PZT film that is made of $PbZr_xTi_{1-x}O_3$, for example, is then formed by such a technique as a sputtering technique. Here, the sputtering is performed from diagonally above right in the drawing, so that PZT film is formed on the right side face of the plate-like semiconductor region 8, but not on the left side face which is hidden behind when seen from diagonally above right. In this manner, the film thickness of the PZT film formed on the left side face of the plate-like semiconductor region 8 can differ from the film thickness of the PZT film formed on the right side face of the plate-like semiconductor region 8. Anisotropic etching such as RIE is then performed on the PZT films, so as to form the first and second ferroelectric insulating films 21 and 22 having different film thicknesses from each other.

Figure 24:
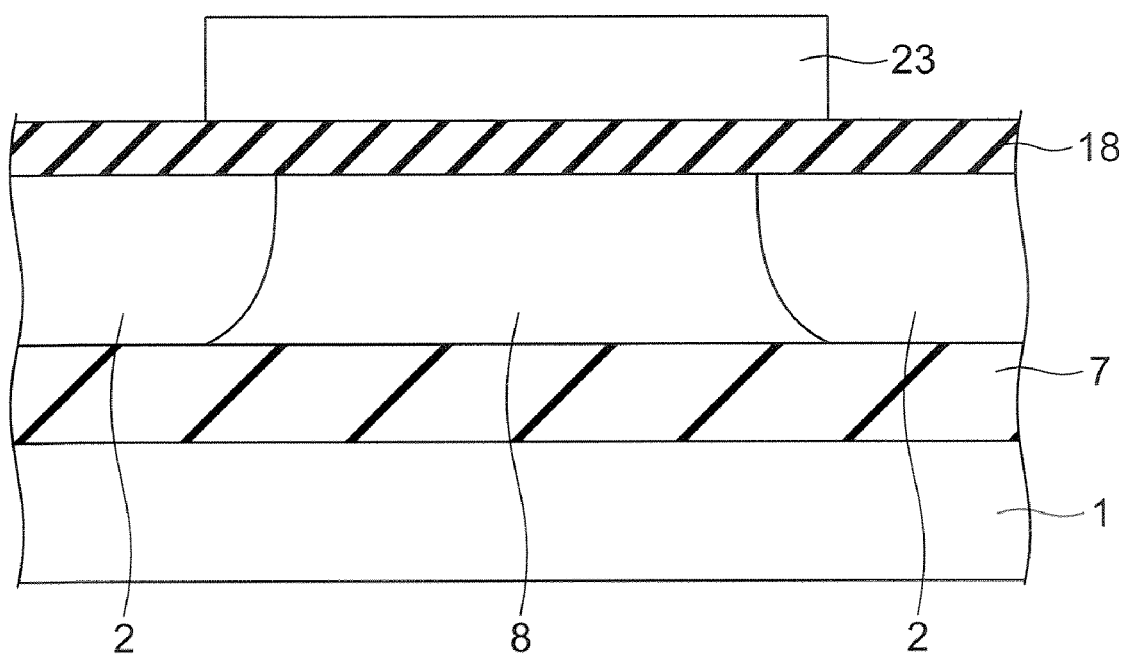
FIG. 24 is a cross-sectional view showing a step for manufacturing the memory element according to the second embodiment.

The step illustrated in FIG. 24 is then carried out. FIG. 24 is a cross-sectional view of the element, taken along the line B-B' of FIG. 17. A 100-nm thick tungsten film, for example, is formed on the entire surface of the semiconductor substrate, including the plate-like semiconductor layer 8 and the first and second ferroelectric insulating films 21 and 22, by the CVD method or the like. The surface of the tungsten film may be flattened by the CMP method or the like. The flattening of the surface has the advantage that the focus depth required in the lithography procedure can be small.

Anisotropic etching such as RIE is then performed on the tungsten film, so as to form the gate electrode 23. The portions of the first and second ferroelectric insulating films 21 and 22 that are not covered with the gate electrode 23 are then removed by anisotropic etching such as RIE. At this point, the silicon oxide sidewall 18 existing in the upper portion of the plate-like semiconductor region 8 may also be removed. Further, arsenic (As) ions or the likes are implanted with a dose amount of $1 \times 10^{15}$ cm$^{-2}$ at an accelerating voltage of 5 keV, for example, and a heat treatment is carried out so as to form the source/drain regions 2.

As in a conventional case, the interlayer insulating film forming procedure and the wiring procedure are then carried out thereafter, so as to complete the non-volatile semiconductor memory element of this embodiment.

Although the ferroelectric insulating films are formed with PZT in this embodiment, other ferroelectric materials such as PLZT ((Pb or La) (Zr or Ti) $O_3$) and SBT ($SrBi_2Ta_2O_9$) may be employed for the ferroelectric insulating films. Alternatively, stacked films containing other insulating films that are not necessarily ferroelectric materials may be employed.

Also, the first and second ferroelectric insulating films may be made of different materials from each other. Furthermore, the film formation method is not limited to sputtering.

The various changes and modifications that can be made to the first embodiment as described above may also be made to this embodiment, to achieve the same effects as the above described effects.

Third Embodiment

Figure 25:
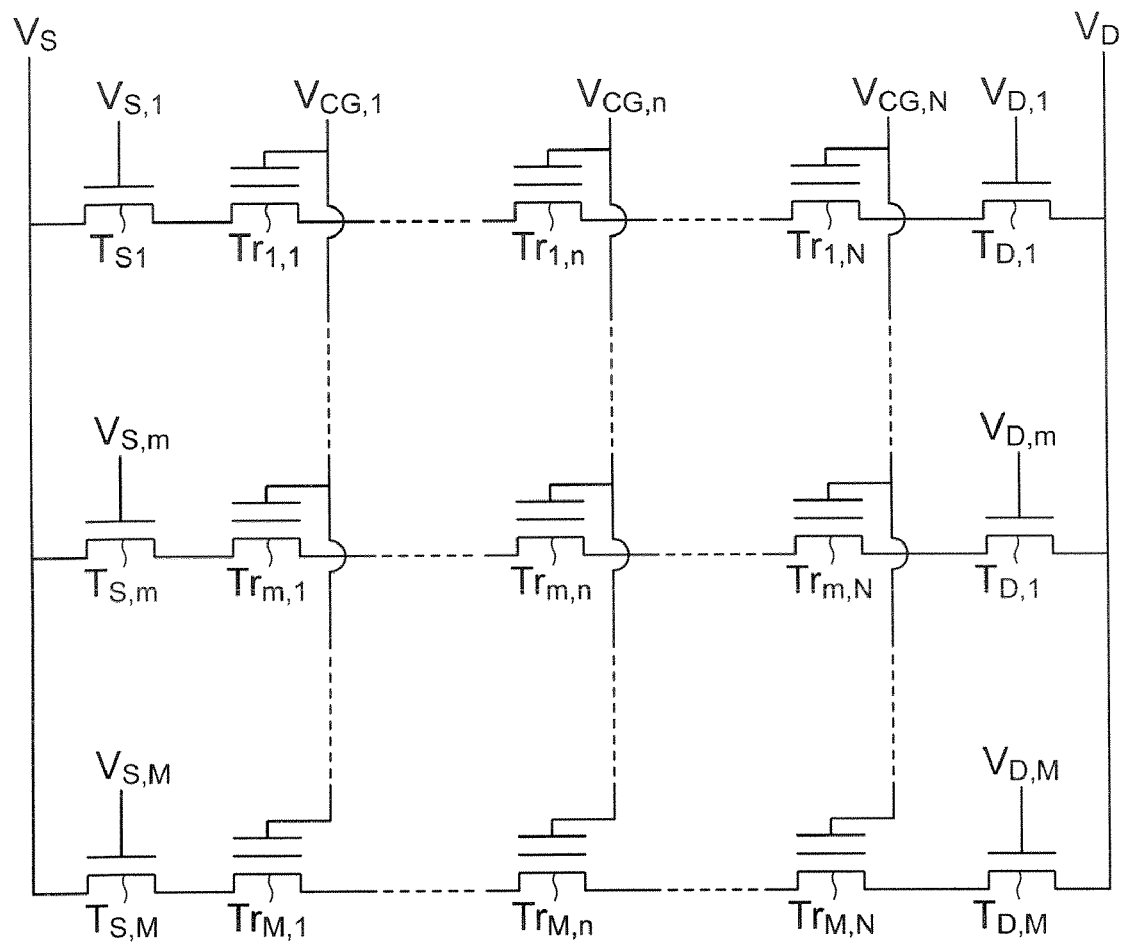
FIG. 25 is a circuit diagram of a semiconductor integrated circuit device according to a third embodiment of the present invention.

Referring now to FIG. 25, a semiconductor integrated circuit device according to a third embodiment of the present invention is described. FIG. 25 is a circuit diagram of the semiconductor integrated circuit device of this embodiment. The semiconductor integrated circuit device of this embodiment is a non-volatile semiconductor memory in which non-volatile semiconductor memory elements of either the first or second embodiment are arranged in a lattice-point form. The non-volatile semiconductor memory elements (hereinafter referred to simply as the memory elements) of either the first or second embodiment are represented by $Tr_{i,j}$ in FIG. 25 ($1 \leq i \leq M$, $1 \leq j \leq N$).

The memory elements located in the same row have the plate-like semiconductor regions connected to one another. The memory elements located in the same column have the control gate electrodes or the gate electrodes (hereinafter collectively referred to as the "control gate electrodes") connected to one another. The plate-like semiconductor regions in each row are connected to common lines via field effect transistors $T_{S,i}$ and $T_{D,i}$ ($1 \leq i \leq M$) on both sides. The potentials of the field effect transistors $T_{S,i}$ and $T_{D,i}$ are $V_S$ and $V_D$, respectively. The field effect transistors $T_{S,i}$ and $T_{D,i}$ ($1 \leq i \leq M$) are select transistors.

The potentials of the gate electrodes of the field effect transistors $T_{S,i}$ and $T_{D,i}$ ($1 \leq i \leq M$) are $V_{S,i}$ and $V_{D,i}$ ($1 \leq i \leq M$), respectively. The threshold voltages of the field effect transistors $T_{S,i}$ and $T_{D,i}$ ($1 \leq i \leq M$) do not need to be uniform, but are substantially the same at $V_{th}$. The threshold voltage $V_{th}$ is set between zero and $V_{DD}$. The potential of each of the control gate electrodes connected to one another in the column j is $V_{CG,j}$ ($1 \leq j \leq N$). In this drawing, the wirings existing outside the region shown therein and the regions connected to external wirings are omitted. The non-volatile semiconductor memory of this embodiment can store information of $2 \times M \times N$ bits in total. The operation of the non-volatile semiconductor memory is described below.

Information writing, erasing and reading methods with respect to the memory element $Tr_{m,n}$ located on the row m and the column n are now described, on the assumption that the subject memory element is of an n-type. First, information writing and erasing are described. The memory element of the first embodiment and the memory element of the second embodiment perform the same operation. Accordingly, the explanation herein only concerns a case where the memory element of the first embodiment is used. As mentioned in the description of the first embodiment, the memory element can have four different threshold voltages, with $V_{TH12}$ being the highest. The potential $V_{CG,j}$ ($j \neq n$) is set higher than $V_{TH12}$. With $V_{CG,j}$ ($j \neq n$) being higher than $V_{TH12}$, the memory elements $Tr_{i,j}$ ($1 \leq i \leq M$, $j \neq n$) are all put into a conduction state. The threshold voltages $V_{TH1}$ and $V_{TH2}$ are set between zero and $V_{DD}$. The potentials $V_{S,i}$ and $V_{D,i}$ ($i \neq m$) are values lower than the threshold voltage $V_{th}$ (zero, for example), and the potentials $V_{S,m}$ and $V_{D,m}$ are values higher than the threshold voltage $V_{th}$ ($V_{DD}$, for example). With this arrangement, the transistors $T_{S,i}$ and $T_{D,i}$ ($i \neq m$) are all put into a non-conduction state, while the transistors $T_{S,m}$ and $T_{D,m}$ are all put into a conduction state. Here, the potentials $V_S$ and $V_D$ are zero. In this situation, the source/drain regions of the memory elements $Tr_{i,j}$ ($i \neq m$, $1 \leq j \leq N$) enter a floating state, since the source/drain regions of those memory elements are not connected to external circuits. Meanwhile, since the source/drain regions of the memory elements $Tr_{m,j}$ ($1 \leq j \leq N$) are connected to external circuits, the potentials of those memory elements become all zero. If the potential $V_{CG,n}$ is made higher than $V_{W1}$ in this situation, charge injection is caused in the first charge accumulating layer of the memory element $Tr_{m,n}$. If the potential $V_{CG,n}$ is made higher than $V_{W2}$ in this situation, charge injection is caused in both the first and second charge accumulating layers of the memory element $Tr_{m,n}$. If the potential $V_{CG,n}$ is made lower than $V_{E1}$ in this situation, charges are emitted from the first charge accumulating layer of the memory element $Tr_{m,n}$. If the potential $V_{CG,n}$ is made lower than $V_{E2}$ in this situation, charges are emitted from both the first and second charge accumulating layers of the memory element $Tr_{m,n}$.

Accordingly, as in the first embodiment, the threshold voltage of the memory element $Tr_{m,n}$ can be controlled to be the four voltages $V_{TH0}$, $V_{TH1}$, $V_{TH2}$, and $V_{TH12}$. Although the potential $V_{CG,j}$ ($j \neq n$) is set higher than $V_{TH12}$, neither charge injection nor charge emission is not caused in the charge accumulating layers of the memory elements $Tr_{i,j}$ ($1 \leq i \leq M$, $j \neq n$), if the potential $V_{CG,j}$ is set lower than $V_{W1}$. Accordingly, the threshold voltage of each of the memory elements $Tr_{i,j}$ ($1 \leq i \leq M$, $j \neq n$) does not vary. Since the source/drain regions of the memory elements $Tr_{i,n}$ ($i \neq m$) are in a floating state, as described above, the channel regions of the memory elements $Tr_{i,n}$ ($i \neq m$) are also in a floating state. Accordingly, as the potential $V_{CG,n}$ is varied, the potentials of the channel regions of the memory elements $Tr_{i,n}$ ($i \neq m$) varies with the potential $V_{CG,n}$ due to the capacitive coupling with the control gate electrode via the interelectrode insulating films, the charge accumulating layers, and the tunnel gate insulating films. Because of this, the electric field intensity in the tunnel gate insulating films of each of the memory elements $Tr_{i,n}$ ($i \neq m$) does not become very high, and neither charge injection to the charge accumulating layers nor charge emission from the charge accumulating layers is not caused. Accordingly, the threshold voltage of each of the memory elements $Tr_{i,n}$ ($i \neq m$) does not vary. In this manner, only the threshold voltage of the memory element $Tr_{m,n}$ can be controlled, while the threshold voltages of the other memory elements $Tr_{i,j}$ remain unchanged. Thus, writing and erasing are performed.

Next, the reading method is described. Information reading from the memory element $Tr_{m,n}$ is performed as follows. The potential $V_{CG,j}$ ($j \neq n$) is set higher than $V_{TH12}$. With $V_{CG,j}$ ($j \neq n$) being higher than $V_{TH12}$, the memory elements $Tr_{i,j}$ ($1 \leq i \leq M$, $j \neq n$) are all put into a conduction state. The potential $V_S$ is zero, and the potential $V_D$ is $V_{DD}$, for example. The potentials $V_{S,i}$ and $V_{D,i}$ ($i \neq m$) are values lower than the threshold voltage $V_{th}$ (zero, for example), and the potentials $V_{S,m}$ and $V_{D,m}$ are $V_{DD}$, for example. With this arrangement, the transistors $Tr_{S,i}$ and $Tr_{D,i}$ ($i \neq m$) are all put into a non-conduction state, while the transistors $Tr_{S,m}$ and $Tr_{D,m}$ are all put into a conduction state. In this situation, the source/drain regions of the memory elements $Tr_{i,j}$ ($i \neq m$, $1 \leq j \leq N$) enter a floating state, since the source/drain regions of those memory elements are not connected to external circuits. Meanwhile, since the source/drain regions of the memory elements $Tr_{m,j}$ ($1 \leq j \leq N$) are connected to external circuits, the potentials of the source/drain regions of the memory elements $Tr_{m,j}$ ($1 \leq j \leq n$) and the potential of the portion of the source/drain regions of the memory element $Tr_{m,n}$ located on the left side in FIG. 25 are all zero, while the potentials of the source/drain regions of the memory elements $Tr_{m,j}$ ($n<j\leq N$) and the potential of the portion of the source/drain regions of the memory element $Tr_{m,n}$ located on the right side in FIG. 25 are all $V_{DD}$. When the potential $V_{CG,n}$ is made $V_{DD}$, the current according to the threshold voltage of the memory element $Tr_{m,n}$ flows from the terminal to which the potential $V_S$ is applied to the terminal to which the potential $V_D$ is applied. Accordingly, the information stored in the memory element $Tr_{m,n}$ can be read out by detecting the current value.

As described above, a terminal for applying a potential to each column, a terminal for applying a potential to each row, and a terminal for controlling the select transistors of each row are provided, so that information can be written into each non-volatile semiconductor memory element independently of the other memory elements. Thus, information of more than one bit can be stored in each one element with the same wirings as those of conventional non-volatile semiconductor memory elements.

In this manner, 2-bit information can be stored in each memory element independently of the other memory element, and information of 2×M×N can be stored in total.

As described above, a semiconductor integrated circuit device that includes high-performance non-volatile semiconductor memory elements that can lower the power supply voltage and do not complicate the wirings can be obtained according to this embodiment.

The various changes and modifications that can be made to the foregoing embodiments as described above may also be made to this embodiment, to achieve the same effects as the above described effects.

Fourth Embodiment

Figure 26:
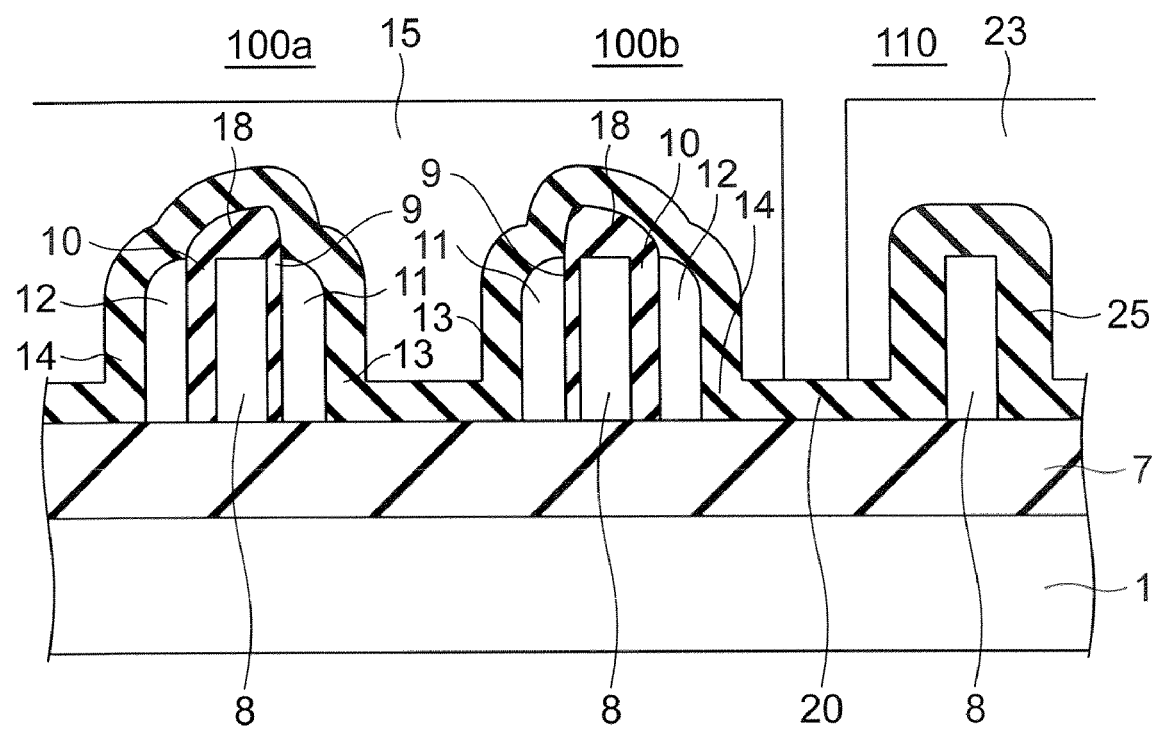
FIG. 26 is a cross-sectional view of a semiconductor integrated circuit device according to a fourth embodiment of the present invention.

Referring now to FIG. 26, a semiconductor integrated circuit device according to a fourth embodiment of the present invention is described. FIG. 26 is a cross-sectional view of the semiconductor integrated circuit device of this embodiment. The semiconductor integrated circuit device of this embodiment is characterized in including the non-volatile semiconductor memory element of either the first embodiment or the second embodiment and a field effect transistor.

The semiconductor integrated circuit device of this embodiment includes non-volatile semiconductor memory elements 100a and 100b and a field effect transistor 110 that are provided on an embedded insulating film 7 formed on a supporting semiconductor substrate 1. In each of the non-volatile semiconductor memory elements 100a and 100b, a plate-like semiconductor region 8 having a channel region is formed, and first and second charge accumulating layers 11 and 12 sandwich the plate-like semiconductor region 8 via first and second tunnel gate insulating films 9 and 10. First and second interelectrode insulating films 13 and 14 are further formed on the first and second charge accumulating layers 11 and 12, and a control gate electrode 15 is provided to cover the first and second interelectrode insulating films 13 and 14. Each plate-like semiconductor region 8 forming the channel region extends forward and backward with respect to the control gate electrode 15, and source/drain regions (not shown) are formed in front of and behind the control gate electrode 15, thereby sandwiching the control gate electrode 15.

Meanwhile, in the field effect transistor 110, a plate-like semiconductor region 8 having a channel region is formed, and a gate insulating film 25 is formed over the plate-like semiconductor region 8. A gate electrode 23 is provided so as to cover the gate insulating film 25. The plate-like semiconductor region 8 forming a channel region extends forward and backward with respect to the gate electrode 23. Source/drain regions (not shown) are also formed in front of and behind the gate electrode 23, thereby sandwiching the gate electrode 23.

Figure 27:
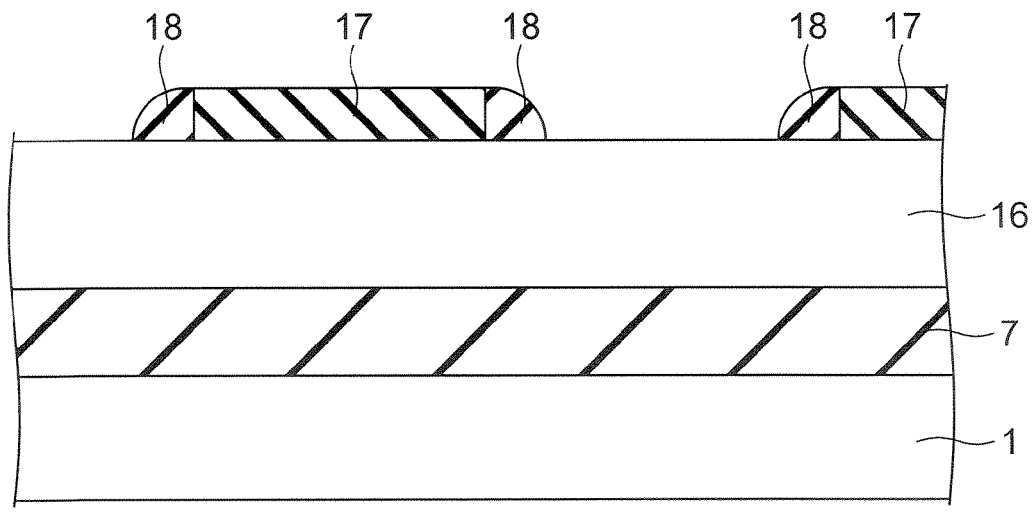
FIG. 27 is a cross-sectional view showing a step for manufacturing the memory element according to the fourth embodiment.
Figure 32:
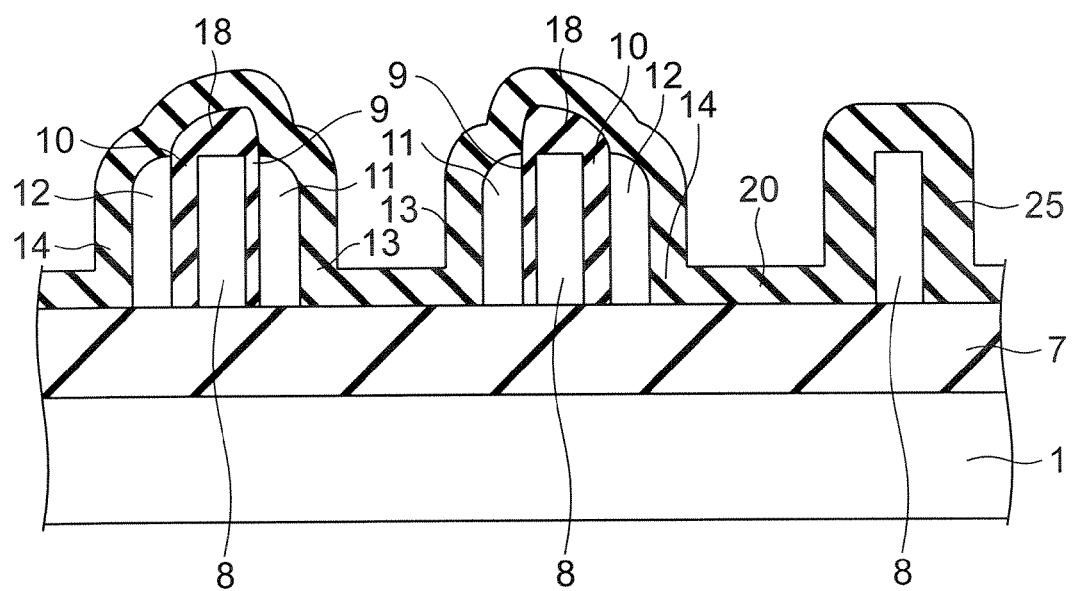
FIG. 32 is a cross-sectional view showing a step for manufacturing the memory element according to the fourth embodiment.

Referring now to FIGS. 27 and 32, a method of manufacturing the semiconductor integrated circuit device of this embodiment is described.

As shown in FIG. 27, boron (B) ions, for example, are first implanted to a semiconductor layer 16 of the SOI substrate with a dose amount of $1\times10^{12}$ cm$^{-2}$ at an accelerating voltage of 30 keV, for example, followed by a 30-second heat treatment at 1050° C. Silicon nitride is deposited with a thickness of 30 nm on the semiconductor layer 16 by the CVD method, for example. The deposited silicon nitride is then patterned to form a silicon nitride film 17. A 30-nm thick silicon oxide film is deposited on the entire surface of the semiconductor substrate, including the silicon nitride film 17, by the CVD method or the like. RIE is then performed to form a sidewall 18 made of silicon oxide.

Figure 28:
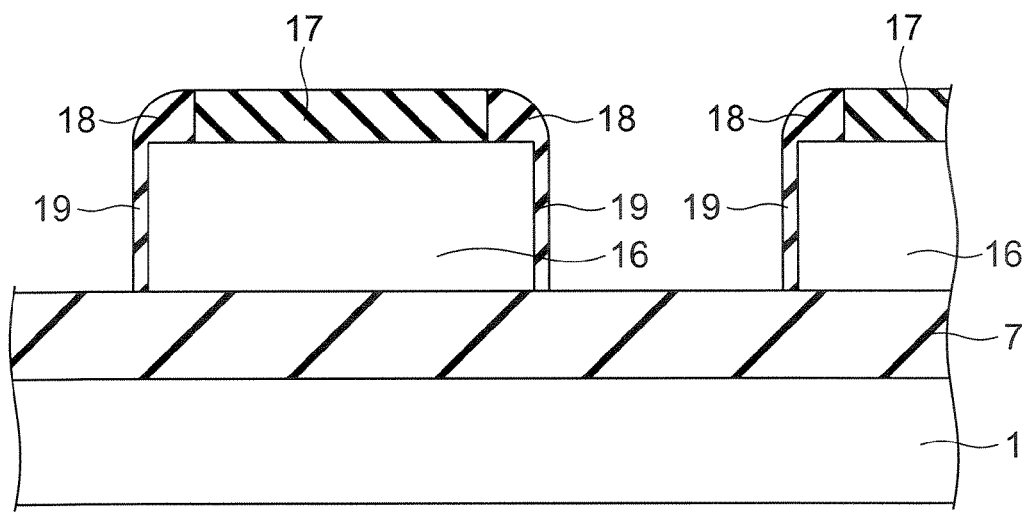
FIG. 28 is a cross-sectional view showing a step for manufacturing the memory element according to the fourth embodiment.

The semiconductor layer 16 is patterned by RIE or the like, as shown in FIG. 28. The semiconductor layer 16 is then oxidized through thermal oxidation or the like, so that a silicon oxide film 19 is formed on either side face of the semiconductor layer 16.

Figure 29:
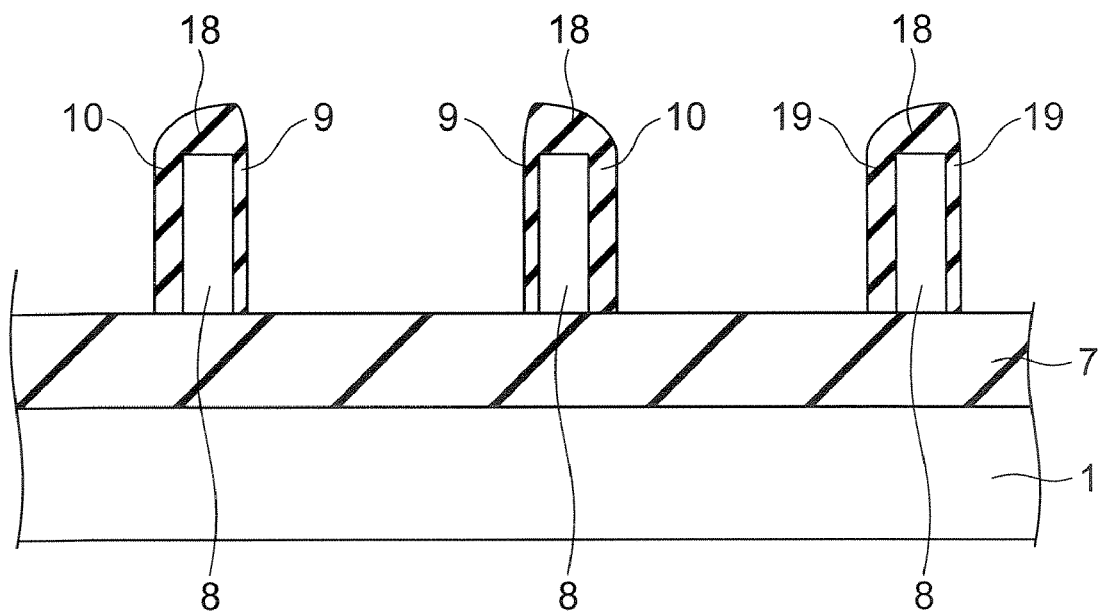
FIG. 29 is a cross-sectional view showing a step for manufacturing the memory element according to the fourth embodiment.

As shown in FIG. 29, the silicon nitride film 17 is removed through a thermal phosphoric acid treatment or the like. The semiconductor layer 16 is then patterned by RIE or the like, so as to form the plate-like semiconductor region 8 having the channel region. The plate-like semiconductor region 8 is then oxidized through thermal oxidation or the like. In this process, the side faces of the plate-like semiconductor region 8, on which the silicon oxide film 19 is formed in the procedure shown in FIG. 28, are further oxidized, so that a silicon oxide film thicker than the silicon oxide film 9 on the opposite side of each side face is formed. In this manner, silicon oxide films having different thicknesses from each other are formed on either side face of the plate-like semiconductor region 8, and become the first and second tunnel gate insulating films 9 and 10.

Figure 30:
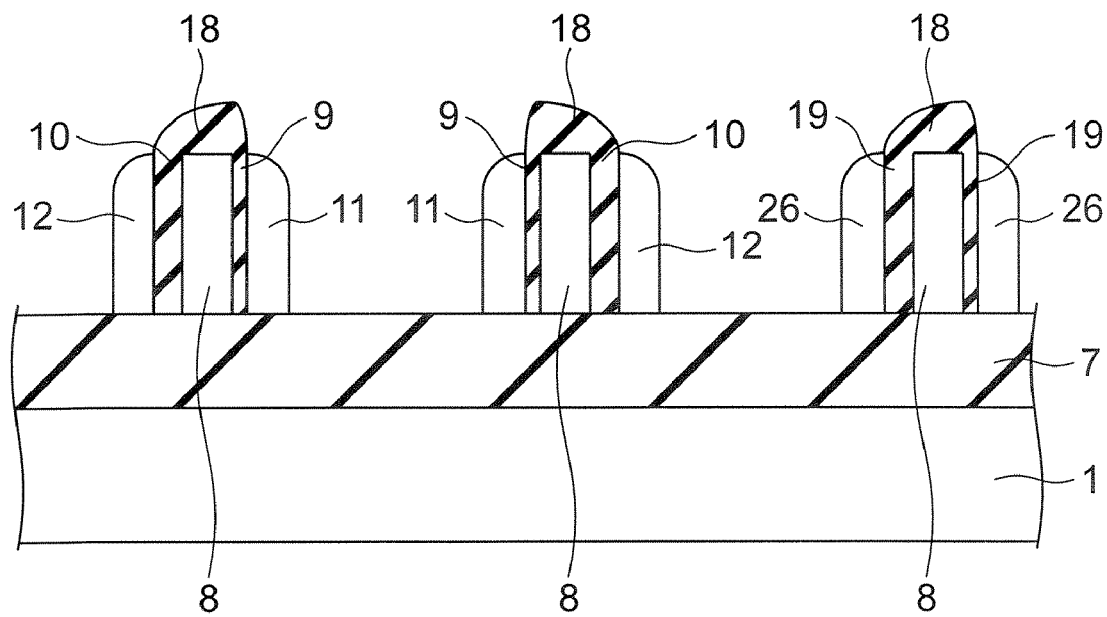
FIG. 30 is a cross-sectional view showing a step for manufacturing the memory element according to the fourth embodiment.

As shown in FIG. 30, a 30-nm thick polycrystalline silicon film is formed on the entire surface of the semiconductor substrate, including the plate-like semiconductor layer 8 and the first and second tunnel gate insulating films 9 and 10, by the CVD method or the like. Anisotropic etching such as RIE is then performed on the polycrystalline silicon film, so as to form the first and second charge accumulating layers 11 and 12 of each non-volatile semiconductor memory element. At this point, sidewalls 26 made of polycrystalline silicon are formed on the field effect transistor 110.

Figure 31:
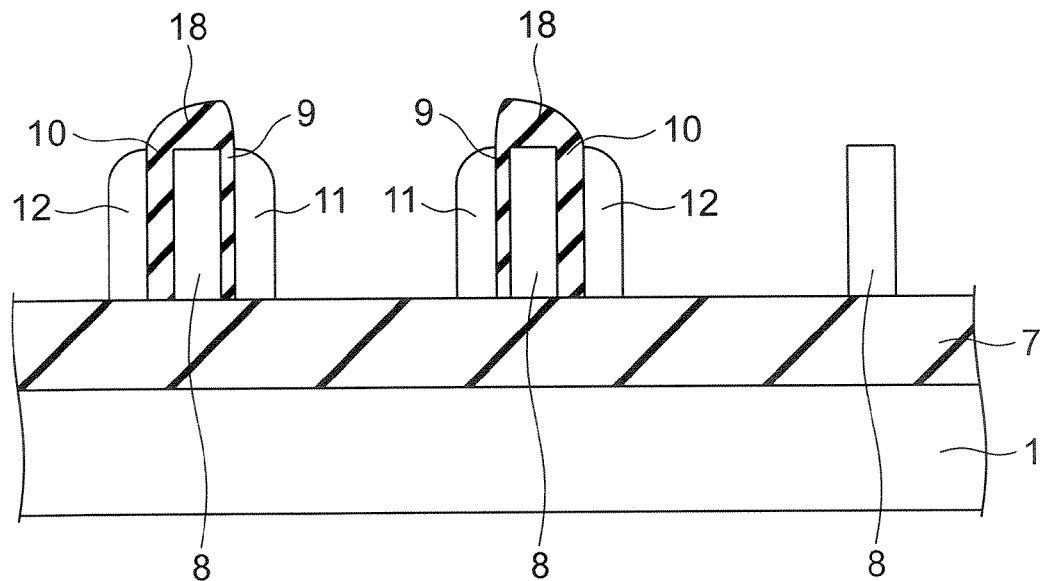
FIG. 31 is a cross-sectional view showing a step for manufacturing the memory element according to the fourth embodiment.

As shown in FIG. 31, the polycrystalline silicon sidewalls 26, the silicon oxide film 19, and the sidewall 18 made of silicon oxide are removed from the field effect transistor 110. Partial and selective removal can be performed by lithography or the like. At this point, the sidewall 18 made of silicon oxide may not be removed, and remain as it is.

As shown in FIG. 32, a 30-nm thick hafnium oxide film 20 is formed on the entire surface of the semiconductor substrate, including the plate-like semiconductor layer 8, the first and second tunnel gate insulating films 9 and 10, and the first and second charge accumulating layers 11 and 12, by the CVD method or the like, so as to form the first and second interelectrode insulating films 13 and 14 and the gate insulating film 25 of the field effect transistor 110.

The same procedure as the procedure of the first embodiment illustrated in FIG. 14 is then carried out thereafter, so as to complete the semiconductor integrated circuit device of this embodiment.

In this embodiment, the plate-like semiconductor regions of the field effect transistor 110 and the non-volatile semiconductor memory elements 100a and 100b are formed in the same procedure. However, those plate-like semiconductor regions may be formed in different procedures. Alternatively, while the plate-like semiconductor region of each of the non-volatile semiconductor memory elements is formed with the silicon oxide sidewall serving as a mask, the plate-like semiconductor region of the field effect transistor may be formed with a mask produced by processing the silicon nitride film 17. The use of such different masks has the advantage that each thickness can be optimized. However, this embodiment has the advantage that the manufacturing process is simplified by forming all the plate-like semiconductor regions in the same one procedure.

Although not clearly mentioned in the description of this embodiment, it is possible to process the charge accumulating layers and the first and second tunnel gate insulating films of the non-volatile semiconductor memory elements during the procedure of removing the sidewall 26 made of polycrystalline silicon and the silicon oxide film 19 of the field effect transistor. In this manner, the charge accumulating layers are processed in a different procedure from the control gate electrode of each of the non-volatile semiconductor memory elements. Accordingly, the coupling ratio can be advantageously increased as in the modification of the first embodiment illustrated in FIGS. 15 and 16.

Although the gate insulating film of the field effect transistor is formed at the same time as the interelectrode insulating films of the non-volatile semiconductor memory elements, those insulating films may be formed in different procedures. If those insulating films are formed in different procedures, different materials may be employed, or those insulating films may have different thicknesses, so as to advantageously optimize each of the insulating films. However, this embodiment has the advantage that the manufacturing process is simplified by forming those insulating films in the same one procedure.

In this embodiment, the non-volatile semiconductor memory elements according to the first embodiment are employed. However, the same effects can be achieved in a case where non-volatile semiconductor memory elements according to the second embodiment are employed.

In the semiconductor integrated circuit device of this embodiment, a logic circuit that includes a Fin field effect transistor 110 as well as the above described non-volatile semiconductor memory elements is formed. If the principal direction of the current flowing through the channel is in parallel with the surface of the semiconductor substrate and the charge accumulating layers are disposed to sandwich the semiconductor region as the channel at both sides in a non-volatile semiconductor memory element, the structure of the nonvolatile semiconductor memory element is similar to the structure of a Fin field effect transistor. Accordingly, if the field effect transistor 110 is formed with a Fin field effect transistor, the procedures for manufacturing the semiconductor integrated circuit device can be simplified.

In this manner, a semiconductor integrated circuit device including both a memory device and a logic circuit can be obtained.

As described above, a semiconductor integrated circuit device that includes high-performance non-volatile semiconductor memory elements that can lower the power supply voltage and do not complicate the wirings can be obtained according to this embodiment.

The various changes and modifications that can be made to the foregoing embodiments as described above may also be made to this embodiment, to achieve the same effects as the above described effects.

Fifth Embodiment

Figure 33:
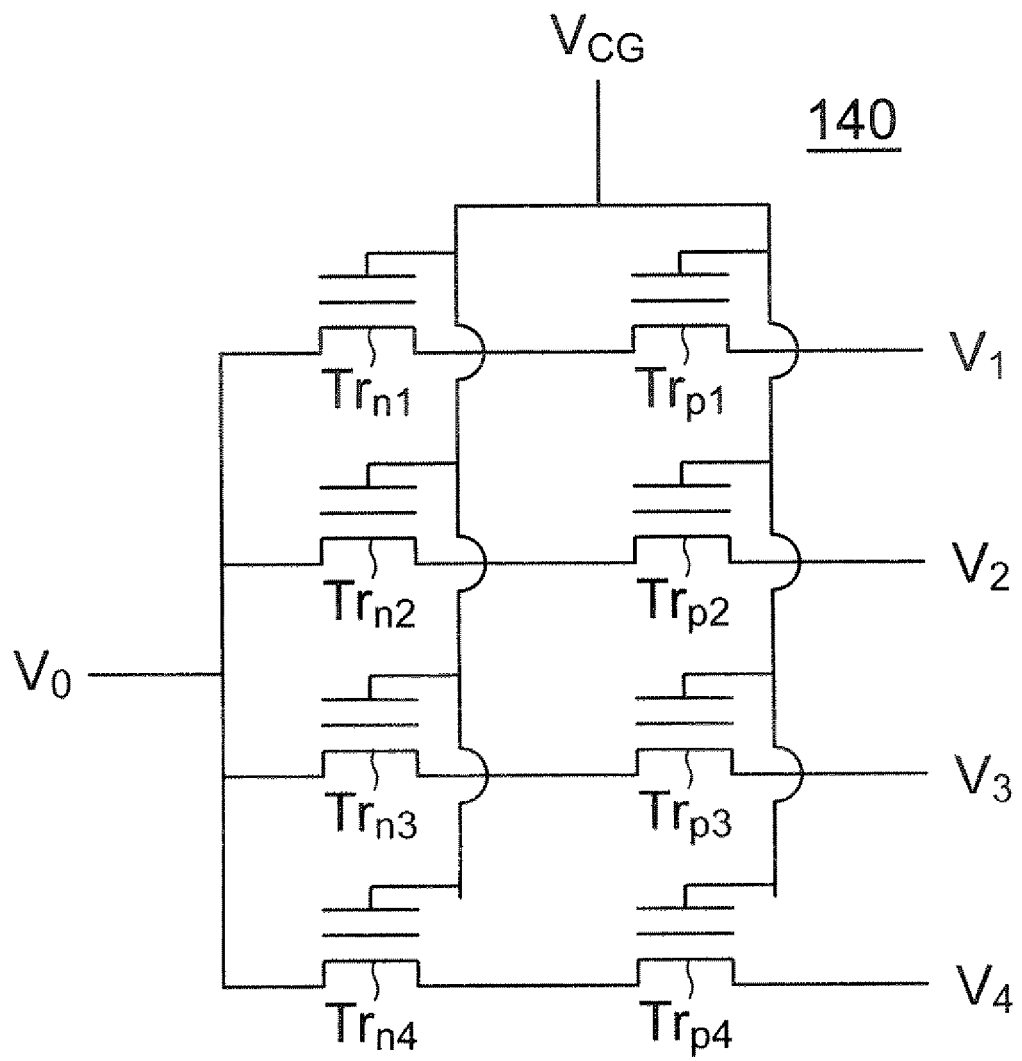
FIG. 33 is a circuit diagram of a semiconductor integrated circuit device according to a fifth embodiment of the present invention.

Referring now to FIG. 33, a semiconductor integrated circuit device according to a fifth embodiment of the present invention is described. FIG. 33 is a circuit diagram of the semiconductor integrated circuit device 140 of this embodiment. The semiconductor integrated circuit device 140 of this embodiment includes non-volatile semiconductor memory elements of either the first embodiment or the second embodiment as several pairs of series-connected non-volatile semiconductor memory elements of opposite conductivity types.

In this embodiment, four pairs of series-connected non-volatile semiconductor memory elements of the first embodiment are employed. However, the same effects can be achieved in a case where non-volatile semiconductor memory elements of the second embodiment are employed. Each of the four series connections consists of an n-type non-volatile semiconductor memory element $Tr_{ni}$ and a p-type non-volatile semiconductor memory element $Tr_{pi}$ ($1 \leq i \leq 4$). Either one of the source/drain terminals of each series connection is connected to a common terminal (the terminal denoted by $V_O$ in the drawing), and the other one is set at a potential $V_i$ ($1 \leq i \leq 4$). The control gate electrodes of the non-volatile semiconductor memory elements are connected to a common terminal at a potential $V_{CG}$.

The semiconductor integrated circuit device 140 of this embodiment includes connection circuits in which n-type memory elements and p-type memory elements of the first embodiment are connected in series as non-volatile semiconductor memory elements. When a high positive electric potential is applied to the control gate electrode of a memory element, negative charges are accumulated in the charge accumulating layers or accumulated positive charges are emitted from the charge accumulating layers. Accordingly, in either an n-type memory element or a p-type memory element, the threshold voltage changes to a positive value if the charges stored in the charge accumulating layers vary. When a high negative potential is applied to the control gate electrode, positive charges are accumulated in the charge accumulating layers or negative charges are emitted from the charge accumulating layers. Accordingly, in either an n-type memory element or a p-type memory element, the threshold voltage changes to a negative value if the charges accumulated in the charge accumulating layers change.

In a case where a semiconductor integrated circuit device of this embodiment includes connection circuits in which n-type memory elements and p-type memory elements of the second embodiment are connected in series as non-volatile semiconductor memory elements, when a high positive potential is applied to the gate electrode (hereinafter referred to also as the control gate electrode) of a memory element, the polarization directed from the channel region to the gate electrode is reversed. Accordingly, in either an n-type element or a p-type element, the threshold voltage changes to a negative value when the polarization of the ferroelectric insulating films changes. When a high negative potential is applied to the control gate electrode, the polarization directed from the gate electrode to the channel region is reversed. Accordingly, in either an n-type element or a p-type element, the threshold voltage changes to a positive value when the polarization of the ferroelectric insulating films changes.

Figure 34:
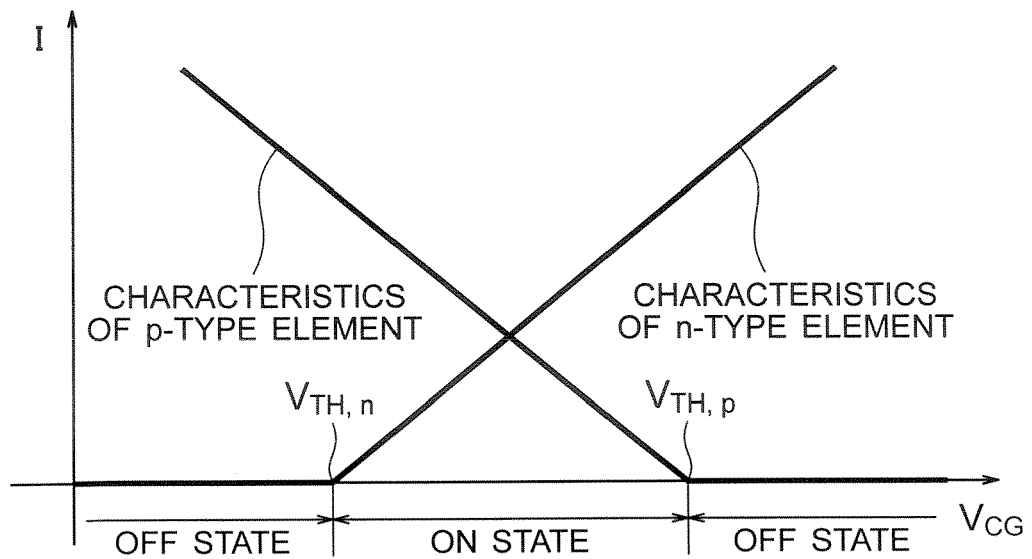
FIG. 34 is a diagram for explaining an operation to be performed in a case where non-volatile semiconductor memory elements of the first or second embodiment are connected in series.

In this embodiment, the threshold voltage of each p-type element is set higher than the threshold voltage of each n-type element in a case where charges do not exist in the charge accumulating layers (or where the polarization of the ferroelectric insulating films is directed from the gate electrode to the channel region). Each n-type element is connected to a p-type element in series, and the control gate electrodes of the n-type element and the p-type element are connected to each other In this situation, the channel current flows only when both the n-type element and the p-type element are in an ON state. Accordingly, current flows through the channel only when the control gate voltage lies between the threshold voltages of the two elements, or the series connection circuit of the n-type element and the p-type element enters an ON state. This situation is illustrated in FIG. 34. In FIG. 34, $V_{CG}$ represents the control gate voltage, I represents the current flowing through the channel, and $V_{TH,n}$ and $V_{TH,p}$ represent the threshold voltages of the n-type element and the p-type element. As described above, a voltage is applied to the connected control gate electrodes of both elements, so as to change the threshold voltages of both elements. Accordingly, the control gate voltage region in which the entire series connection of both elements enters an ON state can be controlled. In this embodiment, memory elements of the second embodiment may be employed in place of the memory elements of the first embodiment. In such a case, if the polarization of the ferroelectric insulating films is directed from the gate electrode to the channel region, the threshold voltage of each n-type element is set higher than the threshold voltage of each p-type element.

The amount of charges stored in the charge accumulating layers (or the polarization of the ferroelectric insulating films) is controlled, so as to select a series connection that enters an ON state at a particular control gate voltage. Also, such situations can be recorded. In this embodiment, the same operation is also performed in the case where memory elements of the second embodiment are employed in place of the memory elements of the first embodiment.

As illustrated in FIG. 34, each series connection is in an ON state only when the control gate voltage is in a predetermined range, but is in an OFF state when the control gate voltage is out of the predetermined range. In a case where the threshold voltage to be obtained when charges do not exist in the charge accumulating layers is adjusted so as to make that with $V_{CG}$ of each non-volatile semiconductor memory element of zero, the series connection of $Tr_{n1}$ and $Tr_{p1}$ is designed to be in an ON state only when charges do not exist in either of the charge accumulating layers, the series connection of $Tr_{n2}$ and $Tr_{p2}$ is designed to be in an ON state only when charges exist only in the first charge accumulating layer, the series connection of $Tr_{n3}$ and $Tr_{p3}$ is designed to be in an ON state only when charges exist only in the second charge accumulating layer, and the series connection of $Tr_{n4}$ and $Tr_{p4}$ is designed to be in an ON state only when charges exist in both of the charge accumulating layers. The threshold voltage adjustment can be realized by forming each control gate electrode with a semiconductor and adjusting its impurity concentration.

As mentioned in the description of the first embodiment with reference to FIGS. 4 and 5, the potential of each control gate electrode is controlled, so that the existence of charges in the charge accumulating layers of each non-volatile semiconductor memory element can be controlled. Where the existence of charges in the charge accumulating layers is controlled so as to make that with $V_{CG}$ of zero, the potential $V_0$ is to be $V_1$ when charges do not exist in either of the charge accumulating layers, the potential $V_0$ is to be $V_2$ when charges exist only in the first charge accumulating layer, the potential $V_0$ is to be $V_3$ when charges exist only in the second charge accumulating layer, and the potential $V_0$ is to be $V_4$ when charges exist in both of the first and second charge accumulating layers.

In this manner, a circuit that can switch the potential of a certain terminal and record its situation is formed.

As described above, a semiconductor integrated circuit device that includes high-performance non-volatile semiconductor memory elements that can lower the power supply voltage and do not complicate the wirings can be obtained according to this embodiment.

The various changes and modifications that can be made to the foregoing embodiments as described above may also be made to this embodiment, to achieve the same effects as the above described effects.

Figure 35:
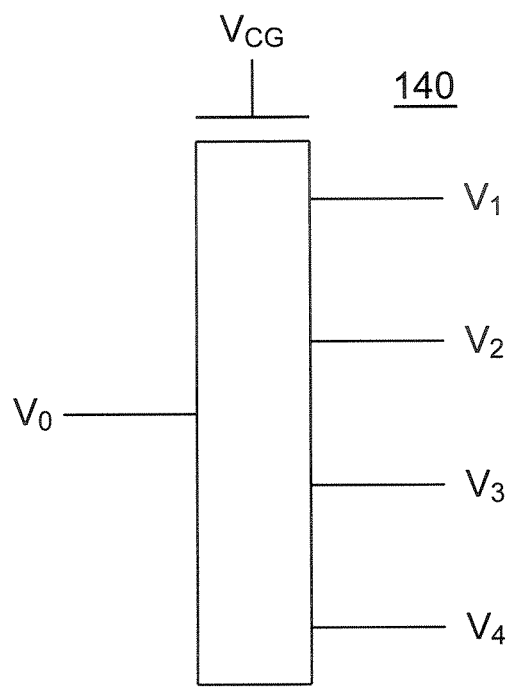
FIG. 35 is a diagram for explaining a schematic view of the semiconductor integrated circuit device according to the fifth embodiment.

For the embodiment to be described next, the circuit 140 of the fifth embodiment illustrated in FIG. 33 is schematically shown in FIG. 35. The terminals shown in FIG. 35 are equivalent to those shown in FIG. 33.

Sixth Embodiment

Figure 36:
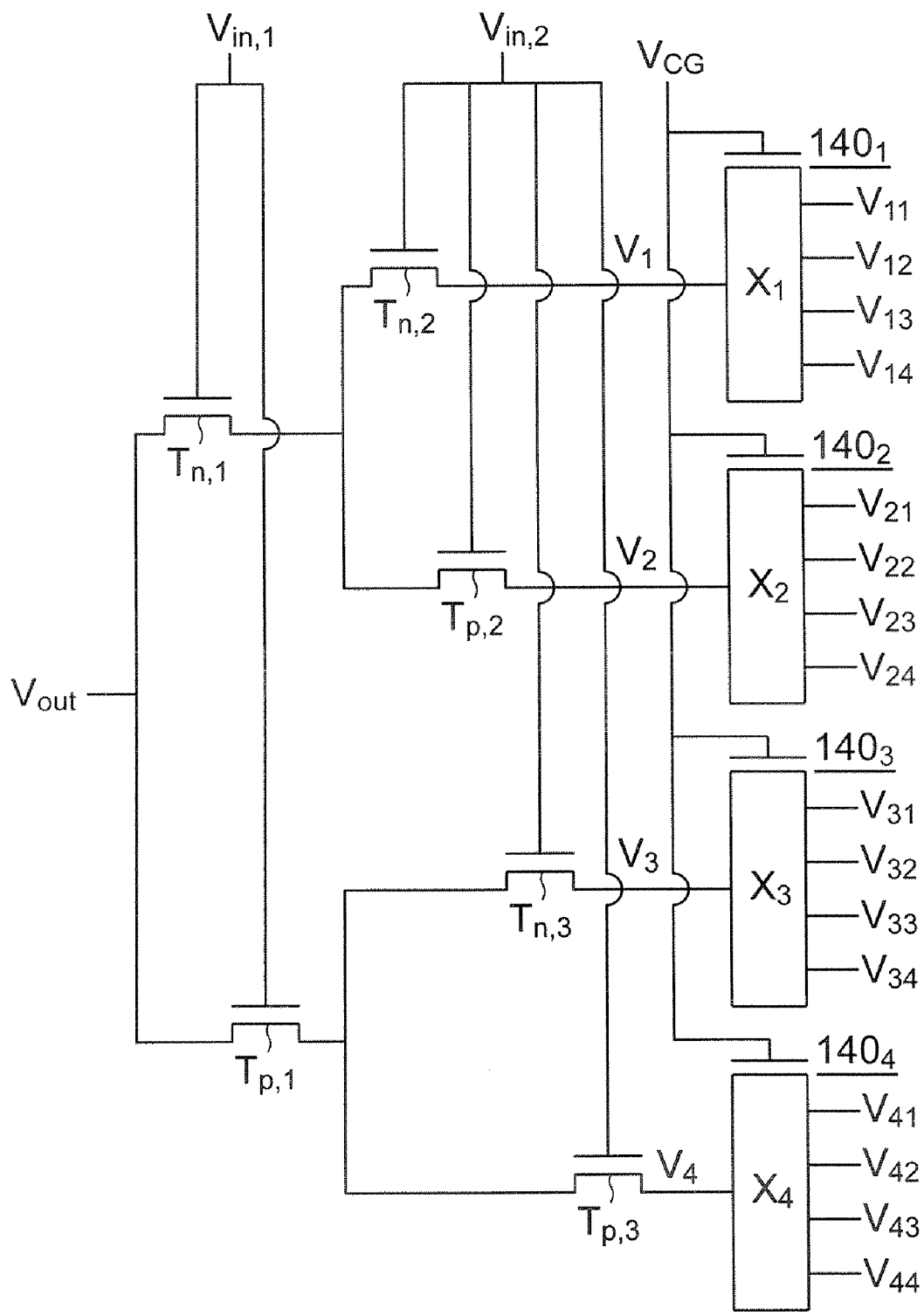
FIG. 36 is a circuit diagram of a semiconductor integrated circuit device according to a sixth embodiment of the present invention.

Referring now to FIG. 36, a semiconductor integrated circuit device according to a sixth embodiment of the present invention is described. FIG. 36 is a circuit diagram of the semiconductor integrated circuit device of this embodiment. The semiconductor integrated circuit device of this embodiment includes semiconductor integrated circuit devices $140_1$, $140_2$, $140_3$, and $140_4$, and field effect transistors. In FIG. 36, $T_{n,i}$ ($1 \leq i \leq 3$) represent n-type field effect transistors, $T_{p,i}$ ($1 \leq i \leq 3$) represent p-type field effect transistors, the terminals denoted by $V_{in,1}$ and $V_{in,2}$ are input terminals, and the terminal denoted by $V_{out}$ is the output terminal. The semiconductor integrated circuit devices $140_i$ ($1 \leq i \leq 4$) of the fifth embodiment have their control gate electrodes connected to one another, and are connected to a common terminal denoted by $V_{CG}$. Here, an example case where each of the semiconductor integrated circuit devices $140_i$ ($1 \leq i \leq 4$) includes non-volatile semiconductor memory elements according to the first embodiment is described. However, the same operation can be performed with non-volatile semiconductor memory elements according to the second embodiment. With respect to each i ($1 \leq i \leq 4$), the potential $V_i$ is to be $V_{i1}$ when charges do not exist in either of the charge accumulating layers, the potential $V_i$ is to be $V_{i2}$ when charges exist only in the first charge accumulating layer, the potential $V_i$ is to be $V_{i3}$ when charges exist only in the second charge accumulating layer, and the potential $V_i$ is to be $V_{i4}$ when charges exist in both of the charge accumulating layers.

The operation of this circuit is described in the following. First, the potential of the output terminal $V_{out}$ is described.

The potential $V_{out}$ is to be $V_1$, where $V_{in,1}=V_{DD}$ and $V_{in,2}=V_{DD}$, the potential $V_{out}$ is to be $V_2$, where $V_{in,1}=V_{DD}$ and $V_{in,2}=0$, the potential $V_{out}$ is to be $V_3$, where $V_{in,1}=0$ and $V_{in,2}=V_{DD}$, and the potential $V_{out}$ is to be $V_4$, where $V_{in,1}=0$ and $V_{in,2}=0$. Here, a case where $V_{ij}$ ($1 \leq i, j \leq 4$) is adjusted as follows is considered.

$V_{11}=V_{DD}$, $V_{21}=0$, $V_{31}=0$, $V_{41}=0$, $V_{12}=0$, $V_{22}=V_{DD}$, $V_{32}=V_{DD}$, $V_{42}=V_{DD}$, $V_{13}=V_{DD}$, $V_{23}=V_{DD}$, $V_{33}=V_{DD}$, $V_{43}=0$, $V_{14}=0$, $V_{24}=0$, $V_{34}=0$, $V_{44}=V_{DD}$

As $V_{CG}$ is controlled, the charges in the charge accumulating layers of each semiconductor integrated circuit device $140_i$ ($1 \leq i \leq 4$) are emitted, and $V_{CG}$ is then made zero. Since the potential $V_i$ is $V_{i1}$ ($1 \leq i \leq 4$), the circuit shown in FIG. 36 becomes an AND circuit, with $V_{in,1}$ and $V_{in,2}$ being the input terminals and $V_{out}$ being the output terminal. Likewise, being a circuit having $V_{in,1}$ and $V_{in,2}$ as the input terminals and $V_{out}$ as the output terminal, the circuit shown in FIG. 36 is to be:

an AND circuit when charges do not exist in either of the charge accumulating layers;

a NAND circuit when charges exist only in the first charge accumulating layer;

an OR circuit when charges exist only in the second charge accumulating layer; and a NOR circuit when charges exist both of the charge accumulating layers.

In this manner, a semiconductor integrated circuit device that can be several types of logic circuit is obtained.

Although a two-input logic circuit is described as this embodiment, the same operation can be performed with a logic circuit with three or more inputs.

As described above, a semiconductor integrated circuit device that includes high-performance non-volatile semiconductor memory elements that can lower the power supply voltage and do not complicate the wirings can be obtained according to this embodiment.

The various changes and modifications that can be made to the foregoing embodiments as described above may also be made to this embodiment, to achieve the same effects as the above described effects.

Seventh Embodiment

Figure 37:
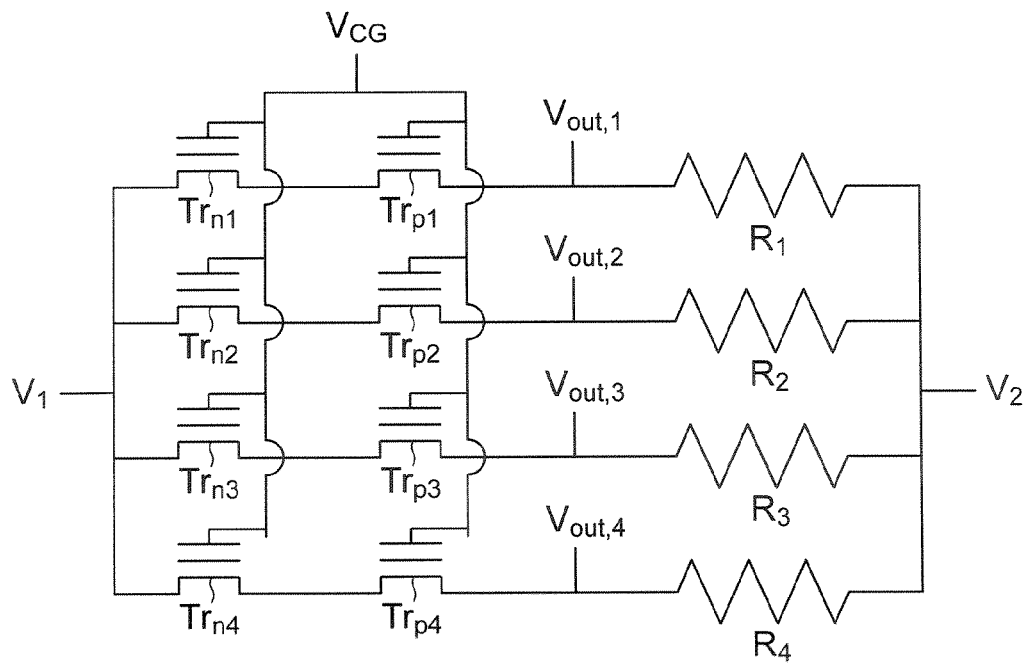
FIG. 37 is a circuit diagram of a semiconductor integrated circuit device according to a seventh embodiment of the present invention.

Referring now to FIG. 37, a semiconductor integrated circuit device according to a seventh embodiment of the present invention is described. FIG. 37 is a circuit diagram of the semiconductor integrated circuit device of this embodiment. The semiconductor integrated circuit device of this embodiment includes non-volatile semiconductor memory elements of either the first embodiment or the second embodiment as several series connection circuits of the memory elements of opposite conductivity types, and resistors.

In this embodiment, four series connection circuits of non-volatile semiconductor memory elements of the first embodiment are employed. However, the same operation can be performed in a case where non-volatile semiconductor memory elements of the second embodiment are employed.

Each of the four series connection circuits consists of an n-type non-volatile semiconductor memory element $Tr_{ni}$ of the first embodiment and a p-type non-volatile semiconductor memory element $Tr_{pi}$ of the first embodiment ($1 \leq i \leq 4$). Either one of the source/drain terminals of each series connection circuit is connected to a common terminal (the terminal denoted by $V_1$ in the drawing), and the other one is connected to another common terminal (the terminal denoted by $V_2$ in the drawing) via each resistor $R_i$ ($1 \leq i \leq 4$). Output terminals $V_{out\ i}$ ($1 \leq i \leq 4$) are interposed between the series connection circuits of the non-volatile semiconductor memory elements and the resistors, respectively. The control gate electrodes are connected to a common terminal at a potential $V_{CG}$.

As mentioned in the description of the fifth embodiment with reference to FIG. 34, each series connection circuit is in an ON state only when the control gate voltage is in a predetermined range, but is in an OFF state when the control gate voltage is out of the predetermined range. In a case where the threshold voltage to be obtained when charges do not exist in the charge accumulating layers is adjusted so as to make that with $V_{CG}$ of each non-volatile semiconductor memory element of zero, the series connection of $Tr_{n1}$ and $Tr_{p1}$ is designed to be in an ON state only when charges do not exist in either of the charge accumulating layers, the series connection of $Tr_{n2}$ and $Tr_{p2}$ is designed to be in an ON state only when charges exist only in the first charge accumulating layer, the series connection of $Tr_{n3}$ and $Tr_{p3}$ is designed to be in an ON state only when charges exist only in the second charge accumulating layer, and the series connection of $Tr_{n4}$ and $Tr_{p4}$ is designed to be in an ON state only when charges exist in both of the charge accumulating layers. The resistance of each resistor $R_i$ ($1 \leq i \leq 4$) is substantially higher than the resistance of each corresponding series connection circuit of $Tr_{ni}$ and $Tr_{pi}$ in an ON state, and is substantially lower than the resistance of each corresponding series connection circuit of $Tr_{ni}$ and $Tr_{pi}$ in an OFF state. This can be achieved by setting the resistance of each resistor $R_i$ at the value in the neighborhood of the square root of the product of the resistance in an ON state and the resistance in an OFF state, for example.

The operation of this circuit is described in the following.

In a case where charges do not exist in any of the charge accumulating layers and $V_{CG}$ is zero, the series connection circuit of $Tr_{n1}$ and $Tr_{p1}$ is in an ON state, and its resistance is substantially lower than $R_1$. Accordingly, the value of $V_{out,1}$ becomes equal to $V_1$. Meanwhile, the other series connection circuits of $Tr_{ni}$ and $Tr_{pi}$ ($2 \leq i \leq 4$) are in an OFF state, and the resistance of each of the other series connection circuits is substantially higher than $R_i$ ($2 \leq i \leq 4$). Accordingly, the value of $V_{out,i}$ ($2 \leq i \leq 4$) becomes equal to $V_2$. Likewise, where the existence of charges in each charge accumulating layer is controlled by adjusting the potential of $V_{CG}$, and $V_{CG}$ is then made zero, when charges do not exist in either of the charge accumulating layers, only $V_{out,1}$ is equal to $V_1$, and the other $V_{out,i}$ ($i \neq 1$) are equal to $V_2$, when charges exist only in the first charge accumulating layer, only $V_{out,2}$ is equal to $V_1$, and the other $V_{out,i}$ ($i \neq 2$) are equal to $V_2$, when charges exist only in the second charge accumulating layer, only $V_{out,3}$ is equal to $V_1$, and the other $V_{out,i}$ ($i \neq 3$) are equal to $V_2$, and when charges exist in both of the charge accumulating layers, only $V_{out,4}$ is equal to $V_1$, and the other $V_{out,i}$ ($i \neq 4$) are equal to $V_2$.

In this manner, a circuit that can output a predetermined potential only to a predetermined one of the output terminals and another predetermined potential to the other terminals, and can also record such situations, can be achieved.

As described above, a semiconductor integrated circuit device that includes high-performance non-volatile semiconductor memory elements that can lower the power supply voltage and do not complicate the wirings can be obtained according to this embodiment.

The various changes and modifications that can be made to the foregoing embodiments as described above may also be made to this embodiment, to achieve the same effects as the above described effects.

Eighth Embodiment

Figure 38:
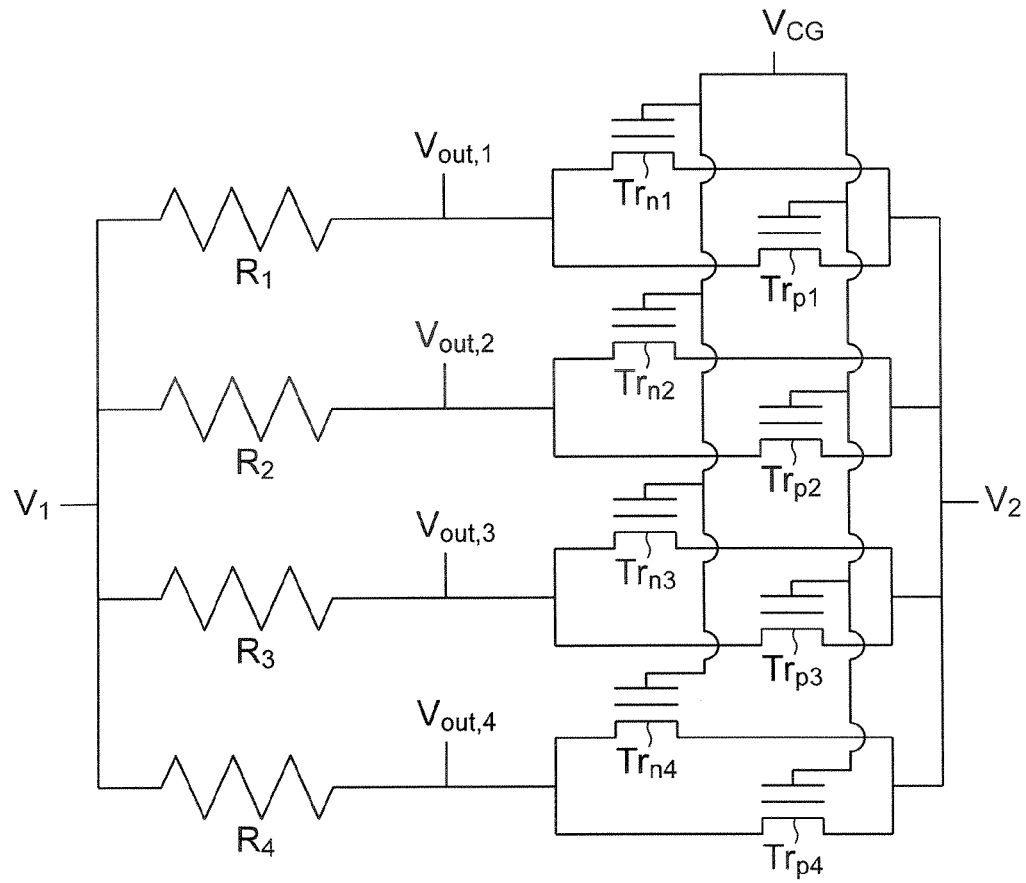
FIG. 38 is a circuit diagram of a semiconductor integrated circuit device according to an eighth embodiment of the present invention.

Referring now to FIG. 38, a semiconductor integrated circuit device according to an eighth embodiment of the present invention is described. FIG. 38 is a circuit diagram of the semiconductor integrated circuit device of this embodiment. The semiconductor integrated circuit device of this embodiment includes non-volatile semiconductor memory elements of either the first embodiment or the second embodiment as several parallel connection circuits of the memory elements of opposite conductivity types, and resistors.

In this embodiment, four parallel connection circuits of non-volatile semiconductor memory elements of the first embodiment are employed. However, the same operation can be performed in a case where non-volatile semiconductor memory elements of the second embodiment are employed. Each of the four parallel connection circuits consists of an n-type non-volatile semiconductor memory element $Tr_{ni}$ of the first embodiment and a p-type non-volatile semiconductor memory element $Tr_{pi}$ of the first embodiment ($1 \leq i \leq 4$). Either one of the source/drain terminals of each parallel connection circuit is connected to a common terminal (the terminal denoted by $V_2$ in the drawing), and the other one is connected to another common terminal (the terminal denoted by $V_1$ in the drawing) via each resistor $R_i$ ($1 \leq i \leq 4$). Output terminals $V_{out,i}$ ($1 \leq i \leq 4$) are interposed between the parallel connection circuits of the non-volatile semiconductor memory elements and the resistors, respectively. The control gate electrodes are connected to a common terminal at a potential $V_{CG}$.

Figure 39:
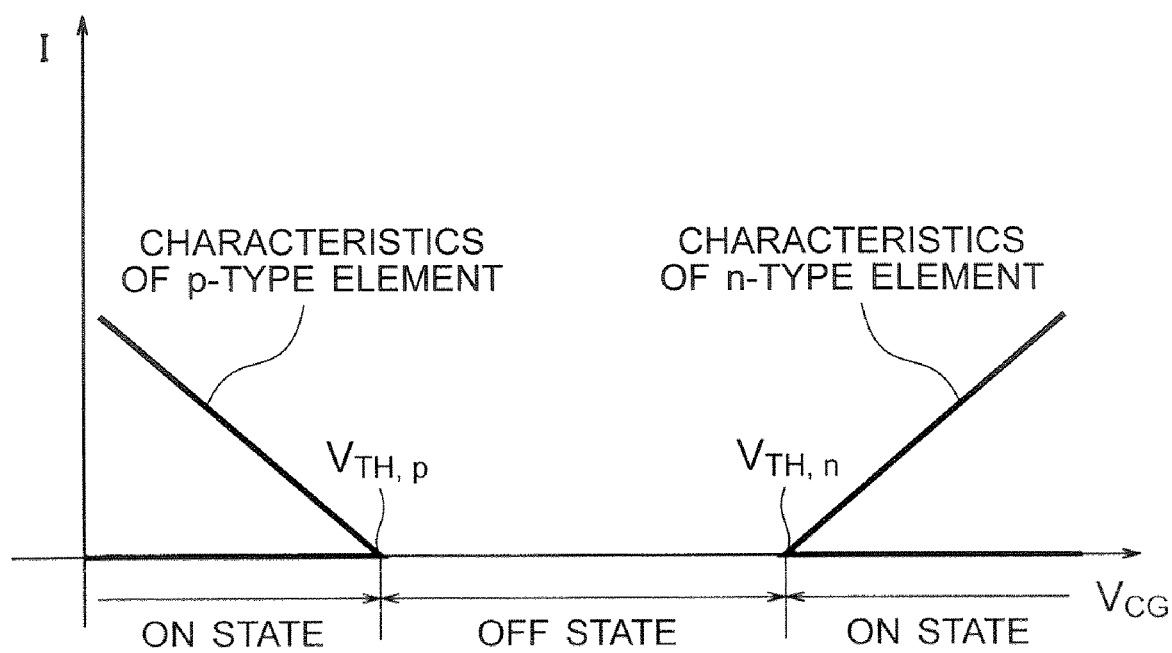
FIG. 39 is a diagram for explaining an operation to be performed in a case where non-volatile semiconductor memory elements of the first or second embodiment are connected in parallel.

In this embodiment, the threshold voltage of each p-type element is set lower than the threshold voltage of each n-type element in a case where charges do not exist in the charge accumulating layers (or where the polarization of the ferroelectric insulating films is directed from the gate electrode to the channel region, if memory elements of the second embodiment are employed). In this situation, the channel current does not flow only when both the n-type element and the p-type element are in an OFF state. Accordingly, a current does not flow through the channel only when the control gate voltage lies between the threshold voltages of the two elements, or the parallel connection circuit of the n-type element and the p-type element enters an OFF state. This situation is schematically illustrated in FIG. 39. In FIG. 39, $V_{CG}$ represents the control gate voltage, I represents the current flowing through the channel, and $V_{TH,n}$ and $V_{TH,p}$ represent the threshold voltages of the n-type element and the p-type element. As described above, a voltage is applied to the connected control gate electrodes of both elements, so as to change the threshold voltages of both elements. Accordingly, the control gate voltage region in which the entire parallel connection circuit of both elements enters an OFF state can be controlled.

The amount of charges stored in the charge accumulating layers (or the polarization of the ferroelectric insulating films, if memory elements of the second embodiment are employed) is controlled, so as to select an element that enters an OFF state at a particular control gate voltage. Also, such situations can be recorded.

In this manner, a voltage is applied to the control gate electrode by selecting an element to be in an ON state or an element that to be in an OFF state, so as to provide a semiconductor integrated circuit device that can realize several kinds of logic circuits.

As already described with reference to FIG. 39, each parallel connection circuit is in an OFF state only when the control gate voltage is in a predetermined range, but is in an ON state when the control gate voltage is out of the predetermined range. In a case where the threshold voltage to be obtained when charges do not exist in the charge accumulating layers is adjusted so as to make that with $V_{CG}$ of each non-volatile semiconductor memory element of zero, the parallel connection circuit of $Tr_{n1}$ and $Tr_{p1}$ is designed to be in an OFF state only when charges do not exist in either of the charge accumulating layers, the parallel connection circuit of $Tr_{n2}$ and $Tr_{p2}$ is designed to be in an OFF state only when charges exist only in the first charge accumulating layer, the parallel connection circuit of $Tr_{n3}$ and $Tr_{p3}$ is designed to be in an OFF state only when charges exist only in the second charge accumulating layer, and the parallel connection circuit of $Tr_{n4}$ and $Tr_{p4}$ is designed to be in an OFF state only when charges exist in both of the charge accumulating layers. The resistance of each resistor $R_i$ ($1 \leq i \leq 4$) is set substantially higher than the resistance of each corresponding parallel connection circuit of $Tr_{ni}$ and $Tr_{pi}$ in an ON state, and is substantially lower than the resistance of each corresponding parallel connection circuit of $Tr_{ni}$ and $Tr_{pi}$ in an OFF state. This can be achieved by setting the resistance of each resistor $R_i$ at the value in the neighborhood of the square root of the product of the resistance in an ON state and the resistance in an OFF state, for example.

The operation of the semiconductor integrated circuit device of this embodiment is described in the following In a case where charges do not exist in any of the charge accumulating layers and $V_{CG}$ is zero, the parallel connection circuit of $Tr_{n1}$ and $Tr_{p1}$ is in an OFF state, and its resistance is substantially higher than $R_1$. Accordingly, the value of $V_{out,1}$ becomes equal to $V_1$. Meanwhile, the other parallel connection circuits of $Tr_{ni}$ and $Tr_{pi}$ ($2 \leq i \leq 4$) are in an ON state, and the resistance of each of the other parallel connection circuits is substantially lower than $R_i$ ($2 \leq i \leq 4$). Accordingly, the value of $V_{out,i}$ ($2 \leq i \leq 4$) becomes equal to $V_2$. Likewise, where the existence of charges in each charge accumulating layer is controlled by adjusting the potential of $V_{CG}$, and $V_{CG}$ is then made zero, when charges do not exist in either of the charge accumulating layers, only $V_{out,1}$ is equal to $V_1$, and the other $V_{out,i}$ ($i \neq 1$) are equal to $V_2$, when charges exist only in the first charge accumulating layer, only $V_{out,2}$ is equal to $V_1$, and the other $V_{out,i}$ ($i \neq 2$) are equal to $V_2$, when charges exist only in the second charge accumulating layer, only $V_{out,3}$ is equal to $V_1$, and the other $V_{out,i}$ ($i \neq 3$) are equal to $V_2$, and when charges exist in both of the charge accumulating layers, only $V_{out,4}$ is equal to $V_1$, and the other $V_{out,i}$ ($i \neq 4$) are equal to $V_2$.

In this manner, a circuit that can output a predetermined potential only to a predetermined one of the output terminals and another predetermined potential to the other terminals, and can also record such states, can be achieved.

The semiconductor integrated circuit device of this embodiment differs from the semiconductor integrated circuit device of the seventh embodiment in that the non-volatile semiconductor memory elements of either the first embodiment or the second embodiment are connected in parallel, and the resistance at which charge injection or charge emission is caused in the charge accumulating layers is low. Accordingly, the semiconductor integrated circuit device of this embodiment has the advantage that it can cause charge injection and emission more promptly than the semiconductor integrated circuit device of the seventh embodiment.

However, one of the four parallel connection circuits is in an OFF state while the other three are in an ON state in the semiconductor integrated circuit device of this embodiment, while one of the four series connection circuits is in an ON state while the other three are in an OFF state in the semiconductor integrated circuit device of the seventh embodiment.

Accordingly, the semiconductor integrated circuit device of the seventh embodiment has the advantage that it has lower power consumption than the semiconductor integrated circuit device of this embodiment.

As described above, a semiconductor integrated circuit device that includes high-performance non-volatile semiconductor memory elements that can lower the power supply voltage and do not complicate the wirings can be obtained according to this embodiment.

The various changes and modifications that can be made to the foregoing embodiments as described above may also be made to this embodiment, to achieve the same effects as the above described effects.

Ninth Embodiment

Figure 40:
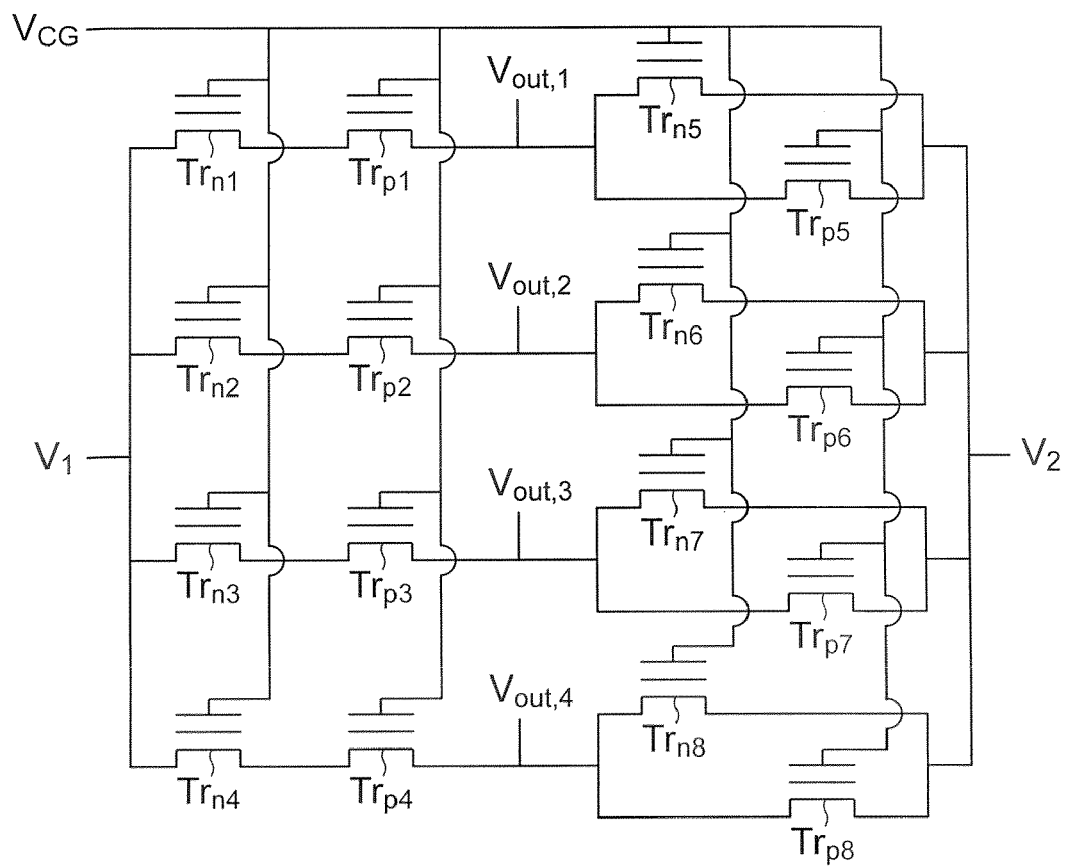
FIG. 40 is a circuit diagram of a semiconductor integrated circuit device according to a ninth embodiment of the present invention.

Referring now to FIG. 40, a semiconductor integrated circuit device according to a ninth embodiment of the present invention is described. FIG. 40 is a circuit diagram of the semiconductor integrated circuit device of this embodiment. The semiconductor integrated circuit device of this embodiment includes non-volatile semiconductor memory elements of either the first embodiment or the second embodiment as several series connection circuits of memory elements of opposite conductivity types, and non-volatile semiconductor memory elements of either the first embodiment or the second embodiment as several parallel connection circuits of memory elements of opposite conductivity types.

In this embodiment, four series connection circuits of non-volatile semiconductor memory elements of the first embodiment and four parallel connection circuits of non-volatile semiconductor memory elements of the first embodiment are employed. However, the same operation can be performed in a case where non-volatile semiconductor memory elements of the second embodiment are employed. Each of the four series connection circuits consists of an n-type non-volatile semiconductor memory element $Tr_{ni}$ of the first embodiment and a p-type non-volatile semiconductor memory element $Tr_{pi}$ of the first embodiment ($1 \leq i \leq 4$), while each of the four parallel connection circuits consists of an n-type non-volatile semiconductor memory element $Tr_{ni}$ of the first embodiment and a p-type non-volatile semiconductor memory element $Tr_{pi}$ of the first embodiment ($5 \leq i \leq 8$).

One of the source/drain terminals of each series connection circuit is connected to a common terminal (the terminal denoted by $V_1$ in the drawing), while one of the source/drain terminals of each parallel connection circuit is connected to a common terminal (the terminal denoted by $V_2$ in the drawing). The other one of the terminals of each series connection circuit and the other one of the terminals of each parallel connection circuit are connected to each other. Output terminals $V_{out, i}$ ($1 \leq i \leq 4$) are interposed between the series connection circuits and the parallel connection circuits of the non-volatile semiconductor memory elements, respectively. The control gate electrodes are connected to a common terminal at a potential $V_{CG}$.

As described with reference to FIGS. 34 and 39, each series connection circuit is in an ON state only when the control gate voltage is in a predetermined range, but is in an OFF state when the control gate voltage is out of the predetermined range. Also, each parallel connection circuit is in an OFF state only when the control gate voltage is in a predetermined range, but is in an ON state when the control gate voltage is out of the predetermined range. In a case where the threshold voltage to be obtained when charges do not exist in the charge accumulating layers is adjusted so as to make that with $V_{CG}$ of each non-volatile semiconductor memory element of zero, the series connection circuit of $Tr_{n1}$ and $Tr_{p1}$ is designed to be in an ON state only when charges do not exist in either of the charge accumulating layers, the series connection circuit of $Tr_{n2}$ and $Tr_{p2}$ is designed to be in an ON state only when charges exist only in the first charge accumulating layer, the series connection circuit of $Tr_{n3}$ and $Tr_{p3}$ is designed to be in an ON state only when charges exist only in the second charge accumulating layer, the series connection circuit of $Tr_{n4}$ and $Tr_{p4}$ is designed to be in an ON state only when charges exist in both of the charge accumulating layers, the parallel connection circuit of $Tr_{n5}$ and $Tr_{p5}$ is designed to be in an OFF state only when charges do not exist in either of the charge accumulating layers, the parallel connection circuit of $Tr_{n6}$ and $Tr_{p6}$ is designed to be in an OFF state only when charges exist only in the first charge accumulating layer, the parallel connection circuit of $Tr_{n7}$ and $Tr_{p7}$ is designed to be in an OFF state only when charges exist only in the second charge accumulating layer, and the parallel connection circuit of $Tr_{n8}$ and $Tr_{p8}$ is designed to be in an OFF state only when charges exist in both of the charge accumulating layers.

The operation of this circuit is described in the following.

In a case where charges do not exist in any of the charge accumulating layers and $V_{CG}$ is zero, the series connection circuit of $Tr_{n1}$ and $Tr_{p1}$ is in an ON state, and the parallel connection circuit of $Tr_{n5}$ and $Tr_{p5}$ is in an OFF state. Accordingly, the value of $V_{out, 1}$ becomes equal to $V_1$. Meanwhile, the other series connection circuits of $Tr_{ni}$ and $Tr_{pi}$ ($2 \leq i \leq 4$) are in an OFF state, and the other parallel connection circuits of $Tr_{ni}$ and $Tr_{pi}$ ($6 \leq i \leq 8$) are in an ON state. Accordingly, the value of $V_{out, i}$ ($2 \leq i \leq 4$) becomes equal to $V_2$. Likewise, where the existence of charges in each charge accumulating layer is controlled by adjusting the potential of $V_{CG}$, and $V_{CG}$ is then made zero, when charges do not exist in either of the charge accumulating layers, only $V_{out, 1}$ is equal to $V_1$, and the other $V_{out, i}$ ($i \neq 1$) are equal to $V_2$, when charges exist only in the first charge accumulating layer, only $V_{out, 2}$ is equal to $V_1$, and the other $V_{out, i}$ ($i \neq 2$) are equal to $V_2$, when charges exist only in the second charge accumulating layer, only $V_{out, 3}$ is equal to $V_1$, and the other $V_{out, i}$ ($i \neq 3$) are equal to $V_2$, and when charges exist in both of the charge accumulating layers, only $V_{out, 4}$ is equal to $V_1$, and the other $V_{out, i}$ ($i \neq 4$) are equal to $V_2$.

In this manner, a circuit that can output a predetermined potential only to a predetermined one of the output terminals and another predetermined potential to the other terminals, and can also record such situations, is achieved.

The semiconductor integrated circuit device of this embodiment differs from the semiconductor integrated circuit devices of the seventh and eighth embodiments, in that a current does not flow when $V_{CG}$ is zero. Accordingly, this embodiment has the advantage that the semiconductor integrated circuit device has very low power consumption.

Meanwhile, each of the semiconductor integrated circuit devices of the seventh and eighth embodiments has the advantage that the required number of non-volatile semiconductor memory elements of either the first embodiment or the second embodiment is smaller than in the semiconductor integrated circuit device of this embodiment.

As described above, a semiconductor integrated circuit device that includes high-performance non-volatile semiconductor memory elements that can lower the power supply voltage and do not complicate the wirings can be obtained according to this embodiment.

The various changes and modifications that can be made to the foregoing embodiments as described above may also be made to this embodiment, to achieve the same effects as the above described effects.

Figure 41:
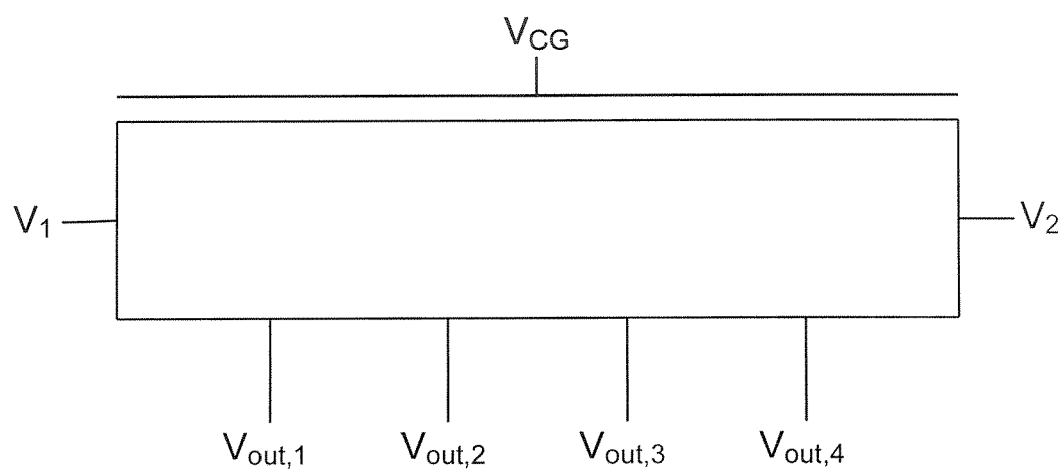
FIG. 41 is a diagram for explaining a schematic view of the semiconductor integrated circuit device according to the seventh, eighth, or ninth embodiment.

For the embodiment to be described next, each of the circuit devices of the seventh through ninth embodiments is schematically shown in FIG. 41. The terminals shown in FIG. 41 are equivalent to those shown in FIGS. 37, 38, and 40.

Tenth Embodiment

Figure 42:
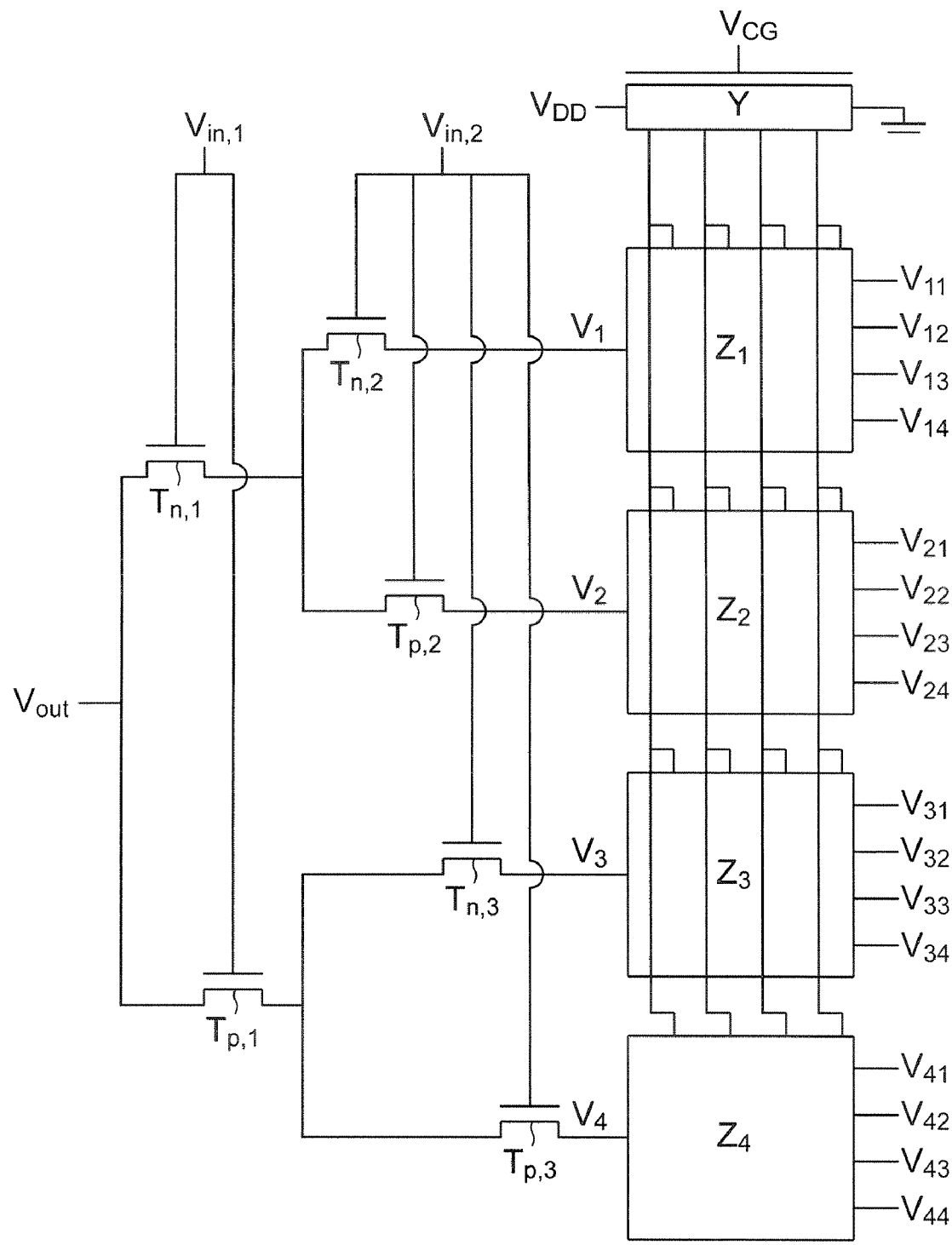
FIG. 42 is a circuit diagram of a semiconductor integrated circuit device according to a tenth embodiment of the present invention.

Referring now to FIG. 42, a semiconductor integrated circuit device according to a tenth embodiment of the present invention is described. FIG. 42 is a circuit diagram of the semiconductor integrated circuit device of this embodiment. The semiconductor integrated circuit device of this embodiment includes a semiconductor integrated circuit device of one of the seventh to ninth embodiments and field effect transistors. In FIG. 42, $T_{n,i}$ ($1 \leq i \leq 3$) represent n-type field effect transistors, $T_{p,i}$ ($1 \leq i \leq 3$) represent p-type field effect transistors, the terminals denoted by $V_{in,1}$ and $V_{in,2}$ are input terminals, and the terminal denoted by $V_{out}$ is the output terminal. The device denoted by Y is a semiconductor integrated circuit device of one of the seventh to ninth embodiments. Each of the circuits denoted by $Z_i$ ($1 \leq i \leq 4$) is the circuits illustrated in FIG. 43, which can be schematically shown as in FIG. 44 The terminals shown in FIG. 44 are equivalent to those in FIG. 43.

Figure 43:
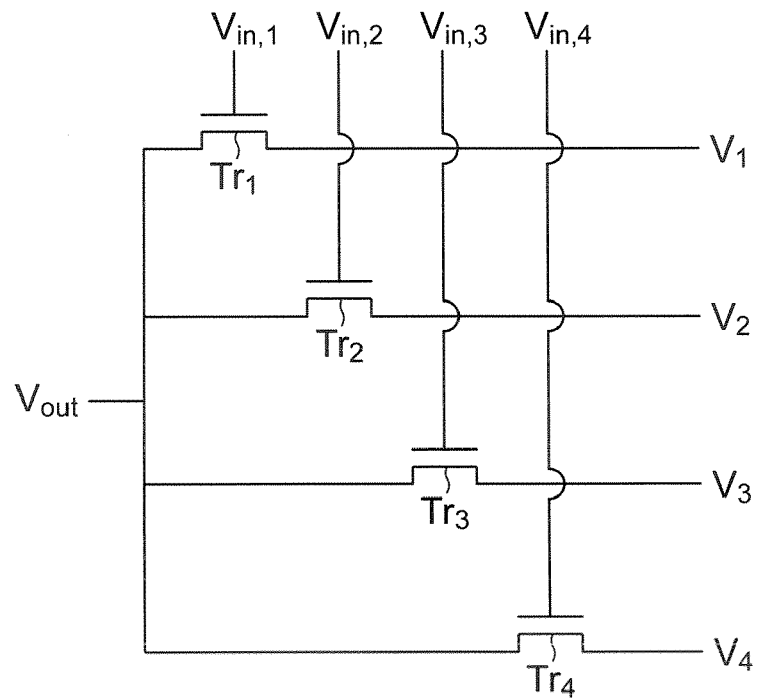
FIG. 43 is a circuit diagram for schematically illustrating a semiconductor integrated circuit device included the semiconductor integrated circuit device shown in FIG. 42.
Figure 44:
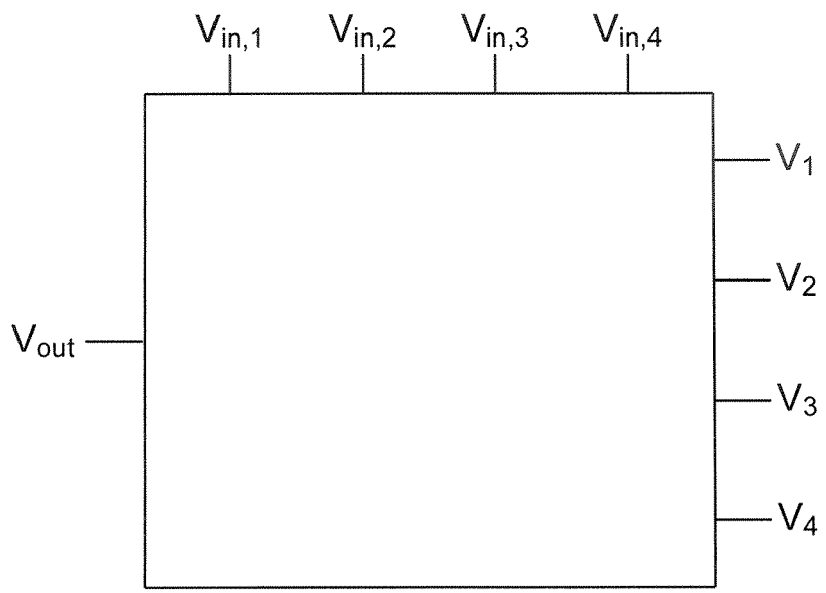
FIG. 44 is a circuit diagram for illustrating a schematic view of the circuit shown in FIG. 43.

First, the circuit illustrated in FIG. 43 is explained. The terminal denoted by $V_{out}$ is connected to the terminals denoted by $V_i$ ($1 \leq i \leq 4$) via the respective n-type field effect transistors $T_i$ ($1 \leq i \leq 4$). Those terminals are maintained at the respective potentials $V_i$ ($1 \leq i \leq 4$). The gate electrodes of the transistors $T_i$ ($1 \leq i \leq 4$) are connected to the respective terminals denoted by $V_{in,i}$ ($1 \leq i \leq 4$), and the respective potentials $V_{in,i}$ ($1 \leq i \leq 4$) are applied to those terminals. With respect to each i ($1 \leq i \leq 4$), only $V_{in,i}$ is equal to $V_{DD}$, and $V_{in,j}$ ($j \neq i$) is equal to zero. In such a case, only $Tr_i$ is in an ON state, but $Tr_j$ ($j \neq i$) is in an OFF state. Accordingly, $V_i$ is output to $V_{out}$. This is the operation of the circuit illustrated in FIG. 43.

Next, the operation of the circuit illustrated in FIG. 42 is described. Although the circuit Y is formed with a non-volatile semiconductor memory element of the first embodiment in the following example case, the same operation can be performed in a case where the circuit Y is formed with a non-volatile semiconductor memory element of the second embodiment. As mentioned in the descriptions of the seventh to ninth embodiments, depending on the existence of charges in the charge accumulating layers of the circuit Y, the potential $V_i$ with respect to each i ($1 \leq i \leq 4$) is to be:

$V_{i1}$ when charges do not exist in either of the charge accumulating layers;

$V_{i2}$ when charges exist only in the first charge accumulating layer;

$V_{i3}$ when charges exist only in the second charge accumulating layer; and $V_{i4}$ when charges exist in both of the charge accumulating layers.

Also, as mentioned in the description of the sixth embodiment, the potential of the output terminal $V_{out}$ is to be:

$V_1$, where $V_{in,1}=V_{DD}$ and $V_{in,2}=V_{DD}$;

$V_2$, where $V_{in,1}=V_{DD}$ and $V_{in,2}=0$;

$V_3$, where $V_{in,1}=0$ and $V_{in,2}=V_{DD}$; and $V_4$, where $V_{in,1}=0$ and $V_{in,2}=0$.

Here, a case where $V_{ij}$ ($1 \leq i, j \leq 4$) is adjusted as follows is considered.

$V_{11}=V_{DD}, V_{21}=0, V_{31}=0, V_{41}=0$,
$V_{12}=0, V_{22}=V_{DD}, V_{32}=V_{DD}, V_{42}=V_{DD}$,
$V_{13}=V_{DD}, V_{23}=V_{DD}, V_{33}=V_{DD}, V_{43}=0$,
$V_{14}=0, V_{24}=0, V_{34}=0, V_{44}=V_{DD}$

As $V_{CG}$ is controlled, the charges in the charge accumulating layers of the circuit Y are controlled, and $V_{CG}$ is then made zero. As mentioned in the description of the sixth embodiment, being a circuit having $V_{in,1}$ and $V_{in,2}$ as the input terminals and $V_{out}$ as the output terminal, the circuit shown in FIG. 42 is to be:

an AND circuit when charges do not exist in either of the charge accumulating layers;

a NAND circuit when charges exist only in the first charge accumulating layer;

an OR circuit when charges exist only in the second charge accumulating layer; and a NOR circuit when charges exist both of the charge accumulating layers.

In this manner, a semiconductor integrated circuit device that can be several types of logic circuit and can record them is obtained.

Although a two-input logic circuit is described in this embodiment, the same operation can be performed with a logic circuit having three or more inputs.

In a case where an n-input logic circuit is formed, the number of terminals equivalent to the terminals denoted by V ($1 \leq i \leq 4$) in FIG. 36 illustrating the sixth embodiment and FIG. 42 illustrating this embodiment is $2^n$, and the number of field effect transistors required between those terminals and $V_{out}$ is $2^{n+1}-2$. In a case where the circuit of the sixth embodiment illustrated in FIG. 36 is used, the required number of circuits equivalent to the circuits denoted by $X_i$ in the drawing (i.e. the circuit shown in FIG. 33) is also $2^n$, and the required number of non-volatile semiconductor memory elements of the first or second embodiment is $8 \times 2^n = 4 \times 2^{n+1}$, accordingly. Therefore, the number of active elements required is $5 \times 2^{n+1}-2$.

On the other hand, when the circuit device of this embodiment is employed, eight non-volatile semiconductor memory elements of the first or second embodiment are required if the circuit shown in FIG. 37 or 38 is employed as the circuit Y, and 16 non-volatile semiconductor memory elements of the first or second embodiment are required if the circuit shown in FIG. 40 is employed. Also, $2^n$ of circuits equivalent to the circuits $Z_j$ shown in FIG. 42 (or the circuit shown in FIG. 43) are required, and $4 \times 2^n = 2 \times 2^{n+1}$ of field effect transistors forming those circuits $Z_j$ are required. Accordingly, in the case where the circuit device of this embodiment is used, the number of active elements required is $3 \times 2^{n+1}+6$ or $3 \times 2^{n+1}+14$. In this manner, if the number of inputs of the logic circuit is three or more, the number of active elements of the circuit device of this embodiment is the smaller. In the case where the circuit shown in FIG. 37 or 38 is employed as the circuit Y, and the number of inputs is two, the number of active elements also becomes smaller. Thus, the device structure is advantageously simplified.

As described above, a semiconductor integrated circuit device that includes high-performance non-volatile semiconductor memory elements that can lower the power supply voltage and do not complicate the wirings can be obtained according to this embodiment.

The various changes and modifications that can be made to the foregoing embodiments as described above may also be made to this embodiment, to achieve the same effects as the above described effects.

Eleventh Embodiment

Next, a semiconductor integrated circuit device according to an eleventh embodiment of the present invention is described.

The semiconductor integrated circuit device of this embodiment has non-volatile semiconductor memory elements of the first or second embodiment contained in a logic circuit. In this structure, the non-volatile semiconductor memory elements of the first or second embodiment are used as the elements for switching between a conduction state and a non-conduction state in the logic circuit. Accordingly, the threshold voltage of each element can be adjusted by controlling the existence of charges in the charge accumulating layers. As a result, where emphasis is put on high-speed operations, the threshold voltage of each n-type element is set low, and the threshold voltage of each p-type element is set high. With this arrangement, the circuit is enabled to perform high-speed operations. Where emphasis is put on lower power consumption, the threshold voltage of each n-type element is set high, and the threshold voltage of each p-type element is set low. With this arrangement, the power consumption of the circuit can be reduced. In this manner, the circuit can be adjusted for circumstances.

As described above, a semiconductor integrated circuit device that includes high-performance non-volatile semiconductor memory elements that can lower the power supply voltage and do not complicate the wirings can be obtained according to this embodiment.

The various changes and modifications that can be made to the foregoing embodiments as described above may also be made to this embodiment, to achieve the same effects as the above described effects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A non-volatile semiconductor memory element comprising:
   a semiconductor region of a first conductivity type that is formed in a plate-like form on a semiconductor substrate;
   a first insulating film that is formed on a first side face of the semiconductor region;
   a first charge accumulating layer that is formed on a face of the first insulating film opposite from the semiconductor region;
   a second insulating film that is formed on a second side face of the semiconductor region, and has a different equivalent oxide thickness from the first insulating film, the second side face being the opposite side from the first side face;
   a second charge accumulating layer that is formed on a face of the second insulating film opposite from the semiconductor region;
   a third insulating film that is provided so as to cover the first and second charge accumulating layers;
   a control gate electrode that is provided so as to cover the third insulating film;
   a channel region that is formed in a portion of the semiconductor region covered with the control gate electrode; and
   source/drain regions of a second conductivity type that are formed in portions of the semiconductor region on both sides of the channel region,
   the semiconductor region having a thickness smaller than twice the maximum thickness of a depletion layer determined by impurity concentration in the semiconductor region.

2. The non-volatile semiconductor memory element as claimed in claim 1, wherein a voltage condition for the source/drain regions and the control gate electrode to have a current flow through the first insulating film is different from a voltage condition for the source/drain regions and the control gate electrode to have a current flow through the second insulating film.

3. The non-volatile semiconductor memory element as claimed in claim 1, wherein a threshold voltage when a predetermined amount of charges exist only in the first charge accumulating layer is different from a threshold voltage when the same amount of charges as the predetermined amount exists only in the second charge accumulating layer.

4. The non-volatile semiconductor memory element as claimed in claim 1, wherein lengths of the first and second charge accumulating layers and a length of the control gate electrode measured in a principal direction of a current flowing through a portion of the semiconductor region located between the source/drain regions are substantially the same.

5. The non-volatile semiconductor memory element as claimed in claim 1, wherein a length of the control gate electrode is larger than lengths of the first and second charge accumulating layers, the lengths being measured in a principal direction of a current flowing through a portion of the semiconductor region located between the source/drain regions.

6. The non-volatile semiconductor memory element as claimed in claim 1, where an equivalent oxide thickness of the third insulating film is smaller than at least one of equivalent oxide thicknesses of the first and second insulating films.

7. The non-volatile semiconductor memory element as claimed in claim 1, wherein an equivalent oxide thickness of the third insulating film is smaller than either of equivalent oxide thicknesses of the first and second insulating films.

8. The non-volatile semiconductor memory element as claimed in claim 1, wherein a permittivity of the third insulating film is higher than permittivity of the first and second insulating films.

9. The non-volatile semiconductor memory element as claimed in claim 1, wherein a principal direction of a current flowing through a portion of the semiconductor region located between the source/drain regions is in parallel with a surface of the semiconductor substrate.

10. A semiconductor integrated circuit device comprising a plurality of non-volatile semiconductor memory elements as claimed in claim 1, wherein:
    the non-volatile semiconductor memory elements are arranged in a lattice-point form;
    the semiconductor regions of the non-volatile semiconductor memory elements contained in the same row are connected to one another; and
    the control gate electrodes of the non-volatile semiconductor memory elements contained in the same column are connected to one another.

11. The semiconductor integrated circuit device as claimed in claim 10, further comprising a switching element in each row, the switching element controlling a conduction state and a non-conduction state of a region located between each row and an external circuit.

12. A semiconductor integrated circuit device comprising:
at least one non-volatile semiconductor memory element as claimed in claim 1; and
elements that control current conduction and non-conduction.

13. The semiconductor integrated circuit device as claimed in claim 12, wherein at least one of the elements that control current conduction and non-conduction is contained in a logic circuit.

14. The semiconductor integrated circuit device as claimed in claim 12, comprising first non-volatile semiconductor memory elements, and second non-volatile semiconductor memory elements in which conductivity types of the semiconductor region and the source/drain regions are opposite to those of the first non-volatile semiconductor memory elements.

15. The semiconductor integrated circuit device as claimed in claim 14, wherein at least one of the first non-volatile semiconductor memory elements is connected in series or parallel to at least one of the second non-volatile semiconductor memory elements.

16. The semiconductor integrated circuit device as claimed in claim 13, comprising:

a series circuit having a first non-volatile semiconductor memory element connected in series to a second non-volatile semiconductor memory element in which conductivity types of the semiconductor region and the source/drain regions are opposite to those of the first non-volatile semiconductor memory element; and a parallel circuit having a third non-volatile semiconductor memory element connected in parallel to a fourth non-volatile semiconductor memory element in which conductivity types of the semiconductor region and the source/drain regions are opposite to those of the third non-volatile semiconductor memory element.

17. The semiconductor integrated circuit device as claimed in claim 12, which can perform at least two kinds of logic operations by changing the amount of charges stored in the charge accumulating layers of the non-volatile semiconductor memory element.

18. A semiconductor integrated circuit device comprising a logic circuit that contains the non-volatile semiconductor memory element as claimed in claim 1.

* * * * *